US010450417B2

(12) United States Patent
Kawabata et al.

(10) Patent No.: US 10,450,417 B2
(45) Date of Patent: Oct. 22, 2019

(54) RESIN, COMPOSITION, CURED FILM, METHOD FOR MANUFACTURING CURED FILM AND SEMICONDUCTOR DEVICE

(71) Applicant: FUJIFILM Corporation, Tokyo (JP)

(72) Inventors: Takeshi Kawabata, Haibara-gun (JP); Yu Iwai, Haibara-gun (JP); Akinori Shibuya, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/938,528

(22) Filed: Mar. 28, 2018

(65) Prior Publication Data

US 2018/0215874 A1     Aug. 2, 2018

Related U.S. Application Data

(63) Continuation of application No. PCT/JP2016/088305, filed on Dec. 22, 2016.

(30) Foreign Application Priority Data

Dec. 25, 2015 (JP) .................................. 2015-254880

(51) Int. Cl.
| | | |
|---|---|---|
| *C08G 73/12* | (2006.01) | |
| *C08F 290/14* | (2006.01) | |
| *C08F 299/02* | (2006.01) | |
| *C08G 73/22* | (2006.01) | |
| *G03F 7/027* | (2006.01) | |
| *G03F 7/20* | (2006.01) | |
| *G03F 7/031* | (2006.01) | |
| *G03F 7/037* | (2006.01) | |
| *G03F 7/038* | (2006.01) | |
| *G03F 7/16* | (2006.01) | |
| *G03F 7/32* | (2006.01) | |
| *H01L 23/498* | (2006.01) | |
| *C08G 73/10* | (2006.01) | |
| *C09D 179/08* | (2006.01) | |
| *C08G 73/14* | (2006.01) | |
| *G03F 7/023* | (2006.01) | |
| *G03F 7/075* | (2006.01) | |
| *H01L 25/065* | (2006.01) | |

(52) U.S. Cl.
CPC ............ *C08G 73/12* (2013.01); *C08F 290/14* (2013.01); *C08F 299/02* (2013.01); *C08G 73/1039* (2013.01); *C08G 73/1053* (2013.01); *C08G 73/1071* (2013.01); *C08G 73/14* (2013.01); *C08G 73/22* (2013.01); *C09D 179/08* (2013.01); *G03F 7/027* (2013.01); *G03F 7/031* (2013.01); *G03F 7/037* (2013.01); *G03F 7/0387* (2013.01); *G03F 7/162* (2013.01); *G03F 7/168* (2013.01); *G03F 7/20* (2013.01); *G03F 7/2002* (2013.01); *G03F 7/32* (2013.01); *H01L 23/49894* (2013.01); *C08J 2377/06* (2013.01); *G03F 7/023* (2013.01); *G03F 7/0757* (2013.01); *H01L 25/0657* (2013.01); *H01L 2224/16145* (2013.01); *H01L 2224/16225* (2013.01); *H01L 2224/32145* (2013.01); *H01L 2224/73204* (2013.01); *H01L 2225/0652* (2013.01); *H01L 2225/06513* (2013.01); *H01L 2225/06517* (2013.01); *H01L 2225/06541* (2013.01); *H01L 2924/15311* (2013.01)

(58) Field of Classification Search
CPC ........ C08G 73/12; C08G 73/10; C08G 73/22; C08F 290/14; C08F 299/02; C08J 2377/06; G03F 7/031; G03F 7/32; G03F 7/2002; G03F 7/168; G03F 7/162; G03F 7/0387; G03F 7/037; G03F 7/027; G03F 7/20; G03F 7/0757; G03F 7/023
USPC ...................................................... 430/283.1
See application file for complete search history.

(56) References Cited

U.S. PATENT DOCUMENTS

| | | | | |
|---|---|---|---|---|
| 5,886,136 A | * | 3/1999 | Tanaka | ................. C08G 73/101 430/170 |
| 6,117,616 A | * | 9/2000 | Omote | .................. B32B 15/08 428/209 |
| 6,610,815 B1 | * | 8/2003 | Hata | ..................... C08G 73/10 430/283.1 |
| 9,897,915 B2 | | 2/2018 | Komori et al. | |
| 2009/0267239 A1 | | 10/2009 | Kanada et al. | |
| 2012/0328856 A1 | * | 12/2012 | Minegishi | ............ G03F 7/0387 428/201 |
| 2013/0059985 A1 | * | 3/2013 | Kutsuzawa | ........... C08G 73/22 525/437 |
| 2013/0309607 A1 | * | 11/2013 | Katayama | ............. C08G 73/10 430/283.1 |

FOREIGN PATENT DOCUMENTS

| | | |
|---|---|---|
| CN | 101278234 A | 10/2008 |
| CN | 102375336 B | 10/2013 |

(Continued)

OTHER PUBLICATIONS

Japanese Office Action, Notice of Refusal of JP2017-550954 dated Oct. 31, 2017.

(Continued)

*Primary Examiner* — Cynthia Hamilton
(74) *Attorney, Agent, or Firm* — Sughrue Mion, PLLC

(57) ABSTRACT

Provided is a resin capable of yielding a cured film with less warp and good uniformity, and of yielding a cured film (pattern) with less scum; a composition using the resin; a cured film; and a method for manufacturing a cured film and a semiconductor device. The resin is selected from polyimide precursor, polyimide, polybenzoxazole precursor, and, polybenzoxazole, and has a polymerizable group, and has a total content of a component with a molecular weight of 1,000 or smaller of 0.005 to 1.0% by mass.

8 Claims, 1 Drawing Sheet

(56) References Cited

FOREIGN PATENT DOCUMENTS

| | | |
|---|---|---|
| CN | 104854508 A | 8/2015 |
| EP | 0 814 109 A1 | 12/1997 |
| JP | 11-35683 A * | 2/1999 |
| JP | 11-209614 A | 8/1999 |
| JP | 2004-026889 A | 1/2004 |
| JP | 2004-085637 A | 3/2004 |
| JP | 2004-133435 A | 4/2004 |
| JP | 2005-003767 A | 1/2005 |
| JP | 2008-038083 A | 2/2008 |
| JP | 2008-222858 A | 9/2008 |
| JP | 2008-224970 A | 9/2008 |
| JP | 2011-079889 A | 4/2011 |
| JP | 2011-186049 A | 9/2011 |
| JP | 2013-064130 A | 4/2013 |
| JP | 2014-088460 A | 5/2014 |
| JP | 2015-028106 A | 2/2015 |
| KR | 10-2007-0004748 A | 1/2007 |
| WO | 2013/168675 A1 | 11/2013 |

OTHER PUBLICATIONS

Taiwanese Office Action of TW105141976, dated Mar. 1, 2018.
Decision to Grant of JP 2017-550954, dated Nov. 28, 2017.
International Search Report for PCT/JP2016/088305 dated Mar. 21, 2017 [PCT/ISA/210].
Office Action dated Apr. 10, 2018, from Korean Intellectual Property Office in counterpart KR application No. 10-2018-7006257.
Office Action dated Jun. 20, 2018 from Korean Intellectual Property Office in counterpart Korean Application No. 10-2018-7006257.
International Preliminary Report on Patentability dated Jun. 26, 2018 with English Translation of the Written Opinion of PCT/JP2016/088305.
Written Opinion of PCT/JP2016/088305 dated Mar. 21, 2017.
Office Action dated Nov. 15, 2018 in Chinese Application No. 201680056589.4.
Extended European Search Report dated Oct. 24, 2018 from the European Patent Office in counterpart European Application No. 16878869.3.
Office Action dated Apr. 22, 2019 in corresponding Chinese Application No. 201680056589.4.

* cited by examiner

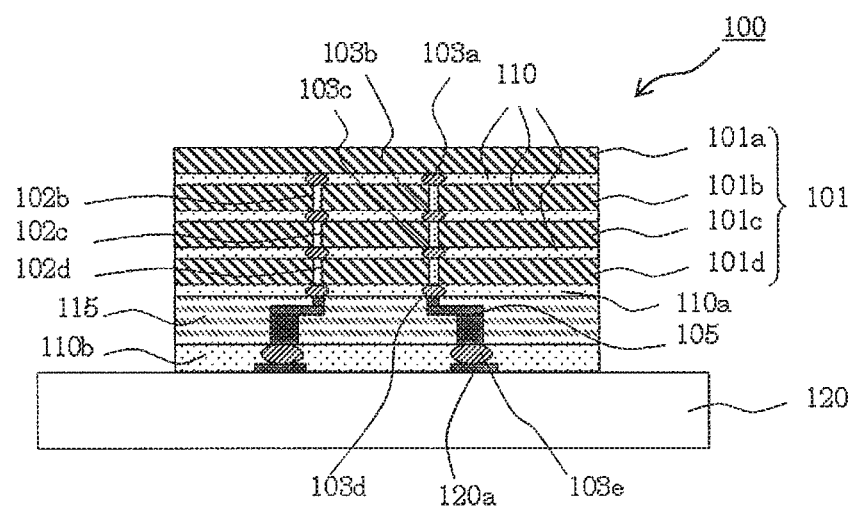

RESIN, COMPOSITION, CURED FILM, METHOD FOR MANUFACTURING CURED FILM AND SEMICONDUCTOR DEVICE

CROSS-REFERENCE TO RELATED APPLICATIONS

This application is a Continuation of PCT International Application No. PCT/JP2016/088305 filed on Dec. 22, 2016, which claims priority under 35 U.S.C § 119(a) to Japanese Patent Application No. 201.5-254880 filed on Dec. 25, 2015. Each of the above application (s) is hereby expressly incorporated by reference, in its entirety, into the present application.

TECHNICAL FIELD

This invention relates to a resin, a composition, a cured film, a method for manufacturing a cured film, and a semiconductor device, and in particular relates to a resin suitable for photosensitive resin composition.

BACKGROUND ART

Polyimide and polybenzoxazole, featured by their excellent heat resistance and insulating performance, have been used typically for insulating layers in semiconductor devices.

Another practice is to use a pre-cyclized precursor (polyimide precursor or polybenzoxazole precursor) that is more soluble into solvent, in place of polyimide and polybenzoxazole, to apply it onto a substrate or the like, and to cyclyze the precursor under heating to thereby form a cured film.

As this sort of polyimide precursor, Patent Literature 1 discloses a negative photosensitive resin composition that contains 100 parts by mass of polyimide precursor with a specific structure; and (B) 0.1 parts by mass to 20 parts by mass of a photo-polymerization initiator.

Patent Literature 2 discloses a polyimide precursor varnish that includes a composition containing a polyimide precursor and a solvent, the polyimide precursor being obtained by polycondensation of a diamine with an acid dianhydride; containing 27 to 87 mol % of diamine component A represented by Chemical Formula (A) and 7:3 to 13 mol % of diamine component B represented by Chemical Formula (B), both relative to the total diamine; the diamine component A and the diamine component. B totaling up to 80 mol % or more of the total diamine; the acid dianhydride being a pyromellitic dianhydride represented by Chemical Formula (C); the diamines totaling up to 47.5 to 52.5 mol % relative to the total of the diamines and the acid dianhydride; and the acid dianhydrides totaling up to 52.5 to 47.5 mol %.

Chemical Formula (A)

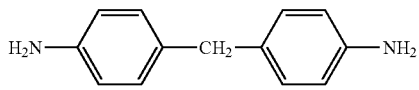

Chemical Formula (B)

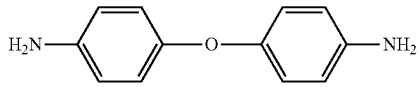

Chemical Formula (C)

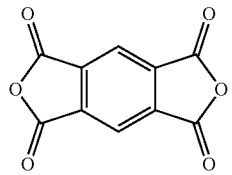

Patent Literature 1 also describes that the composition can contain 0.1 to 20% by mass of a monomer or so represented by Chemical Formula (D), relative to the total solid resin content of the polyimide precursor.

Chemical Formula (D)

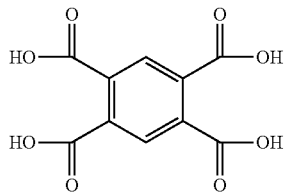

CITATION LIST

Patent Literatures

[Patent Literature 1] WO2013/168675, pamphlet
[Patent Literature 2] JP-A-2015-028106

SUMMARY OF THE INVENTION

Technical Problem

Now, it is a general procedure in manufacturing semiconductor devices to interconnect among elements such as transistors formed on a silicon wafer or other wafers. When forming the interconnect, the wafer is covered with an insulating interlayer, contact holes are formed in the insulating interlayer corresponding to the elements to be connected, and a metal part is provided on the insulating interlayer. That is, the elements are interconnected through the metal part formed in the contact holes. In such process for forming the insulating interlayer, the composition containing the polyimide precursor and so forth is necessarily photosensitive, as described in Patent Literature 1. Investigations by the present inventors, however, revealed that the compositions containing the polyimide precursor, described in Patent Literature 1, caused warp in the resultant cured film, non-uniformity in the cured film, and residence of a large amount of scum (residue). Meanwhile, Patent Literature 2 describes use of the polyimide precursor as an insulating film for coating wires, but neither describes nor implies lithographic formation of the contact holes. Rather, the composition described in Patent Literature 2 is not photosensitive, and is therefore not applicable to photolithography.

This invention is aimed at solving the above-described problems, and is to provide a resin capable of yielding a cured film with less warp and good uniformity, and of yielding a cured film (pattern) with less scum; a composition using the resin; a cured film; and a method for manufacturing a cured film and a semiconductor device.

Solution to Problem

Under such situations, the present inventors found that the above-described problems can be solved by using a resin containing a small amount of a component with a molecular weight of 1,000 or smaller. More specifically, the above-described problems were solved by the means <1> below, and preferably by means <2> to <19> below.

<1> A resin selected from polyimide precursor, polyimide, polybenzoxazole precursor, and, polybenzoxazole, the resin having a polymerizable group, and having a total content of a component with a molecular weight of 1,000 or smaller of 0.005 to 1.0% by mass.

<2> The resin of <1>, wherein the component with a molecular weight of 1,000 or smaller contains at least one of a starting monomer of the resin or a derivative thereof.

<3> The resin of <1> or <2>, where the resin component with a molecular weight of 1,000 or smaller contains at least one of a starting monomer of the resin or a derivative thereof, and the resin has a total content of the starting monomer contained in the resin and the derivative thereof 0.001 to 0.45% by mass of the resin.

<4> The resin of any one of <1> to <3>, wherein the resin is selected from polyimide precursor and polybenzoxazole precursor.

<5> The resin of any one of <1> to <4>, wherein the resin contains a repeating unit represented by Formula (2) or a repeating unit represented by Formula (3) below;

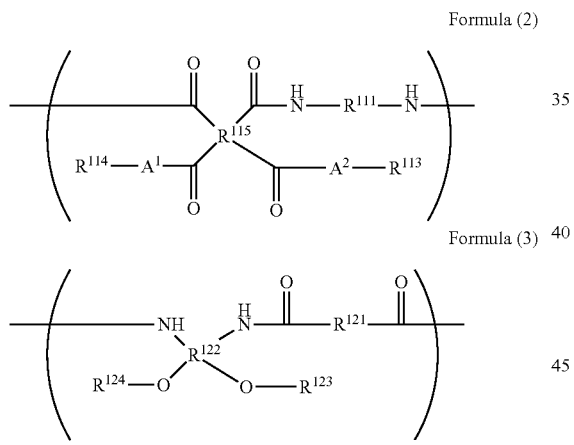

wherein each of $A^1$ and $A^2$ independently represents an oxygen atom or NH, $R^{111}$ represents a divalent organic group, $R^{115}$ represents a tetravalent organic group, each of $R^{113}$ and $R^{114}$ independently represents a hydrogen atom or monovalent organic group, and at least one of $R^{113}$ or $R^{114}$ represents a group containing a polymerizable group; and $R^{121}$ represents a divalent organic group, $R^{122}$ represents a tetravalent organic group, each of $R^{123}$ and $R^{124}$ independently represents a hydrogen atom or monovalent organic group, and at least one of $R^{123}$ or $R^{124}$ represents a polymerizable group-containing group.

<6> The resin of <5>, wherein the resin contains a repeating unit represented by Formula (2), and the component with a molecular weight of 1,000 or smaller contains at least one of a monomer represented by Formula (2-1) or a monomer represented by Formula (2-2); or, the resin contains a repeating unit represented by Formula (3), and the component with a molecular weight of 1,000 or smaller contains at least one of a monomer represented by Formula (3-1) or a monomer represented by Formula (3-2);

wherein $R^{115}$ represents a group same as $R^{115}$ in Formula (2); and, $R^{111}$ represents a group same as R Formula (2);

wherein $R^{122}$ represents a group same as $R^{122}$ in Formula (3); and, $R^{121}$ represents a group same as $R^{121}$ in Formula (3).

<7> A composition containing a resin selected from polyimide precursor, polyimide, polybenzoxazole precursor and polybenzoxazole, wherein the resin has a polymerizable group; and the resin has a total content of a starting monomer of the resin and a derivative thereof of 0.001 to 0.45% by mass.

<8> The composition of <7>, wherein the total content of the starting monomer of the resin and the derivative thereof is 0.005 to 0.15% by mass of the resin.

<9> The composition of <7> or <8>, wherein the resin is selected from polyimide precursor and polybenzoxazole precursor.

<10> The composition of any one of <7> to <9>, wherein the resin contains a repeating unit represented by Formula (2) or a repeating unit represented by Formula (3);

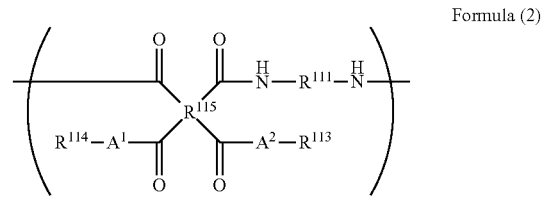

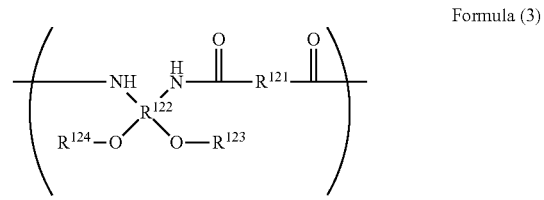

wherein each of $A^1$ and $A^2$ independently represents an oxygen atom or NH, $R^{111}$ represents a divalent organic group, $R^{115}$ represents a tetravalent organic group, each of $R^{113}$ and $R^{114}$ independently represents a hydrogen atom or monovalent organic group, at least one of $R^{113}$ or $R^{124}$ represents a polymerizable group-containing group; and $R^{121}$ represents a divalent organic group, $R^{122}$ represents a tetravalent organic group, each of $R^{123}$ and $R^{124}$ independently represents a hydrogen atom or monovalent organic group, and at least one of $R^{123}$ or $R^{124}$ represents a polymerizable group-containing group.

<11> The composition of <10>, wherein the resin contains a repeating unit represented by Formula (2), and contains at least one of a monomer represented by Formula (2-1) or a monomer represented by Formula (2-2) as a component with a molecular weight of 1,000 or smaller; or the resin contains a repeating unit represented by Formula (3), and contains at least one of a monomer represented by Formula (3-1) or a monomer represented by Formula (3-2) as a component with a molecular weight of 1,000 or smaller;

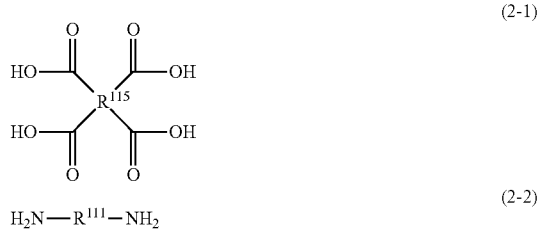

(2-1)

(2-2)

wherein $R^{115}$ represents a group same as $R^{115}$ in Formula (2); and, $R^{111}$ represents a group same as $R^{111}$ in Formula (2);

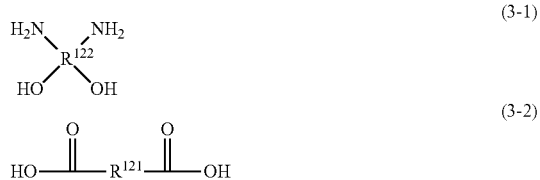

(3-1)

(3-2)

wherein $R^{122}$ represents a group same as $R^{122}$ n Formula (3); and $R^{121}$ represents a group same as $R^{121}$ in Formula (3).

<1.2> The composition of any one of <7> to <11>, having a water content of 1.0% by mass or less.

<13> The composition of any one of <7> to <12>, having a total content Na, K, Ca, Fe, Cu, Mg, Mn, Al, Li, Ni, Cr, Sn and Zn of 15 ppm by mass or less.

<14> A composition containing the resin descried in any one of <1> to <6>.

<15> A composition or any one of <7> to <14>, further containing a photo-polymerization initiator.

<16> A cured film obtainable by curing the resin described in any one of claims 1 to 6, or, the composition described in any one of <7> to <15>.

<17> The cured film of <16>, being a redistributioninsulating layer.

<18> A method for manufacturing a cured film comprising applying the composition described in any one of <7> to <15> to a substrate, and curing the composition applied to the substrate.

<19> A semiconductor device having the cured film described in <16> or <17>.

Advantageous Effects of Invention

According to this invention, it now became possible to provide a resin capable of yielding a cured film with less warp and good uniformity, and of yielding a cured film (pattern) with less scum; a composition using the resin; a cured film; a method for manufacturing cured a film; and a semiconductor device.

BRIEF DESCRIPTION OF DRAWINGS

FIG. 1 A schematic drawing illustrating an arrangement of an embodiment of a semiconductor device.

DESCRIPTION OF EMBODIMENTS

Description on constituents in this invention will occasionally be made based on the representative embodiments of this invention, without intention to restrict this invention to these embodiment.

All notations of group (atomic group) in this specification, given without "substituted" and "non-substituted", are understood to include both of those having substituent and those having no substituent. For example, "alkyl group" means not only represents an alkyl group having no substituent (non-substituted alkyl group), but also an alkyl group having a substituent (substituted alkyl group).

"Actinic light" in the context of this specification means, for example, bright line spectrum of mercury lamp, deep ultraviolet radiation represented by excimer laser light, extreme ultraviolet radiation (BUY light), X-ray, and electron beam. "Light" in the context of this invention means actinic light or radioactive ray. "Light exposure" in the context of this specification not only includes exposure to deep ultraviolet radiation, X-ray or EUV light typically emitted from mercury lamp or excimer laser source, but also includes drawing with a particle beam such as electron beam, ion beam and so forth, unless otherwise specifically noted.

All numerical ranges given in this specification using "to" mean numerical ranges that contain the preceded and succeeded numerals as the lower limit and the upper limit, respectively.

"(Meth)acrylate" in the context of this specification means "acrylate" and/or "methacrylate", "(meth)allyl" means "allyl" and/or "methallyl", "(meth)acryl" means "acryl" and/or "methacryl", and "(meth)acryloyl" means "acryloyl" and/or "methacryloyl".

"Process" in the context of this specification not only means an independent process, but also encompasses any process capable of accomplishing a desired operation, even if it is not clearly discriminable from other processes.

Solid component concentration in the context of this specification means mass percentage of component of the composition, excluding solvent, relative to the total mass of the composition. The solid component concentration is defined at 25° C., unless otherwise specifically noted.

Weight-average molecular weight (Mw) and number-average molecular weight (Mn) in the context of this specification are defined by polystyrene-equivalent values measured by gel permeation chromatography (GPC measurement), unless otherwise specifically noted. In this specification, weight-average molecular weight (Mw) and number-average molecular weight (Mn) may be determined typically by using HLC-8220 (from Tosoh Corporation), equipped with Guard column HZ-L, TSKgel Super HZM-M, TSKgel Super HZ4000, TSKgel Super HZ3000, or TSKgel Super HZ2000 (from Tosoh Corporation) as a column. Eluent is THF (tetrahydrofuran) unless otherwise specifically noted. For detection, employed is a detector sensing UV light at 254 nm.

Resin

The resin of this invention (occasionally referred to as "resin A", hereinafter) is selected from polyimide precursor, polyimide, polybenzoxazole precursor, and polybenzoxazole, having a polymerizable group, and having a total content of component(s) with a molecular weight of 1,000 or smaller of 0.005 to 1.0% by mass.

In the description below, the resin selected from polyimide precursor, polyimide, polybenzoxazole precursor, and polybenzoxazole will occasionally be referred to as "polyimide precursor, etc.".

With such configuration, the resin will yield a cured film with an effectively suppressed warp and good uniformity, and will yield a cured film (pattern) on which scum is effectively reduced. If polyimide precursor, etc. contains a large amount of low-molecular weight component, in particular, a large amount of starting monomer and/or derivative thereof, the resin would cause volumetric shrinkage after applied on a substrate and formed into a cured film under heating, to thereby warp the substrate. According to this invention, the warp is suppressed by reducing the content of such low-molecular weight component. In addition, the polyimide precursor, etc. containing a polymerizable group, as in this invention, was found to produce much scum (residue) on the resultant cured film, if the low-molecular weight component is contained excessively over a predetermined value. It was also found that, within a predetermined amount of addition, the low-molecular weight component could improve solubility of the polyimide precursor, etc. into solvents, and could produce a uniform cured film.

Based on these findings, this invention is now capable of solving the above-described problems, by blending the low-molecular weight component within the predetermined amount.

<Polyimide Precursor, Polyimide, Polybenzoxazole Precursor, and Polybenzoxazole>

The polyimide precursor, etc. used in this invention is a resin selected from polyimide precursor, polyimide, polybenzoxazole precursor, and polybenzoxazole, having a polymerizable group. It is preferably selected from polyimide precursor and polybenzoxazole precursor.

The polymerizable group is a group capable of causing crosslinking reaction, under interaction with actinic light, radioactive ray, radical, acid or base. Preferred examples include ethylenic unsaturated bond-containing group, alkoxy methyl group, hydroxymethyl group, acyloxymethyl group, epoxy group, oxetanyl group, benzoxazolyl group, block isocyanate group, methylol group, and amino group. The polymerizable group owned by the polyimide precursor, etc. is preferably the ethylenic unsaturated bond-containing group.

The ethylenic unsaturated bond-containing group is exemplified by vinyl group, (meth)allyl group, and group represented by Formula (III) below.

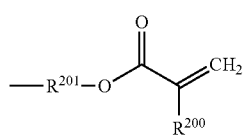
(III)

In Formula (III), $R^{200}$ represents a hydrogen atom or methyl group, wherein methyl group is preferable.

In Formula (III), $R^{201}$ represents an alkylene group having 2 to 12 carbon atoms, $-CH_2CH(OH)CH_2-$ or polyoxyalkylene group having 4 to 30 carbon atoms.

$R^{201}$ is preferably exemplified by ethylene group, propylene group, trimethylene group, tetramethylene group, 1,2-butanediyl group, 1,3-butanediyl group, pentamethylene group, hexamethylene group, octamethylene group, dodecamethylene group, and $-CH_2CH(OH)CH_2-$, wherein ethylene group, propylene group, trimethylene group, and $-CH_2CH(OH)CH_2-$ are preferable.

In a particularly preferred example, $R^{200}$ represents a methyl group, and $R^{201}$ represents an ethylene group.

The polymerizable group may be bound to any position on the polyimide precursor, etc.

<<Polyimide Precursor>>

The polyimide precursor used in this invention is not specifically limited in terms of structure thereof, wherein it preferably contains a repeating unit represented by Formula (2) below.

Formula (2)

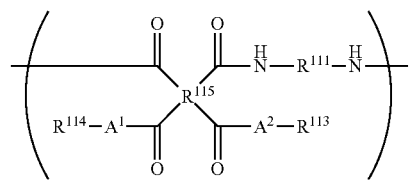

In Formula (2), each of $A^1$ and $A^2$ independently represents an oxygen atom or NH, $R^{111}$ represents a divalent organic group, $R^{115}$ represents a tetravalent organic group, each of $R^{113}$ and $R^{114}$ independently represents a hydrogen atom or monovalent organic group, at least one of $R^{113}$ or $R^{114}$ represents a polymerizable group-containing group, wherein the polymerizable group is preferable.

In Formula (2), each of $A^1$ and $A^2$ independently represents an oxygen atom or NH, wherein oxygen atom is preferable.

In Formula (2), $R^{111}$ represents a divalent organic group. The divalent organic group is exemplified by groups containing a straight-chain or branched aliphatic group, cyclic aliphatic group, or aromatic group, wherein more preferred examples include groups composed of straight-chain or branched aliphatic group having 2 to 20 carbon atoms, cyclic aliphatic group having 6 to 20 carbon atoms, aromatic group having 6 to 20 carbon atoms, or groups based on combinations of them. The aromatic group composed of a group having 6 to 60 carbon atoms is more preferable.

$R^{111}$ is preferably derived from a diamine. The diamine used for producing the polyimide precursor is exemplified by straight-chain or branched aliphatic, cyclic aliphatic or aromatic diamine. Only a single species, or two or more species of the diamines may be used.

More specifically, the diamines preferably contains straight-chain or branched aliphatic group having 2 to 20 carbon atoms, cyclic aliphatic group having 6 to 20 carbon atoms, aromatic group having 6 to 20 carbon atoms, or groups based on combinations of them; and more preferably contains a group composed of an aromatic group having 6 to 60 carbon atoms. The aromatic group is exemplified by those below.

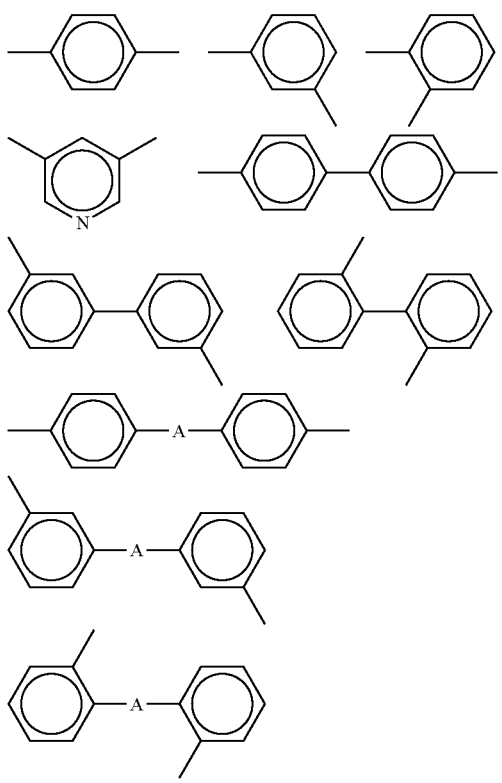

In the formulae, "A" preferably represents a single bond, or, a group selected from hydrocarbon group having 1 to 10 carbon atoms optionally substituted by fluorine atom(s), —O—, —C(=O)—, —S—, —S(=O)$_2$—, —NHCO—, and combinations of them. More preferred examples include single bond, and group selected from alkylene group having 1 to 3 carbon atoms optionally substituted by fluorine atom(s), —O—, —C(=O)—, —S— and —SO$_2$—. Divalent group selected form the group consisting of —CH$_2$—, —O—, —S—, —SO$_2$—, —C(CF$_3$)$_2$— and —C(CH$_3$)$_2$— is more preferable.

Specific examples of diamine include 1,2-diaminoethane, 1,2-diaminopropane, 1,3-diaminopropane, 1,4-diaminobutane and 1,6-diaminohexane; 1,2- and 1,3-diaminocyclopentanes, 1,2-, 1,3- and 1,4-diaminocyclohexanes, 1,2-, 1,3- and 1,4-bis(aminomethyl)cyclohexanes, bis(4-aminocyclohexyl)methane, bis(3-aminocyclohexyl)methane, 4,4'-diamino-3,3'-dimethylcyclohexyl methane and isophorone diamine; m- and p-phenylenediamines, diaminotoluene, 4,4'- and 3,3'-diaminobiphenyls, 4,4'-diamino diphenyl ether, 3,3-diamino diphenyl ether, 4,4'- and 3,3'-diaminodiphenylmethanes, 4,4'- and 3,3'-diaminodiphenylsulfones, 4,4'- and 3,3'-diaminodiphenylsulfides, 4,4'- and 3,3'-diaminobenzophenones, 3,3'-dimethyl-4,4'-diaminobiphenyl, 2,2'-dimethyl-4,4'-diaminobiphenyl, 3,3'-dimethoxy-4,4'-diaminobiphenyl, 2,2-bis(4-aminophenyl)propane, 2,2-bis(4-aminophenyl)hexafluoropropane, 2,2-bis(3-hydroxy-4-aminophenyl)propane, 2,2-bis(3-hydroxy-4-aminophenyl) hexafluoropropane, 2,2-bis(3-amino-4-hydroxyphenyl) propane, 2,2-bis(3-amino-4-hydroxyphenyl) hexafluoropropane, bis(3-amino-4-hydroxyphenyl)sulfone, bis(4-amino-3-hydroxyphenyl)sulfone, 4,4'-diaminoparaterphenyl, 4,4'-bis(4-aminophenoxy)biphenyl, bis[4-(4-aminophenoxy)phenyl]sulfone, bis[4-(3-aminophenoxy)phenyl] sulfone, bis[4-(2-aminophenoxy)phenyl]sulfone, 1,4-bis(4-aminophenoxy)benzene, 9,10-bis(4-aminophenyl) anthracene, 3,3'-dimethyl-4,4'-diaminodiphenylsulfone, 1,3-bis(4-aminophenoxy)benzene, 1,3-bis(3-aminophenoxy) benzene, 1,3-bis(4-aminophenyl)benzene, 3,3'-diethyl-4,4'-diaminodiphenylmethane, 3,3'-dimethyl-4,4'-diaminodiphenylmethane, 4,4'-diaminooctafluorobiphenyl, 2,2-bis[4-(4-aminophenoxy)phenyl]propane, 2,2-bis[4-(4-aminophenoxy)phenyl]hexafluoropropane, 9,9-bis(4-aminophenyl)-10-hydroanthracene, 3,3',4,4'-tetraaminobiphenyl, 3,3',4,4'-tetraaminodiphenyl ether, 1,4-diaminoanthraquinone, 1,5-diaminoanthraquinone, 3,3-dihydroxy-4,4'-diaminobiphenyl, 9,9'-bis(4-aminophenyl) fluorene, 4,4'-dimethyl-3,3'-diaminodiphenylsulfone, 3,3',5, 5'-tetramethyl-4,4'-diaminodiphenylmethane, 2,4- and 2,5-diaminocumenes, 2,5-dimethyl-p-phenylenediamine, acetoguanamine, 2,3,5,6-tetramethyl-p-phenylenediamine, 2,4,6-trimethyl-m-phenylenediamine, bis(3-aminopropyl) tetramethyldisiloxane, 2,7-diaminofluorene, 2,5-diaminopyridine, 1,2-bis(4-aminophenyl)ethane, diaminobenzanilide, diaminobenzoate ester, 1,5-diaminonaphthalene, diaminobenzotrifluoride, 1,3-bis(4-aminophenyl)hexafluoropropane, 1,4-bis(4-aminophenyl)octafluorobutane, 1,5-bis (4-aminophenyl)decafluoropentane, 1,7-bis(4-aminophenyl) tetradecafluoroheptane, 2,2-bis[4-(3-aminophenoxy)phenyl] hexafluoropropane, 2,2-bis[4-(2-aminophenoxy)phenyl] hexafluoropropane, 2,2-bis[4-(4-aminophenoxy)-3,5-dimethylphenyl]hexafluoropropane 2,2-bis[4-(4-aminophenoxy)-3,5-bis(trifluoromethyl)phenyl] hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenylsulfone, 4,4'-bis(3-amino-5-trifluoromethylphenoxy)diphenylsulfone, 2,2-bis[4-(4-amino-3-trifluoromethylphenoxy)phenyl] hexafluoropropane, 3,3',5,5'-tetramethyl-4,4'-diaminobiphenyl, 4,4'-diamino-2,2'-bis(trifluoromethyl) biphenyl, 2,2',5,5',6,6'-hexafluorotolidine, and 4,4'-diaminoquaterphenyl.

Also diamines (DA-1) to (DA-18) enumerated below are preferable.

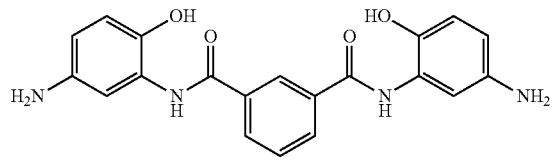

(DA-1)

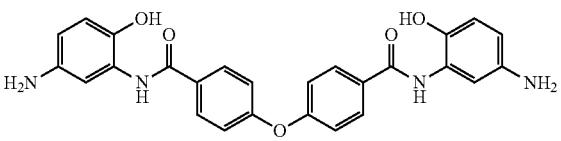

(DA-2)

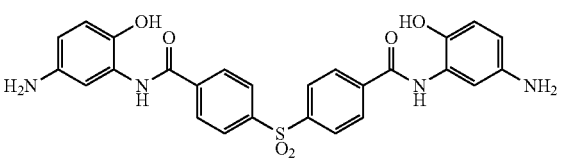

(DA-3)

(DA-4)
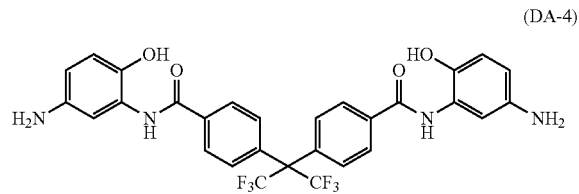

(DA-5)
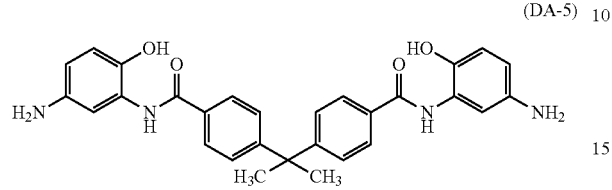

(DA-6)
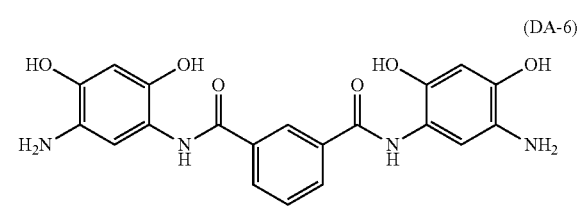

(DA-7)
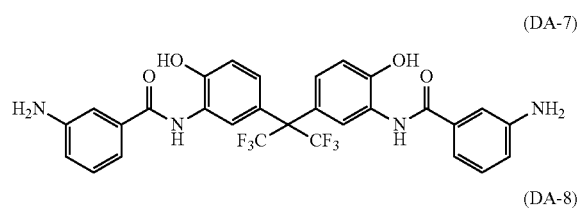

(DA-8)
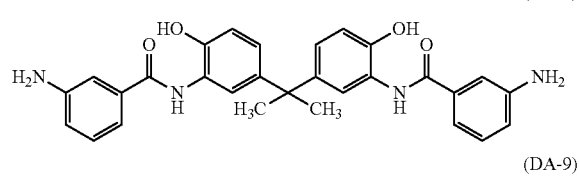

(DA-9)
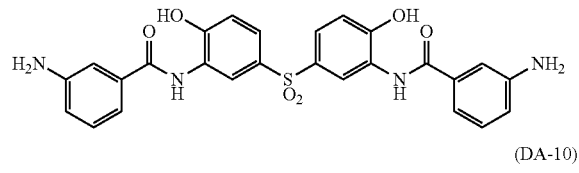

(DA-10)
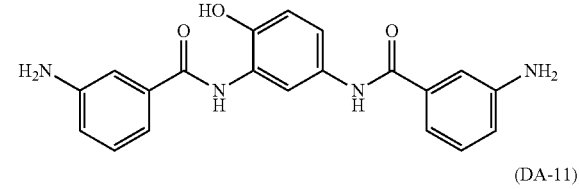

(DA-11)
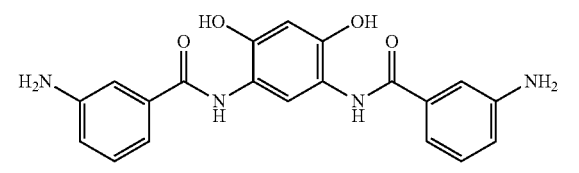

(DA-12)
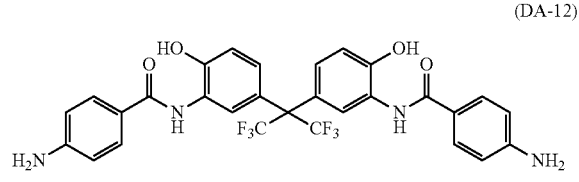

(DA-13)
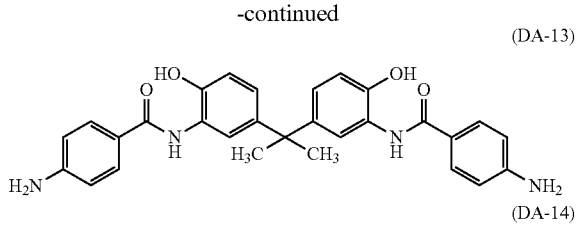

(DA-14)
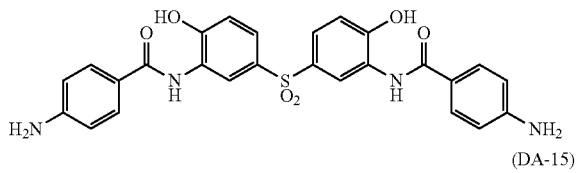

(DA-15)
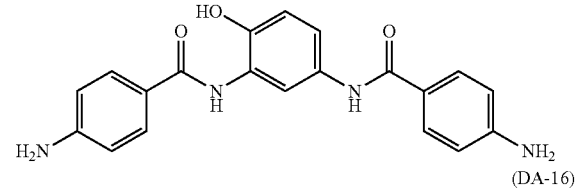

(DA-16)
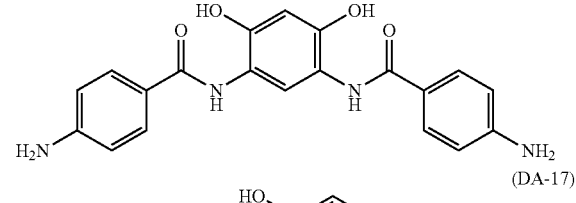

(DA-17)
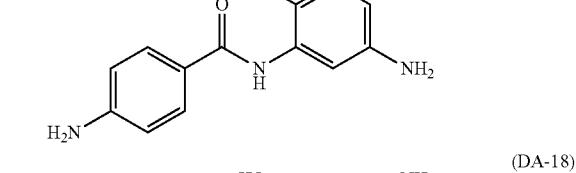

(DA-18)
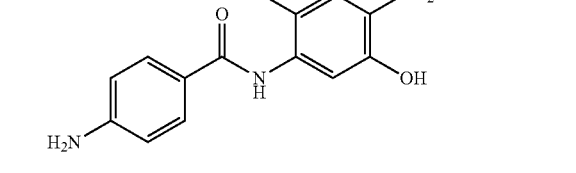

Also diamine having at least two alkylene glycol units is exemplified as a preferred example. It is preferably a diamine having two or more in total of ethylene glycol chain and/or propylene glycol chain within one molecule, and more preferably a diamine having no aromatic ring.

Specific examples include, but not limited to, Jeffamine (registered trademark) KH-511, Jeffamine (registered trademark) ED-600, Jeffamine (registered trademark) ED-900, Jeffamine (registered trademark) ED-2003, Jeffamine (registered trademark) EDR-148, Jeffamine (registered trademark) EDR-176, D-200, D-400, D-2000, D-4000 (all trade names, from HUNTSMAN Corporation), 1-(2-(2-(2-aminopropoxy)ethoxy)propoxy)propane-2-amine, and 1-(1-(1-(2-aminopropoxy)propane-2-yl)oxy)propane-2-amine.

Structural formulae of Jeffamine (registered trademark) KH-511, Jeffamine (registered trademark) ED-600, Jeffamine (registered trademark) ED-900, Jeffamine (registered trademark) ED-2003, Jeffamine (registered trademark) EDR-148, and Jeffamine (registered trademark) EDR-176 are shown below.

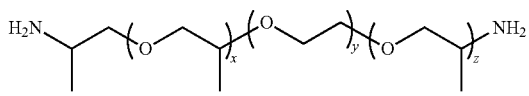

KH-511 (y = 2.0, x + z = 1.2)
ED-600 (y = 9.0, x + z = 3.6)
ED-900 (y = 12.5, x + z = 6.0)
ED-2003 (y = 39.0, x + z = 6.0)

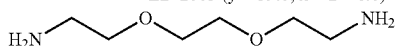

EDR-148

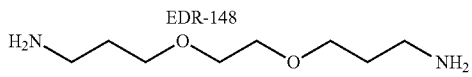

EDR-176

In the formulae, each of x, y and z represents an average value.

In Formula (2), $R^{115}$ represents a tetravalent organic group. The tetravalent organic group is preferably aromatic ring-containing tetravalent organic group, and more preferably a group represented by Formula (5) or Formula (6) below.

Formula (5)

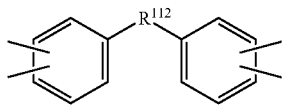

In Formula (5), $R^{112}$ represents a single bond, or, a group selected from hydrocarbon group having 1 to 10 carbon atoms optionally substituted by fluorine atom(s), —O—, —CO—, —S—, —SO$_2$—, —NHCO—, and combinations of them. More preferred examples include single bond, or a group selected from alkylene group having 1 to 3 carbon atoms optionally substituted by fluorine atom(s), —O—, —CO—, —S— and —SO$_2$—. Even more preferred examples include divalent groups selected from the group consisting of —CH$_2$—, —C(CF$_3$)$_2$—, —C(CH$_3$)$_2$—, —O—, —CO—, —S— and —SO$_2$—.

Formula (6)

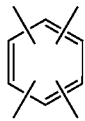

$R^{115}$ is specifically exemplified by a tetracarboxylic acid residue that remains after eliminating an anhydride group from tetracarboxylic acid dianhydride. Only one species, or two or more species of ostetracarboxylic acid dianhydrides may be used.

The tetracarboxylic acid dianhydride is preferably represented by Formula (O) below.

Formula (O)

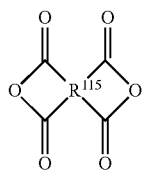

In Formula (O), $R^{115}$ represents a tetravalent organic group. $R^{115}$ is synonymous to $R^{115}$ in Formula (2), defined by same preferable ranges.

Specific examples of the tetracarboxylic acid dianhydride include pyromellitic dianhydride (PMDA), 3,3',4,4'-biphenyltetracarboxylic acid dianhydride, 3,3',4,4'-diphenylsulfidetetracarboxylic acid dianhydride, 3,3',4,4'-diphenylsulfonetetracarboxylic acid dianhydride, 3,3',4,4'-benzophenone tetracarboxylic acid dianhydride, 3,3',4,4'-diphenylmethanetetracarboxylic acid dianhydride, 2,2',3,3'-diphenylmethanetetracarboxylic acid dianhydride, 2,3,3',4'-biphenyltetracarboxylic acid dianhydride, 2,3,3',4'-benzophenone tetracarboxylic acid dianhydride, 4,4'-oxydiphthalic dianhydride, 2,3,6,7-naphthalenetetracarboxylic acid dianhydride, 1,4,5,7-naphthalenetetracarboxylic acid dianhydride, 2,2-bis(3,4-dicarboxyphenyl)propane dianhydride, 2,2-bis(2,3-dicarboxyphenyl)propane dianhydride, 2,2-bis(3,4-dicarboxyphenyl)hexafluoropropane dianhydride, 1,3-diphenylhexafluoropropane-3,3,4,4-tetracarboxylic acid dianhydride, 1,4,5,6-naphthalenetetracarboxylic acid dianhydride, 2,2',3,3'-diphenyltetracarboxylic acid dianhydride, 3,4,9,10-perylenetetracarboxylic acid dianhydride, 1,2,4,5-naphthalenetetracarboxylic acid dianhydride, 1,4,5,8-naphthalenetetracarboxylic acid dianhydride, 1,8,9,10-phenanthrenetetracarboxylic acid dianhydride, 1,1-bis(2,3-dicarboxyphenyl)ethane dianhydride, 1,1-bis(3,4-dicarboxyphenyl) ethane dianhydride, 1,2,3,4-benzenetetracarboxylic acid dianhydride, and, alkyl derivatives of these compounds having alkyl group with 1 to 6 carbon atoms or alkoxy group with 1 to 6 carbon atoms.

Also tetracarboxylic acid dianhydrides (DAA-1) to (DAA-5) enumerated below are preferable.

(DAA-1)

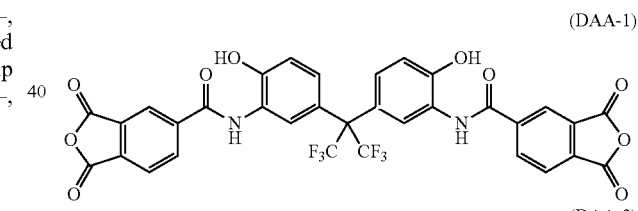

(DAA-2)

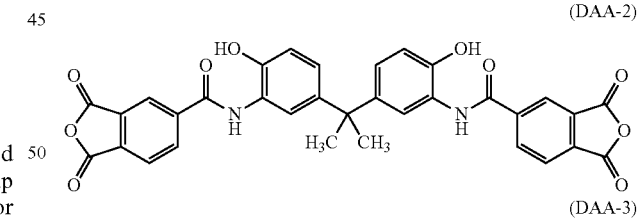

(DAA-3)

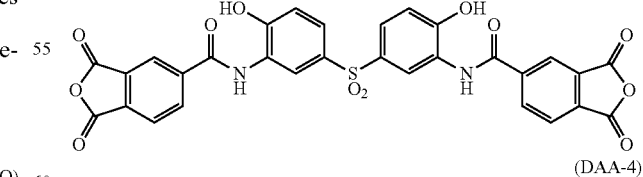

(DAA-4)

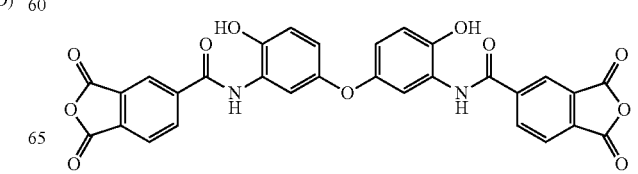

-continued

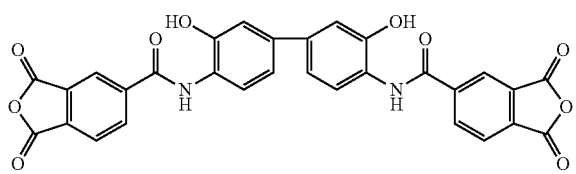

(DAA-5)

From the viewpoint of solubility in alkaline developing solution, at least one of $R^{111}$ or $R^{115}$ represents a OH group. More specifically, $R^{111}$ is exemplified by a residue of bisaminophenol derivative.

Each of $R^{113}$ and $R^{114}$ independently represents a hydrogen atom or monovalent organic group, and at least one of $R^{113}$ or $R^{114}$ represents a polymerizable group-containing group, and preferably represents a polymerizable group. The polymerizable group is synonymous to the polymerizable group owned by the above-described polyimide precursor, etc., defined by the same preferable ranges. The polyimide precursor is more preferable when at least one of $R^{113}$ or $R^{114}$ represents a polymerizable group-containing group, and both of $R^{113}$ and $R^{114}$ contain a polymerizable group.

For the monovalent organic group represented by $R^{113}$ or $R^{114}$, a substituent capable of improving solubility in the developing solution is preferably used.

From the viewpoint of solubility in aqueous developing solution, $R^{113}$ or $R^{114}$ may represent a hydrogen atom or monovalent organic group. The monovalent organic group is preferably exemplified by an aromatic group and aralkyl group, having one, two, or three, and preferably one acidic group bound to a carbon atom composing the aryl group. Specific examples include acidic group-containing aromatic group having 6 to 20 carbon atoms, and acidic group-containing aralkyl group having 7 to 25 carbon atoms. More specific examples include acidic group-containing phenyl group and acidic group-containing benzyl group. The acidic group is preferably OH group.

From the viewpoint of solubility in the aqueous developing solution, $R^{113}$ or $R^{114}$ preferably represents a hydrogen atom, 2-hydroxybenzyl group, 3-hydroxybenzyl group or 4-hydroxybenzyl group.

From the viewpoint of solubility in organic solvent, $R^{113}$ or $R^{114}$ preferably represents a monovalent organic group. The monovalent organic group preferably contains a straight-chain or branched alkyl group, cyclic alkyl group, or aromatic group, and more preferably contains an aromatic group-substituted alkyl group.

The alkyl group preferably has 1 to 30 carbon atoms. The alkyl group may be any of straight-chain, branched and cyclic ones. The straight-chain or branched alkyl group is exemplified by methyl group, ethyl group, propyl group, butyl group, pentyl group, hexyl group, heptyl group, octyl group, nonyl group, decyl group, dodecyl group, tetradecyl group, octadecyl group, isopropyl group, isobutyl group, sec-butyl group, t-butyl group, 1-ethylpentyl group, and 2-ethylhexyl group. The cyclic alkyl group may be a monocyclic alkyl group, or may be a polycyclic alkyl group. The monocyclic alkyl group is exemplified by cyclopropyl group, cyclobutyl group, cyclopentyl group, cyclohexyl group, cycloheptyl group and cyclooctyl group. The polycyclic alkyl group is exemplified by adamantyl group, norbornyl group, bornyl group, camphenyl group, decahydronaphthyl group, tricyclodecanyl group, tetracyclodecanyl group, camphoroyl group, dicyclohexyl group and pinenyl group. Among them, cyclohexyl group is most preferable from the viewpoint of balancing with high sensitivity. The aromatic group-substituted alkyl group is preferably an aromatic group-substituted, straight-chain alkyl group as described later.

The aromatic group is specifically exemplified by substituted or non-substituted benzene ring, naphthalene ring, pentalene ring, indene ring, azulene ring, heptalene ring, indacene ring, perylene ring, pentacene ring, acenaphthylene ring, phenanthrene ring, anthracene ring, naphthacene ring, chrysene ring, triphenylene ring, fluorene ring, biphenyl ring, pyrrole ring, furan ring, thiophene ring, imidazole ring, oxazole ring, thiazole ring, pyridine ring, pyrazine ring, pyrimidine ring, pyridazine ring, indolizine ring, indole ring, benzofuran ring, benzothiophene ring, isobenzofuran ring, quinolizine ring, quinoline ring, phthalazine ring, naphthyridine ring, quinoxaline ring, quinazoline ring, isoquinoline ring, carbazole ring, phenanthridine ring, acridine ring, phenanthroline ring, thianthrene ring, chromene ring, xanthene ring, phenoxathiin ring, phenothiazine ring and phenazine ring. Benzene ring is most preferable.

When $R^{113}$ in Formula (2) represents a hydrogen atom, or, $R^{114}$ represents a hydrogen atom, the compound may form a salt with a tertiary amine compound having an ethylenic unsaturated bond. Such tertiary amine compound having an ethylenic unsaturated bond is exemplified by N,N-dimethylaminopropyl methacrylate.

From the viewpoint of improving resolution in alkaline development, the polyimide precursor preferably contains fluorine atom(s) in its structural unit. Fluorine atom(s) will make the film surface water-repellent, and can prevent permeation of water through the surface during alkaline development. The polyimide precursor preferably has a fluorine atom content of 10% by mass or more, and more preferably 20% by mass or less from the viewpoint of solubility in aqueous alkaline solution.

For the purpose of improving adhesiveness with the substrate, the polyimide precursor may be co-polymerized with an aliphatic group having a siloxane structure. More specifically, the diamine component is exemplified by bis (3-aminopropyl)tetramethyldisiloxane, and bis(p-aminophenyl)octamethylpentasiloxane.

The repeating unit represented by Formula (2) is preferably a repeating unit represented by Formula (2-A). In other words, at least one species of the polyimide precursor, etc. used in this invention is preferably a precursor having a repeating unit represented by Formula (2-A). With such structure, the exposure latitude may be widened.

Formula (2-A)

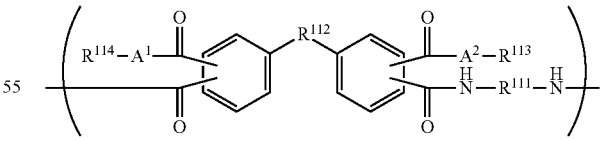

In Formula (2-A), each of $A^1$ and $A^2$ represents an oxygen atom, each of $R^{111}$ and $R^{112}$ independently represents a divalent organic group, each of $R^{113}$ and $R^{114}$ independently represents a hydrogen atom or monovalent organic group, at least one of $R^{113}$ or $R^{114}$ represents a polymerizable group-containing group, and is preferably a polymerizable group.

$A^1$, $A^2$, $R^{111}$, $R^{113}$ and $R^{114}$ are respectively synonymous to $A^1$, $A^2$, $R^{121}$, $R^{113}$ and $R^{114}$ in Formula (2), defined by the same preferable ranges.

$R^{112}$ is synonymous to $R^{112}$ in Formula (5), defined by the same preferable ranges.

The polyimide precursor may contain one species of, and even may be two or more species of, the repeating unit represented by Formula (2). It may also contain a structural isomer of the repeating unit represented by Formula (2). Of course, the polyimide precursor may contain other repeating unit, besides the repeating unit represented by Formula (2).

One embodiment of the polyimide precursor in this invention is exemplified by a polyimide precursor, in which the repeating unit represented by Formula (2) accounts for 50 mol % or more, or 70 mol % or more, and particularly 90 mol % or more of the total repeating units.

The polyimide precursor preferably has a weight-average molecular weight (Mw) of 18,000 to 30,000, more preferably 20,000 to 27,000, and even more preferably 22,000 to 25,000. The number-average molecular weight (Mn) is preferably 7,200 to 14,000, more preferably 8,000 to 12,000, and even more preferably 9,200 to 11,200.

The polyimide precursor preferably has a dispersity of 2.5 or larger, more preferably 2.7 or larger, and even more preferably 2.8 or larger. The upper limit value of the dispersity of polyimide precursor is not specifically limited, but is preferably 4.5 or smaller, more preferably 4.0 or smaller, even more preferably 3.8 or smaller, yet more preferably 3.2 or smaller, furthermore preferably 3.1 or smaller, still more preferably 3.0 or smaller, and particularly 2.95 or smaller.

<<Polyimide>>

The polyimide used in this invention is not specifically limited so long as it has an imide ring, and is a high molecular compound having a polymerizable group, but is preferably a compound represented by Formula (4) below having a polymerizable group.

Formula (4)

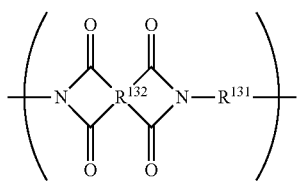

(4)

In Formula (4), $R^{131}$ represents a divalent organic group, and $R^{132}$ represents a tetravalent organic group.

The polymerizable group may reside at least one of $R^{131}$ or $R^{132}$, or may reside at the terminal of the polyimide as represented by Formula (4-1) or Formula (4-2) below.

Formula (4-1)

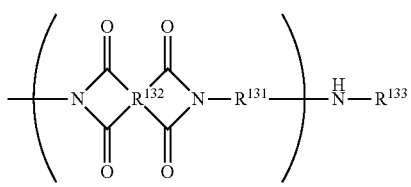

In Formula (4-1), $R^{133}$ represents a polymerizable group. The other groups are synonymous to those in Formula (4).

Formula (4-2)

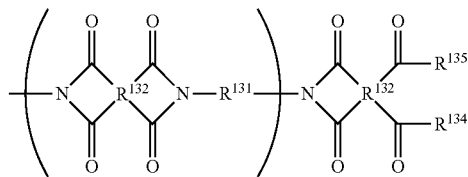

At least one of $R^{134}$ or $R^{135}$ represents a polymerizable group, or represents an organic group when they do not represent a polymerizable group. The other groups are synonymous to those in Formula (4).

The polymerizable group is synonymous to the polymerizable group having been described in relation to the polymerizable group owned by the above-described polyimide precursor, etc.

$R^{131}$ represents a divalent organic group. The divalent organic group is exemplified by those represented by $R^{111}$ in Formula (2), defined by the same preferable ranges.

$R^{131}$ is exemplified by a diamine residue that remains after elimination of an amino group from the diamine. The diamine is exemplified by aliphatic, alicyclic or aromatic diamine. Specific examples include those represented by $R^{111}$ in polyimide precursor represented by Formula (2).

$R^{131}$ is preferably a diamine residue having at least two alkylene glycol units in the principal chain, from the viewpoint of more effectively suppressing warp during firing. More preferably, $R^{131}$ represents a diamine residue having two or more in total of ethylene glycol chain and/or propylene glycol chain, within one molecule, and even more preferably a diamine residue having no aromatic ring.

The diamine having two or more in total of the ethylene glycol chain and/or propylene glycol chain within one molecule is exemplified by, but not limited to, Jeffamine (registered trademark) KH-511, Jeffamine (registered trademark) ED-600, Jeffamine (registered trademark) ED-900, Jeffamine (registered trademark) ED-2003, Jeffamine (registered trademark) EDR-148, Jeffamine (registered trademark) EDR-176, D-200, D-400, D-2000, D-4000 (all trade names, from HUNTSMAN Corporation), 1-(2-(2-(2-aminopropoxy)ethoxy)propoxy)propane-2-amine, 1-(1-(1-(2-aminopropoxy)propane-2-yl)oxy)propane-2-amine, and 1-(2-(2-(2-aminopropoxy)ethoxy)propoxy)propane-2-amine.

$R^{132}$ represents a tetravalent organic group. The tetravalent organic group is exemplified by those represented by $R^{115}$ in Formula (2), defined by the same preferable ranges.

For example, four binding moieties of the tetravalent organic group represented by $R^{115}$ combine to four —C(=O)— moieties in Formula (4) to form condensed ring(s). For example, when $R^{132}$ represents an organic group given below, a structure given by PI-C, employed in this Example, may be formed.

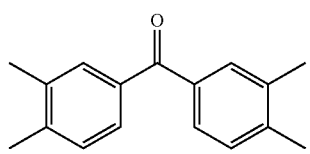

$R^{132}$ is exemplified by tetracarboxylic acid residue that remains after an anhydride group was eliminated from the tetracarboxylic acid dianhydride. Specific examples include those represented by $R^{115}$ in polyimide precursor represented by Formula (2). From the viewpoint of strength of the cured film, $R^{132}$ preferably represents an aromatic diamine residue having 1 to 4 aromatic rings.

From the viewpoint of solubility in the alkaline developing solution, at least one of $R^{131}$ or $R^{132}$ represents a OH group. More specifically, $R^{131}$ preferably represents 2,2-bis(3-hydroxy-4-aminophenyl)propane, 2,2-bis(3-hydroxy-4-aminophenyl)hexafluoropropane, 2,2-bis(3-amino-4-hydroxyphenyl)propane, 2,2-bis(3-amino-4-hydroxyphenyl)hexafluoropropane, and (DA-1) to (DA-18) enumerated above. $R^{132}$ preferably represents (DAA-1) to (DAA-5) enumerated above.

From the viewpoint of improving resolution in alkaline development, the polyimide preferably has fluorine atom(s) in its structural unit. Fluorine atom(s) will make the film surface water-repellent, and can prevent permeation of water through the surface during alkaline development. The polyimide preferably has a fluorine atom content of 10% by mass or more, and more preferably 20% by mass or less from the viewpoint of solubility in aqueous alkaline solution.

For the purpose of improving adhesiveness with the substrate, the polyimide may be co-polymerized with an aliphatic group having a siloxane structure. More specifically, the diamine component is exemplified by bis(3-aminopropyl)tetramethyldisiloxane, and bis(p-aminophenyl)octamethylpentasiloxane.

In expectation of improving shelf stability of the composition, the polyimide is preferably blocked at the terminals of the principal chain, using a terminal blocking agent such as monoamine, acid anhydride, monocarboxylic acid, monoacid chloride compound, and activated monoester compound. Among them, monoamine is preferably used. The monoamine is preferably exemplified by aniline, 2-ethynylaniline, 3-ethynylaniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalycylic acid, 5-aminosalycylic acid, 6-aminosalycylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol. Two or more species of them may be used, that is, a plurality of terminal blocking agents may be allowed to react to introduce a plurality of different terminal groups.

The polyimide preferably has an imidation ratio of 85% or larger, and more preferably 90% or larger. With the imidation ratio of 85% or larger, the film will have only a small degree of shrinkage due to ring-closing imidation under heating, and will be suppressed from warping.

The polyimide may contain a repeating unit represented by Formula (4) having two or more different groups for $R^{131}$ or $R^{132}$, besides a repeating unit represented by Formula (4) having all the same groups for $R^{131}$ or $R^{132}$. Alternatively, the polyimide may contain any other kind of repeating unit, besides the repeating unit represented by Formula (4) above.

The polyimide may be synthesized, for example, by firstly obtaining the polyimide precursor by any of methods, including a method for allowing a tetracarboxylic acid dianhydride to react with a diamine compound (partially substituted by a monoamine as the terminal blocking agent) at low temperatures; a method for allowing a tetracarboxylic acid dianhydride (partially substituted by an acid anhydride or monoacid chloride compound or activated monoester compound as the terminal blocking agent) to react with a diamine compound at low temperatures; a method for obtaining a diester by allowing a tetracarboxylic acid dianhydride to react with an alcohol, and then allowing it to react with a diamine (partially substituted by a monoamine as the terminal blocking agent) in the presence of a condensing agent; and a method for obtaining a diester from a tetracarboxylic acid dianhydride and an alcohol, converting the remaining dicarboxylic acid to an acid chloride, and then allowing the product to react with a diamine (partially substituted by a monoamine as the terminal blocking agent), and then processing the thus-obtained polyimide precursor by a method for complete imidation based on known imidation reaction; or a method for partially introducing the imide structure by interrupting the imidation reaction in midway; or a method for partially introducing the imide structure by blending the completely imidated polymer and the polyimide precursor of such polymer.

Commercially available polyimide is exemplified by Durimide (registered trademark) 284, from Fujifilm Corporation.

The polyimide preferably has a weight-average molecular weight (Mw) of 5,000 to 70,000, more preferably 8,000 to 50,000, and even more preferably 10,000 to 30,000. With the weight-average molecular weight controlled to 5,000 or larger, the cured film will have an improved breakage resistance. Meanwhile, with the weight-average molecular weight controlled to 70,000 or smaller, the film will have an improved developability with a developing solution such as aqueous alkaline solution. In expectation of obtaining the cured film that excels in mechanical properties, a weight-average molecular weight of 20,000 or larger is particularly preferable. When two or more species of polyimides are contained, at least one species of polyimide preferably falls within the above-described range of weight-average molecular weight.

<<Polybenzoxazole Precursor>>

Although the polybenzoxazole precursor used in this invention is not particularly specified in terms of its structure, it is preferably a compound containing a repeating unit represented by Formula (3) below.

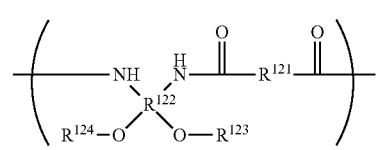

Formula (3)

In Formula (3), $R^{121}$ represents a divalent organic group, $R^{122}$ represents a tetravalent organic group, each of $R^{123}$ and $R^{124}$ independently represents a hydrogen atom or monovalent organic group, and at least one of $R^{123}$ or $R^{124}$ represents a polymerizable group-containing group.

The polymerizable group is synonymous to the polymerizable group having been described in relation to the polymerizable group owned by the above-described polyimide precursor, etc.

In Formula (3), $R^{121}$ represents a divalent organic group. The divalent organic group preferably contains at least one of aliphatic group or aromatic group. The aliphatic group is preferably a straight-chain aliphatic group. $R^{121}$ preferably represents a dicarboxylic acid residue. Only one species, or two or more species of the dicarboxylic acid residues may be used.

The dicarboxylic acid is preferably an aliphatic group-containing dicarboxylic acid and an aromatic group-containing dicarboxylic acid, wherein the aromatic group-containing dicarboxylic acid is more preferable.

The aliphatic group-containing dicarboxylic acid preferably contains a straight-chain or branched (preferably straight-chain) aliphatic group, and more preferably contains a straight-chain or branched (preferably straight-chain) aliphatic group and two —COOH groups. The straight-chain or branched (preferably straight-chain) aliphatic group preferably has 2 to 30 carbon atoms, the number of which is more preferably 2 to 25, even more preferably 3 to 20, yet more preferably 4 to 15, and particularly 5 to 10. The straight-chain aliphatic group is preferably an alkylene group.

The dicarboxylic acid that contains a straight-chain aliphatic group is exemplified by malonic acid, dimethylmalonic acid, ethylmalonic acid, isopropylmalonic acid, di-n-butylmalonic acid, succinic acid, tetrafluorosuccinic acid, methylsuccinic acid, 2,2-dimethylsuccinic acid, 2,3-dimethylsuccinic acid, dimethylmethylsuccinic acid, gluratic acid, hexafluoroglutaric acid, 2-methylglutaric acid, 3-methylglutaric acid, 2,2-dimethylglutaric acid, 3,3-dimethylglutaric acid, 3-ethyl-3-methylglutaric acid, adipic acid, octafluoroadipic acid, 3-methyladipic acid, pimelic acid, 2,2,6,6-tetramethylpimelic acid, suberic acid, dodecafluorosuberic acid, azelaic acid, sebacic acid, hexadecafluorosebacic acid, 1,9-nonanedioic acid, dodecanedioic acid, tridecanedioic acid, tetradecanedioic acid, pentadecanedioic acid, hexadecanedioic acid, heptadecanedioic acid, octadecanedioic acid, nonadecanedioic acid, eicosanedioic acid, heneicosanedioic acid, docosanedioic acid, tricosanedioic acid, tetracosanedioic acid, pentacosanedioic acid, hexacosanedioic acid, heptacosanedioic acid, octacosanedioic acid, nonacosanedioic acid, triacontanedioic acid, hentriacontanedioic acid, dotriacontanedioic acid, diglycolic acid, and dicarboxylic acids given by the formulae below.

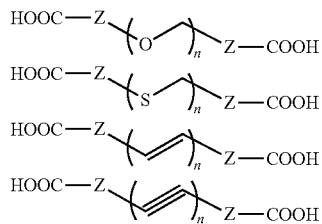

(In the formulae, Z represents a hydrocarbon group having 1 to 6 carbon atoms, and n represents an integer of 1 to 6.)

The aromatic group-containing dicarboxylic acid is preferably any one of the aromatic group-containing dicarboxylic acids enumerated below, and is more preferably any one of dicarboxylic acids composed of the aromatic groups enumerated below and two —COOH groups only.

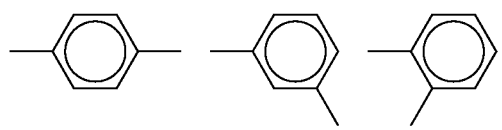

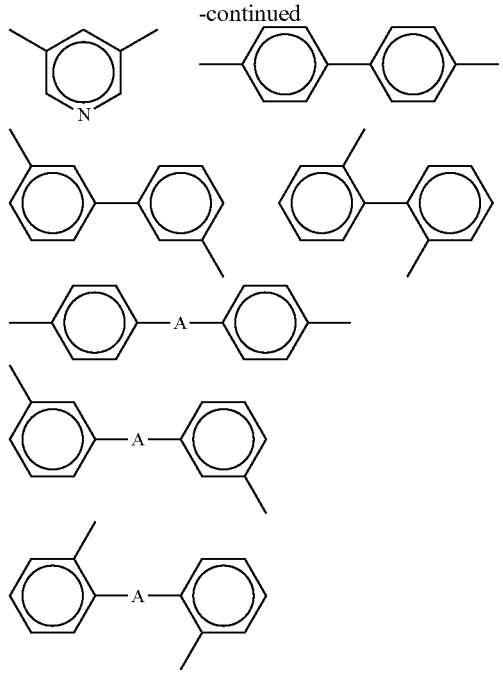

In the formulae, A represents a divalent group selected from the group consisting of —$CH_2$—, —O—, —S—, —$SO_2$—, —CO—, —NHCO—, —$C(CF_3)_2$—, and —$C(CH_3)_2$—.

Specific examples of the aromatic group-containing dicarboxylic acid include 4,4'-carbonyldibenzoic acid and 4,4'-dicarboxy diphenyl ether, and terephthalic acid.

In Formula (3), $R^{122}$ represents a tetravalent organic group. The tetravalent organic group is synonymous to those represented by $R^{115}$ in Formula (2), defined by the same preferable ranges.

$R^{122}$ is also preferably a group derived from bisaminophenol derivative. The group derived from bisaminophenol derivative is exemplified by 3,3'-diamino-4,4'-dihydroxybiphenyl, 4,4'-diamino-3,3'-dihydroxybiphenyl, 3,3'-diamino-4,4'-dihydroxydiphenylsulfone, 4,4'-diamino-3,3'-dihydroxydiphenylsulfone, bis(3-amino-4-hydroxyphenyl) methane, 2,2-bis(3-amino-4-hydroxyphenyl)propane, 2,2-bis(3-amino-4-hydroxyphenyl)hexafluoropropane, 2,2-bis(4-amino-3-hydroxyphenyl)hexafluoropropane, bis(4-amino-3-hydroxyphenyl)methane, 2,2-bis(4-amino-3-hydroxyphenyl)propane, 4,4'-diamino-3,3'-dihydroxybenzophenone, 3,3'-diamino-4,4'-dihydroxybenzophenone, 4,4'-diamino-3,3'-dihydroxydiphenyl ether, 3,3'-diamino-4,4'-dihydroxydiphenyl ether, 1,4-diamino-2,5-dihydroxybenzene, 1,3-diamino-2,4-dihydroxybenzene, and 1,3-diamino-4,6-dihydroxybenzene. These bisaminophenols may be used independently, or in a mixed manner.

Among the bisaminophenol derivatives, preferable are the aromatic group-containing bisaminophenol derivatives enumerated below.

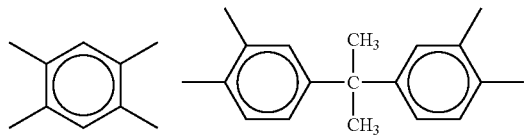

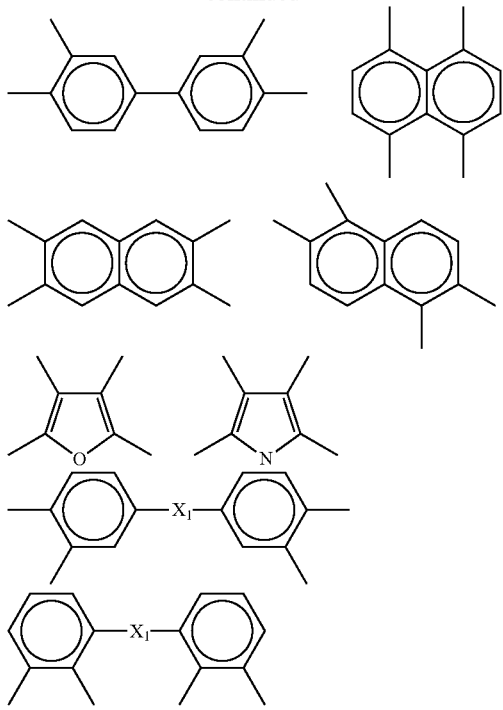

In the formulae, $X_1$ represents —O—, —S—, —C(CF$_3$)$_2$—, —CH$_2$—, —SO$_2$— or —NHCO—.

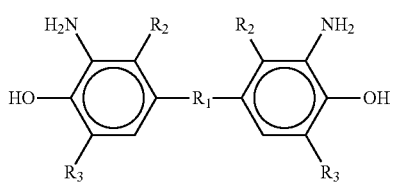
(A-s)

In Formula (A-s), $R_1$ represents a hydrogen atom, alkylene, substituted alkylene, —O—, —S—, —SO$_2$—, —CO—, —NHCO—, single bond, or organic group selected from the group represented by Formula (A-sc) below. Each $R_2$ represents any one of hydrogen atom, alkyl group, alkoxy group, acyloxy group and cyclic alkyl group, where ($R_2$)s may be same or different. Each $R_3$ represents any one of hydrogen atom, straight-chain or branched alkyl group, alkoxy group, acyloxy group and cyclic alkyl group, where ($R_3$) s may be same or different.

(A-sc)

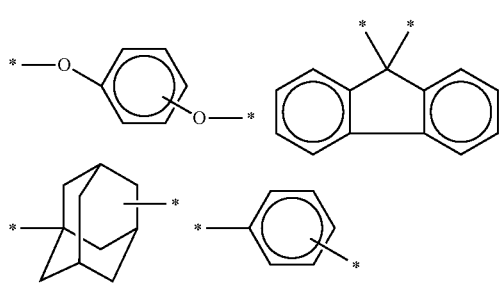

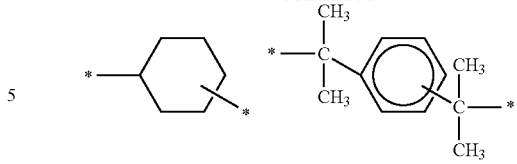

(In Formula (A-sc), * represents a point where the group is bound to the aromatic ring of the aminophenol group in the bisaminophenol derivative represented by Formula (A-s).)

In Formula (A-s), residence of a substituent also on the ortho position relative to the phenolic hydroxy group, or for $R_3$, is considered to make the distance between the carbonyl carbon in the amide bond and the hydroxy group shorter, expected to advantageously enhance the cyclization ratio during curing even at low temperatures.

In Formula (A-s), residence of an alkyl group for $R_2$, and an alkyl group for $R_3$ is particularly preferable, since the polybenzoxazole precursor will be well balanced among being kept highly translucent to i-line, being kept highly cyclizable in low temperature curing, and being sufficiently soluble to aqueous alkaline solution used as a developing solution.

In Formula (A-s), $R_1$ further preferably represents an alkylene or substituted alkylene. Specific examples of the alkylene and substituted alkylene represented by $R_1$ include —CH$_2$—, —CH(CH$_3$)—, —C(CH$_3$)$_2$—, —CH(CH$_2$CH$_3$)—, —C(CH$_3$)(CH$_2$CH$_3$)—, —C(CH$_2$CH$_3$)(CH$_2$CH$_3$)—, —CH(CH$_2$CH$_2$CH$_3$)—, —C(CH$_3$)(CH$_2$CH$_2$CH$_3$)—, —CH(CH(CH$_3$)$_2$)—, —C(CH$_3$)(CH(CH$_3$)$_2$)—, —CH(CH$_2$CH$_2$CH$_2$CH$_3$)—, —C(CH$_3$)(CH$_2$CH$_2$CH$_2$CH$_3$)—, —CH(CH$_2$CH(CH$_3$)$_2$)—, —C(CH$_3$)(CH$_2$CH(CH$_3$)$_2$)—, —CH(CH$_2$CH$_2$CH$_2$CH$_2$CH$_3$)—, —C(CH$_3$)(CH$_2$CH$_2$CH$_2$CH$_2$CH$_3$)—, —CH(CH$_2$CH$_2$CH$_2$CH$_2$CH$_2$CH$_3$)—, and —C(CH$_3$)(CH$_2$CH$_2$CH$_2$CH$_2$CH$_2$CH$_3$)—. Among them, —CH$_2$—, —CH(CH$_3$)— and —C(CH$_3$)$_2$— are more preferable, since the obtainable polybenzoxazole precursor will be well balanced among being kept highly translucent to i-line, being kept highly cyclizable in low temperature curing, and being sufficiently soluble not only to aqueous alkaline solution but also to solvent.

The bisaminophenol derivative represented by Formula (A-s) may be produced, making reference for example to the description in paragraphs [0085] to [0094] and Example 1 (paragraphs [0189] to [0190]) of JP-A-2013-256506, the contents of which are incorporated into this specification.

Structures of the bisaminophenol derivative represented by Formula (A-s) are specifically exemplified by those described in paragraphs [0070] to [0080] of JP-A-2013-256506, the contents of which are incorporated into this specification. Of course this invention is not limited thereto.

The polybenzoxazole precursor may contain other species of repeating unit, besides the repeating unit represented by Formula (3).

From the viewpoint of successfully suppressing the warp due to ring closure, a diamine residue represented by Formula (SL) below is preferably contained.

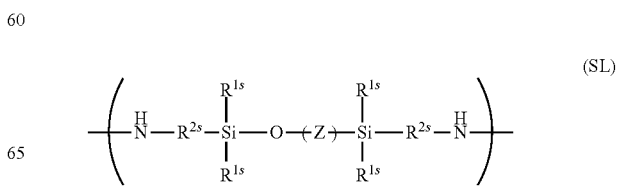
(SL)

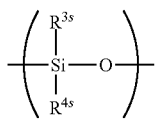

a

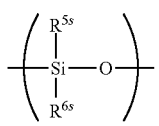

b

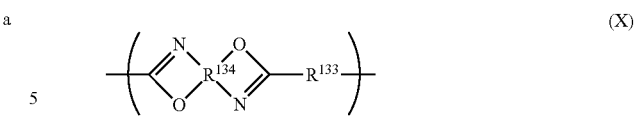

(X)

In Formula (X), $R^{133}$ represents a divalent organic group, and $R^{134}$ represents a tetravalent organic group.

The polymerizable group may reside at least one of $R^{133}$ or $R^{134}$, or may reside at the terminal of polybenzoxazole as represented by Formula (X-1) or Formula (X-2) below.

In Formula (SL), Z contains a-structure and b-structure, $R^{1s}$ represents a hydrogen atom or a hydrocarbon group having 1 to 10 carbon atoms, $R^{2s}$ represents a hydrocarbon group having 1 to 10 carbon atoms, at least one of $R^{3s}$, $R^{4s}$, $R^{5s}$ or $R^{6s}$ represents an aromatic group, and each of the residual ones represents a hydrogen atom or an organic group having 1 to 30 carbon atoms, which may be same or different. Mode of polymerization of the a-structure and the b-structure may be block polymerization or random polymerization. As for molar percentage of the Z moiety, the a-structure accounts for 5 to 95 mol %, the b-structure accounts for 95 to 5 mol %, where a+b=100 mol %.

In Formula (SL), Z preferably has the b-structure whose $R^{5s}$ and $R^{6s}$ represent a phenyl group. The structure represented by Formula (SL) preferably has a molecular weight of 400 to 4,000, and more preferably 500 to 3,000. With the molecular weight controlled within these ranges, the polybenzoxazole precursor after the dehydration ring closure will have a reduced elasticity, balancing an effect of suppressing the warp and an effect of improving the solubility in solvent.

When the diamine residue represented by Formula (SL) is contained as the other repeating unit, the polybenzoxazole precursor further preferably contain, as the repeating unit, a tetracarboxylic acid residue that remains after eliminating an anhydride group from tetracarboxylic acid dianhydride, from the viewpoint of improving the alkaline solubility. Such tetracarboxylic acid residue is exemplified by those represented by $R^{115}$ in Formula (2).

The polybenzoxazole precursor, when used for example for the composition described later, preferably has a weight-average molecular weight (Mw) of 18,000 to 30,000, which is more preferably 20,000 o 29,000, and even more preferably 22,000 to 28,000. The number-average molecular weight (Mn) is preferably 7,200 to 14,000, more preferably 8,000 to 12,000, and even more preferably 9,200 to 11,200.

The polybenzoxazole precursor preferably has a dispersity of 1.4 or larger, which is more preferably 1.5 or larger, and even more preferably 1.6 or larger. Although not specifically limited, the upper limit value of dispersity of the polybenzoxazole precursor is preferably 2.6 or smaller, more preferably 2.5 or smaller, even more preferably 2.4 or smaller, yet more preferably 2.3 or smaller, and furthermore preferably 2.2 or smaller.

<<Polybenzoxazole>>

The polybenzoxazole is not specifically limited so long as it has a benzoxazole ring, and is a high molecular compound having a polymerizable group, but is preferably a compound represented by Formula (X) below, having a polymerizable group.

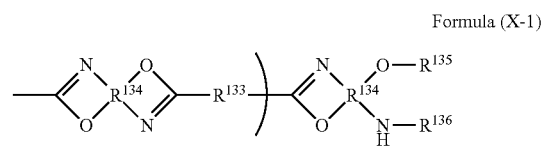

Formula (X-1)

In Formula (X-1), at least one of $R^{135}$ or $R^{136}$ represents a polymerizable group, or an organic group rather than polymerizable group. The other groups are synonymous to those in Formula (X).

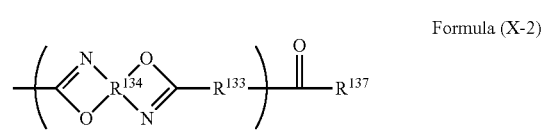

Formula (X-2)

In Formula (X-2), $R^{135}$ represents a polymerizable group, and the others are substituents. The other groups are synonymous to those in Formula (X).

The polymerizable group is synonymous to the polymerizable group having been described in relation to the polymerizable group owned by the above-described polyimide precursor, etc.

$R^{133}$ represents a divalent organic group. The divalent organic group is exemplified by aliphatic or aromatic group. Specific examples may be those represented by $R^{121}$ in polybenzoxazole precursor represented by Formula (3). Preferred examples thereof are same as those represented by $R^{121}$.

$R^{134}$ represents a tetravalent organic group. The tetravalent organic group is exemplified by those represented by $R^{122}$ in polybenzoxazole precursor represented by Formula (3). Preferred examples thereof are same as those represented by $R^{122}$.

For example, four binding moieties of the tetravalent organic group represented by $R^{134}$ combine to nitrogen atoms and oxygen atoms in Formula (X) to form condensed ring(s). For example, when $R^{34}$ represents the organic group below, the structure below will be formed.

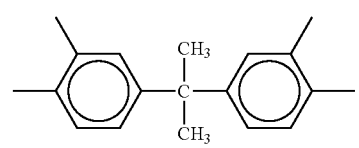

The polybenzoxazole preferably has a ratio of oxazole conversion of 85% or larger, which is more preferably 90% or larger. With the ratio of oxazole conversion controlled to 85% or larger, the film will have only a small degree of shrinkage due to ring-closing oxazole conversion under heating, and will be suppressed from warping.

The polybenzoxazole may contain a repeating unit represented by Formula (X) having different groups for $R^{131}$ or $R^{132}$, besides a repeating unit represented by Formula (X) having all the same groups for $R^{131}$ or $R^{132}$. Alternatively, the polybenzoxazole may contain any other kind of repeating unit, besides the repeating unit represented by Formula (X) above.

The polybenzoxazole may be obtained typically by allowing a bisaminophenol derivative, to react with a compound selected from a dicarboxylic acid having $R^{133}$, and dichloride and derivatives of such dicarboxylic acid, to thereby obtain the polybenzoxazole precursor first; and then by converting the thus obtained product into an oxazole based on any known method for oxazole formation.

When dicarboxylic acid is used, it is also preferable to use a dicarboxylic acid derivative of the activated ester-type, which is preliminarily reacted with 1-hydroxy-1,2,3-benzotriazole or the like, in order to elevate the reaction yield.

The polybenzoxazole preferably has a weight-average molecular weight (Mw) of 5,000 to 70,000, which is more preferably 8,000 to 50,000, and more preferably 10,000 to 30,000. With the weight-average molecular weight controlled to 5,000 or larger, the cured film will have an improved breakage resistance. On the other hand, with the weight-average molecular weight controlled to 70,000 or smaller, the film will have an improved developability with a developing solution such as aqueous alkaline solution. In expectation of obtaining the cured film that excels in mechanical properties, a weight-average molecular weight of 20,000 or larger is particularly preferable. When two or more species of polybenzoxazoles are contained, at least one species of polybenzoxazole preferably falls within the above-described ranges of weight-average molecular weight.

<<Method for Producing Polyimide Precursor, Etc.>>

The polyimide precursor, etc. may be obtained by allowing a dicarboxylic acid or a dicarboxylic acid derivative to react with a diamine. Preferably, the dicarboxylic acid or the dicarboxylic acid derivative is halogenated using a halogenation agent, and then allowing the product to react with the diamine.

In the method for producing the polyimide precursor, etc., it is preferable to use an organic solvent for the reaction. Only one species, or two or more species of organic solvents may be used.

The organic solvent is exemplified by pyridine, diethylene glycol dimethyl ether (diglyme), N-methylpyrrolidone and N-ethylpyrrolidone, which are selectable depending on the starting materials to be employed.

When polyimide or polybenzoxazole is used as the polyimide precursor, etc., each of the polyimide precursor or the polybenzoxazole precursor may separately synthesized and then may be cyclized under heating, or, polyimide or polybenzoxazole may directly be synthesized.

<<<Terminal Blocking Agent>>>

When the polyimide precursor, etc. is produced, the terminals of the polyimide precursor, etc. is preferably blocked with a terminal blocking agent such as acid anhydride, monocarboxylic acid, monoacid chloride compound, and activated monoester compound, in expectation of further improving the shelf stability. For the terminal blocking agent, monoamine is preferably used. Preferred examples of monoamine include aniline, 2-ethynylaniline, 3-ethynylaniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalycylic acid, 5-aminosalycylic acid, 6-aminosalycylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol. Two or more species of these compounds may be used. By allowing a plurality of terminal blocking agents to react, a plurality of different terminal groups may be introduced.

<<<Solid Deposition>>>

Method for producing the polyimide precursor, etc. may include a process of allowing a solid to deposit. More specifically, the polyimide precursor, etc. contained in the reaction liquid is thrown into water, and the produced precipitate is then dissolved in tetrahydrofuran or any other solvent capable of dissolving therein the polyimide precursor, etc., for solid deposition.

The polyimide precursor, etc. is then dried to obtain a powdery polyimide precursor, etc.

<Component with Molecular Weight of 1,000 or Smaller>

Resin A has a total content of the component(s) with a molecular weight of 1,000 or smaller of 0.005 to 1.0% by mass. With the content controlled to 1.0% by mass or less, the film will have a smaller content of the low molecular component and only a small degree of shrinkage during curing, and will be suppressed from warping. It is also made possible to reduce scum (residue) on the cured film (pattern). Meanwhile, with the content controlled to 0.05% by mass or more, resin A will have an improved solubility in solvent, and will be able to form a uniform cured film. The lower limit value of the content is preferably 0.01% by mass or larger, and more preferably 0.1% by mass or larger. The upper limit value of the content is preferably 0.9% by mass or smaller, more preferably 0.6% by mass or smaller, and even more preferably 0.5% by mass or smaller.

The content of the component with a molecular weight of 1,000 or smaller is determined according to a method described later in EXAMPLES.

<<Starting Monomer of Resin A, and Derivative Thereof>>

The component with a molecular weight of 1,000 or smaller is exemplified by a starting monomer of resin A, and a derivative thereof. By controlling the contents of the starting monomer of resin A and the derivative thereof, it now becomes possible to reduce the warp when the cured film is formed, to reduce the scum, and to obtain a uniform cured film, all in a particularly effective manner.

Now the derivative of the starting monomer means a compound whose functional group is replaced while leaving the basic skeleton unchanged, and therefore conceptionally excludes oligomer and polymer having the starting monomers polymerized therein.

In some preferred embodiments in this invention, resin A contains the repeating unit represented by Formula (2), and the component with a molecular weight of 1,000 or smaller contains at least one of the monomer represented by Formula (2-1) or the monomer represented by Formula (2-2); or, resin A contains the repeating unit represented by Formula (3), and the component with a molecular weight of 1,000 or smaller contains at least one of the monomer represented by Formula (3-1) or the monomer represented by Formula (3-2).

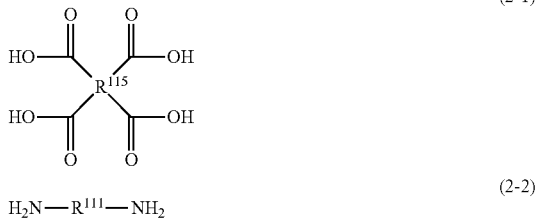

(2-1)

(2-2)

In Formula (2-1), $R^{115}$ represents a group same as that represented by $R^{115}$ in Formula (2).
In Formula (2-2), $R^{111}$ represents a group same as that represented by $R^{111}$ in Formula (2).

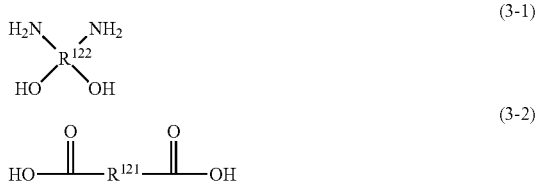

(3-1)

(3-2)

In Formula (3-1), $R^{122}$ represents a group same as that represented by $R^{122}$ in Formula (3).
In Formula (3-2), $R^{121}$ represents a group same as that represented by $R^{121}$ in Formula (3).

The total content of the starting monomer and the derivative thereof, contained in resin A, is preferably 0.001 to 0.45% by mass of resin A. The lower limit value of the total content is preferably 0.005% by mass or larger of resin A, and is more preferably 0.008% by mass or larger. The upper limit value of the total content is preferably 0.28% by mass or smaller, more preferably 0.15% by mass or smaller, even more preferably 0.10% by mass or smaller, and yet more preferably 0.03% by mass or smaller.

When resin A contains the repeating unit represented by Formula (2), and the component with a molecular weight of 1,000 or smaller contains the monomer represented by Formula (2-1), the content of the monomer represented by Formula (2-1) is preferably 0.45% by mass or less of resin A, which is more preferably 0.20% by mass or less, even more preferably 0.10% by mass or less, yet more preferably 0.04% by mass or less, and may be below detection limit.

Meanwhile, when resin A contains the repeating unit represented by Formula (2), and the component with a molecular weight of 1,000 or smaller contains the monomer represented by Formula (2-2), the content of the monomer represented by Formula (2-2) is preferably 0.45% by mass or less of resin A, which is more preferably 0.30% by mass or less, even more preferably 0.20% by mass or less, yet more preferably 0.10% by mass or less, furthermore preferably 0.06% by mass or less, and even may be 0.03% by mass less. The lower limit value of the content is preferably 0.005% by mass or larger.

When resin A contains the repeating unit represented by Formula (3), and the component with a molecular weight of 1,000 or smaller contains the monomer represented by Formula (3-1), the content of the monomer represented by Formula (3-1) is preferably 0.45% by mass or less of resin A, which is more preferably 0.20% by mass or less, even more preferably 0.10% by mass or less, yet more preferably 0.04% by mass or less, and may be below detection limit.

Meanwhile, when resin A contains the repeating unit represented by Formula (3), and the component with a molecular weight of 1,000 or smaller contains the monomer represented by Formula (3-2), the content of the monomer represented by Formula (3-2) is preferably 0.45% by mass or less of resin A, which is more preferably 0.30% by mass or less, even more preferably 0.20% by mass or less, yet more preferably 0.10% by mass or less, furthermore preferably 0.06% by mass or less, and may be 0.03% by mass or less. The lower limit value of the content is preferably 0.005% by mass or larger.

The contents of the starting monomer and the derivative thereof are determined according to a method described later in EXAMPLES.

Composition

Next, the composition of this invention will be detailed below.

A first composition of this invention specifically contains resin A.

A second composition of this invention specifically contains a resin selected from polyimide precursor, polyimide, polybenzoxazole precursor, and polybenzoxazole. The resin has a polymerizable group, wherein the total content of the starting monomer of the resin and the derivative thereof is 0.001 to 0.45% by mass relative to the amount of resin.

With such composition, it is now possible to obtain a composition capable of yielding a cured film with less warp and good uniformity, and of yielding a cured film (pattern) with less scum.

Details of resin A in the composition of this invention are synonymous to those of resin A described above, defined by the same preferable ranges. The resin selected from polyimide precursor, polyimide, polybenzoxazole precursor, and polybenzoxazole, in the composition of this invention, is synonymous to the above-described polyimide precursor, etc., defined by the same preferable ranges.

In the composition of this invention, the polyimide precursor, etc. preferably contains the repeating unit represented by Formula (2) or the repeating unit represented by Formula (3). Also, in the composition of this invention, the polyimide precursor, etc. preferably contains the repeating unit represented by Formula (2), and the component with a molecular weight of 1,000 or smaller contains at least one of the monomer represented by Formula (2-1) or the monomer represented by Formula (2-2); or, the polyimide precursor, etc. preferably contains the repeating unit represented by Formula (3), and the component with a molecular weight of 1,000 or smaller contains at least one of the monomer represented by Formula (3-1) or the monomer represented by Formula (3-2).

Types and amounts of the starting monomer of the polyimide precursor, etc., and the derivative thereof, are synonymous to the types and amounts of the starting monomer of resin A, and the derivative thereof, defined by the same preferable ranges.

The composition of this invention further has a water content in the composition of 2.0% by mass or less, more preferably 1.0% by mass or less, even more preferably 0.9% by mass or less, and particularly 0.8% by mass or less. With the water content controlled to 1.0% by mass or less, the warp may be suppressed more effectively. The lower limit value of the water content is not specifically limited, and may be 0% by mass.

The water content is determined by a method described later in EXAMPLES.

The composition of this invention further preferably has the total content of metal atoms in the composition of 32 ppm by mass or less, which is more preferably 27 ppm by mass or less, even more preferably 15 ppm by mass or less, yet more preferably 8 ppm by mass or less, and furthermore preferably 6 ppm by mass or less. With the content controlled to 32 ppm by mass or less, the warp may be suppressed effectively. The lower limit value of the content of metal atoms is not specifically limited, and may be 0 ppm by mass. The metal atoms include Na, K, Ca, Fe, Cu, Mg, Mn, Al, Li, Ni, Cr, Sn and Zn.

The total content of Na, K, Ca, Fe, Cu, Mg, Mn, Al, Li, Ni, Cr, Sn and Zn is determined according to a method described later in EXAMPLES.

The composition of this invention may contain only one species, or two or more species selected from polyimide precursor, polyimide, polybenzoxazole precursor and polybenzoxazole. Also two or more species of resins in the same category but having different structures, such as two species of polyimide precursors, may be contained.

In the composition of this invention, the content of polyimide precursor, etc. is preferably 20 to 100% by mass relative to the total solid content of the composition, which is more preferably 50 to 99% by mass, even more preferably 70 to 98% by mass, and particularly 80 to 95% by mass.

Next paragraphs will describe the components possibly contained in the composition of this invention. This invention may contain any components other than those described below, and of course, these components are not essential.

The composition of this invention may suitably be blended with other components depending on applications and so forth.

The composition of this invention preferably contains a photo-polymerization initiator. The photosensitive resin composition of this invention is suitably used as a negative photosensitive resin composition. When used as the negative photosensitive resin composition, it may contain a polymerizable compound. The polymerizable compound preferably contains a compound having an ethylenic unsaturated bond. It may further contain a thermal polymerization initiator, corrosion inhibitor, thermal base generator, or polymerization inhibitor.

The photosensitive resin composition of this invention may alternatively be a positive photosensitive resin composition. In particular, when given as a positive photosensitive resin composition, the composition preferably contains the polybenzoxazole precursor as the polyimide precursor, etc. Also when used as the positive photosensitive resin composition, the composition may contain a polymerizable compound.

<Photo-Polymerization Initiator>

The composition of this invention may contain a photo-polymerization initiator. In particular, with the photo radical polymerization initiator contained therein, the composition after applied on a semiconductor wafer and formed into a layer, and irradiated by light, can cure with the aid of radical, and can reduce the solubility in the photo-irradiated area. Hence, for example by irradiating such composition layer with light through a photomask having a pattern for masking an electrode portion only, there will be an advantage of easily producing areas with different solubilities according to the electrode pattern.

The photo-polymerization initiator is not specifically limited, so long as it has an ability to initiate polymerization (crosslinking) of the polymerizable compound upon irradiation by light, and is suitably selectable from known photo-polymerization initiators. For example, those showing photosensitivity to light over the ultraviolet to visible light regions are preferable. Alternatively, also employable is an activator that causes some interaction with a photo-excited sensitizer to produce an active radical.

The photo-polymerization initiator preferably contains at least one species of compound having a molar absorption coefficient of approximately 50, within the range from approximately 300 to 800 nm (preferably from 330 to 500 nm). The molar absorption coefficient of the compound may be determined by using any known method. More specifically, it is preferably measured using, for example, a UV-visible spectrophotometer (Cary-5 spectrophotometer, from Varian Associates), in ethyl acetate as a solvent, at a concentration of 0.01 g/L.

The photo-polymerization initiator may be any of known ones without special limitation. Examples include halogenated hydrocarbon derivative (e.g. those having a triazine skeleton, those having an oxadiazole skeleton, and those having a trihalomethyl group), acylphosphine compound such as acylphosphine oxide, hexaarylbiimidazole, oxime compound such as oxime derivatives, organic peroxide, thio compound, ketone compound, aromatic onium salt, ketoxime ether, aminoacetophenone compound, hydroxyacetophenone, azo-based compound, azide compound, metallocene compound, organoboron compound, and iron-arene complex.

The halogenated hydrocarbon derivative having a triazine skeleton is exemplified by compounds described by Wakabayashi et al., *Bull. Chem. Soc. Japan,* 42, 2924 (1969); compounds described in British Patent No. 1388492; compounds described in JP-A-S53-133428; compounds described in German Patent No. 3337024; compounds described by F. C. Schaefer et al., *J. Org. Chem.,* 29, 1527 (1964); compounds described in JP-A-S62-58241; compounds described in JP-A-H05-281728; compound described in JP-A-H05-34920, and compounds described in U.S. Pat. No. 4,212,976.

The compounds described in U.S. Pat. No. 4,212,976 are exemplified by those having an oxadiazole skeleton (e.g. 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(4-n-butoxystyryl)-1,3,4-oxadiazole, and 2-tribromomethyl-5-styryl-1,3,4-oxadiazole).

Photo-polymerization initiators other than those described above include compounds described in paragraph [0086] of JP-A-2015-087611, and compounds described in JP-A-S53-133428, JP-B2-S57-1819, ditto 57-6096, and U.S. Pat. No. 3,615,455, the contents of which are incorporated into this specification.

The ketone compound is exemplified by compounds described in paragraph [0087] of JP-A-2015-087611, the contents of which are incorporated into this specification.

Among commercially available products, also Kayacure DETX (from Nippon Kayaku Co., Ltd.) is preferably used.

For the photo-polymerization initiator, employable are hydroxyacetophenone compound, aminoacetophenone compound, and acylphosphine compound. More specifically, also aminoacetophenone-based initiator described in JP-A-

H10-291969, and acylphosphine oxide-based initiator described in JP-B2-4225898 may be used.

For the hydroxyacetophenone-based initiator, employable are Irgacure-184 (Irgacure is a registered trademark), Darocur-1173, Irgacure-500, Irgacure-2959 and Irgacure-127 (trade names: all from BASF SE).

For the aminoacetophenone-based initiator, employable are commercially available Irgacure-907, Irgacure-369, and Irgacure-379 (trade names: all from BASF SE).

For the aminoacetophenone-based initiator, also employable are compounds described in JP-A-2009-191179, whose maximum absorption wavelengths are matched to 365 nm or 405 nm.

The acylphosphine-based initiator is exemplified by 2,4,6-trimethylbenzoyl-diphenyl-phosphine oxide. Commercially available Irgacure-819 and Irgacure-TPO (trade name: both from BASF SE) are usable.

The photo-polymerization initiator is more preferably exemplified by oxime compound. Specific examples of the oxime compound include compounds described in JP-A-2001-233842, compounds described in JP-A-2000-80068, and compounds described in JP-A-2006-342166.

Preferable oxime compounds include the compounds below, as well as 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluenesulfonyloxy)iminobutane-2-one, and 2-ethoxycarbonyloxyimino-1-phenylpropane-1-one.

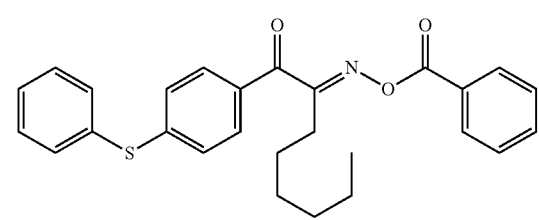

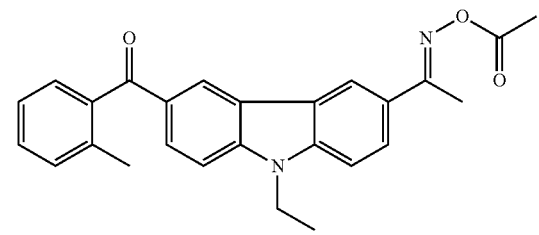

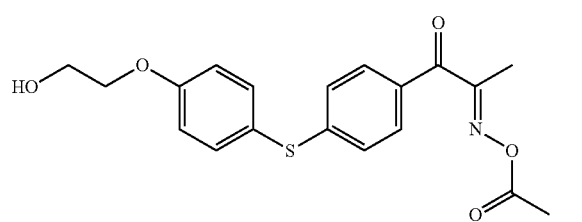

The oxime compound is exemplified by compounds described in literatures including *J. Chem. Soc.*, Perkin trans. II (1979) pp. 1653-1660, *J. Chem. Soc.*, Perkin trans. II (1979) pp. 156-162, and *Journal of Photopolymer Science and Technology* (1995) pp. 202-232; and, compounds described in patent publications including JP-A-2000-66385, JP-A-2000-80068, JP-A-2004-534797, and JP-A-2006-342166.

Among commercially available products, also Irgacure OXE-01 (from BASF SE), Irgacure OXE-02 (from BASF SE), and N-1919 (from ADEKA Corporation) are suitably used. Also TR-PBG-304 (from Changzhou Tronly New Electronic Materials Co., Ltd.), Adeka Arkls NCI-831 and Adeka Arkls NCI-930 (from ADEKA Corporation) are employable. Also TR-PBG-304 (from Changzhou Tronly New Electronic Materials Co., Ltd.), Adeka Arkls NCI-831 and Adeka Arkls NCI-930 (from ADEKA Corporation) are employable. Also DFI-091 (from Daito Chemix Co., Ltd.) is employable.

Other employable compounds includes those having oxime bound to the N-position of carbazole as described in JP-A-2009-519904; compounds having a hetero substituent introduced to the benzophenone moiety as described in U.S. Pat. No. 7,626,957; compounds having a nitro group introduced into the dye moiety, described in JP-A-2010-15025 and United States Unexamined Patent Application Publication No. 2009-292039; ketoxime compounds described in WO2009/131189; compounds having a triazine skeleton and an oxime skeleton in the same molecule, described in U.S. Pat. No. 7,556,910; and compounds highly sensitive to g-line sources with the maximum absorption at 405 nm, described in JP-A-2009-221114.

Also cyclic oxime compounds described in JP-A-2007-231000 and JP-A-2007-322744 are suitably used.

Among the cyclic oxime compounds condensed with a carbazole dye, those described in JP-A-2010-32985 and JP-A-2010-185072 are particularly preferable in view of their high Also compounds having an unsaturated bond at a specific moiety of oxime compound, described in JP-A-2009-242469, are suitably used.

Also fluorine-containing oxime compounds may be used. Examples of such oxime compounds include those described in JP-A-2010-262028; compounds 24, 36 to 40 described in paragraph [0345] of JP-A-2014-500852; and compound (C-3) described in paragraph [0101] of JP-A-2013-164471. Some specific examples are shown below.

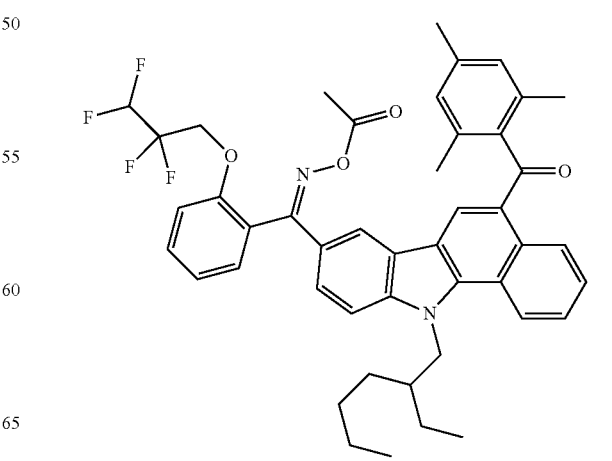

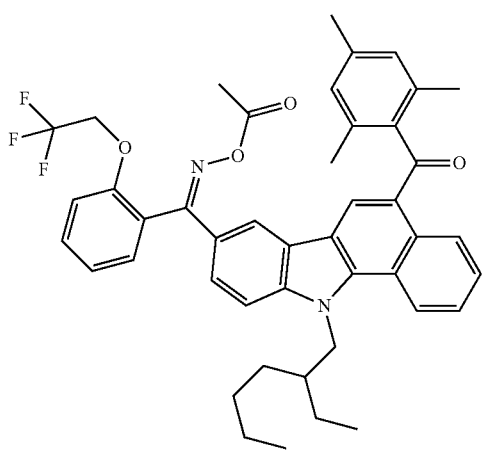

36

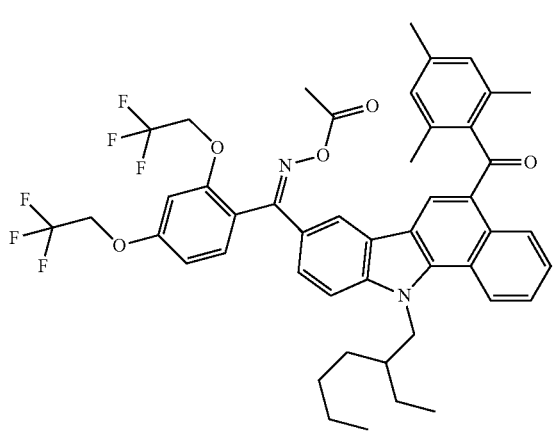

37

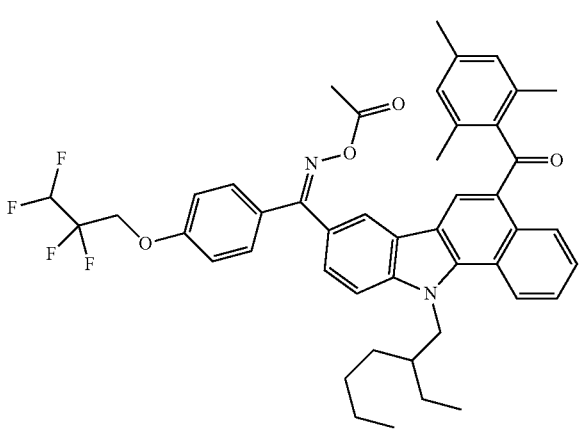

Most preferable oxime compounds are exemplified by those having specific substituents, described in JP-A-2007-269779; and oxime compounds having a thioaryl group, described in JP-A-2009-191061.

In view of exposure sensitivity, the photo-polymerization initiator is preferably selected from the group consisting of trihalomethyltriazine compound, benzyl dimethyl ketal compound, α-hydroxyketone compound, α-aminoketone compound, acylphosphine compound, phosphine oxide compound, metallocene compound, oxime compound, tri-arylimidazole dimer, onium compound, benzothiazole compound, benzophenone compound, acetophenone compound and derivatives thereof, cyclopentadiene-benzene-iron complex and salt thereof, halomethyloxadiazole compound, and 3-aryl-substituted coumarin compound.

More preferred examples include trihalomethyltriazine compound, α-aminoketone compound, acylphosphine compound, phosphine oxide compound, oxime compound, triaryl imidazole dimer, onium compound, benzophenone compound, and acetophenone compound; among which most preferable is at least one compound selected from the group consisting of trihalomethyltriazine compound, α-aminoketone compound, oxime compound, triarylimidazole dimer and benzophenone compound. Oxime compound is most preferably used.

The photo-polymerization initiators again employable herein include benzophenone; N,N'-tetraalkyl-4,4'-diaminobenzophenones such as N,N'-tetramethyl-4,4'-diaminobenzophenone (Michler's ketone); aromatic ketones such as 2-benzyl-2-dimethylamino-1-(4-morpholinophenyl)-butanone-1,2-methyl-1-[4-(methylthio)phenyl]-2-morpholino-propanone-1; quinones condensed with an aromatic ring such as alkylanthraquinone; benzoin ether compounds such as benzoin alkyl ether; benzoin compounds such as benzoin and alkylbenzoin; and benzyl derivatives such as benzyl dimethyl ketal. Also a compound represented by Formula (I) below is employable.

Formula (I)

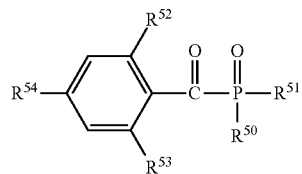

In Formula (I), $R^{50}$ represents an alkyl group having 1 to 20 carbon atoms; an alkyl group having 2 to 20 carbon atoms, discontinued by one or more oxygen atoms; alkoxy group having 1 to 12 carbon atoms; phenyl group; phenyl group substituted by at least one of alkyl group having 1 to 20 carbon atoms, alkoxy group having 1 to 12 carbon atoms, halogen atom, cyclopentyl group, cyclohexyl group, alkenyl group having 2 to 12 carbon atoms, alkyl group having 2 to 18 carbon atoms discontinued by one or more oxygen atoms, or alkyl group having 1 to 4 carbon atoms; or biphenylyl, $R^{51}$ represents a group represented by Formula (II) or a group same as $R^{50}$, and each of $R^{52}$ to $R^{54}$ independently represents an alkyl group having 1 to 12 carbon atoms, an alkoxy group having 1 to 12 carbon atoms, or a halogen atom.

Formula (II)

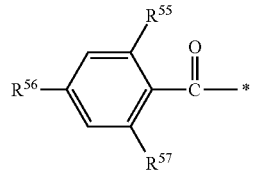

In the formula, $R^{55}$ to $R^{57}$ are same as $R^{52}$ to $R^{54}$ in Formula (I).

For the photo-polymerization initiator, also the compounds described in paragraphs [0048] to [0055] of WO2015/125469 may be used.

The content of the photo-polymerization initiator, when contained in the composition, is preferably 0.1 to 30% by mass of the total solid content of the composition, more preferably 0.1 to 20% by mass, and even more preferably 0.1 to 10% by mass.

Only a single species, or two or more species of the photo-polymerization initiator may be used. When two or more species of the photo-polymerization initiators are used, the total content preferably falls within the above-descried ranges.

<Polymerizable Compound>

The composition of this invention preferably contains a polymerizable compound. The polymerizable compound in this invention conceptionally excludes polyimide precursor or the like. With the polymerizable compound contained therein, the composition can form a cured film with improved heat resistance.

The polymerizable compound is a compound having a polymerizable group, for which any known compounds crosslinkable by a radical, acid or base may be used. The polymerizable group is exemplified by the polymerizable group having been described in relation to the polyimide precursor, etc. Ethylenic unsaturated bond is preferable.

The compounds having an ethylenic unsaturated bond, employable in this invention, are preferably those having two or more ethylenic unsaturated groups.

The polymerizable compound may have any chemical forms including monomer, prepolymer, oligomer, mixtures of them, and multimers of them.

In this invention, the monomer type polymerizable compound (also referred to as "polymerizable monomer", hereinafter) is a compound different from high molecular compound. The polymerizable monomer is typically a low molecular compound, preferably with a molecular weight of 2,000 or smaller, more preferably 1,500 or smaller, and even more preferably with a molecular weight of 900 or smaller. The molecular weight of the polymerizable monomer is typically 100 or larger.

The oligomer type polymerizable compound is typically a polymer with a relatively small molecular weight, and is preferably a polymer in which 10 to 100 polymerizable monomers are bound. The oligomer type polymerizable compound preferably has a weight-average molecular weight of 2,000 to 20,000, more preferably 2,000 to 15,000, and even more preferably 2,000 to 10,000.

The number of functional groups of the polymerizable compound in this invention means the number of polymerizable groups per molecule.

From the viewpoint of resolution, the polymerizable compound preferably contains at least one species of bi- or higher functional polymerizable compound having two or more polymerizable groups, and more preferably contains at least one species of tri- or higher functional polymerizable compound.

From the viewpoint of improving the heat resistance through formation of a three-dimensional crosslinked structure, the polymerizable compound in this invention also preferably contains at least one species of tri- or higher functional polymerizable compound. It may alternatively be a mixture of a bi- or lower functional polymerizable compound and a tri- or higher functional polymerizable compound.

<<Compound Having Ethylenic Unsaturated Bond>>

The group having an ethylenic unsaturated bond is preferably styryl group, vinyl group, (meth)acryloyl group or (meth)allyl group. (Meth)acryloyl group is more preferable.

The compound having an ethylenic unsaturated bond is exemplified by unsaturated carboxylic acid (e.g. acrylic acid, methacrylic acid, itaconic acid, crotonic acid, isocrotonic acid, maleic acid), esters and amides of these compounds, and multimers of these compounds. More preferred examples include esters formed between unsaturated carboxylic acid and polyhydric alcohol compound; amides formed between unsaturated carboxylic acid and multivalent amine compound; and multimers of these compounds. Other preferred examples include dehydration condensation product formed between unsaturated carboxylic acid esters or amides, having nucleophilic substituent such as hydroxy group, amino group, and mercapto group, with monofunctional or polyfunctional isocyanates or epoxy adducts, or with monofunctional or polyfunctional carboxylic acids. Other preferred example relates to adducts formed between unsaturated carboxylic acid esters or amides having electrophilic substituent such as isocyanate group or epoxy group, with monohydric or polyhydric alcohols, amines or thiols. Still other preferred example relates to substituted product formed between unsaturated carboxylic acid esters or amides having eliminable group such as halogen group and tosyloxy group, with monohydric or polyhydric alcohols, amines or thiols. As still other examples, also employable are a series of compounds in which the above-described unsaturated carboxylic acid is replaced by unsaturated phosphonic acid, vinylbenzene derivative such as styrene, vinyl ether, or allyl ether.

Specific examples of the ester formed between polyhydric alcohol compound and unsaturated carboxylic acid include acrylate esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, dipentaerythritol diacrylate, dipentaerythritol hexaacrylate, pentaerythritol tetraacrylate, sorbitol triacrylate, sorbitol tetraacrylate, sorbitol pentaacrylate, sorbitol hexaacrylate, tris(acryloyloxyethyl)isocyanurate, tris (ethylene oxide-modified acryl) isocyanurate, and polyester acrylate oligomer.

The methacrylate ester is exemplified by tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryl oxyethoxy)phenyl]dimethylmethane.

The itaconate ester is exemplified by ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

The crotonate ester is exemplified by ethylene glycol dicrotonate, tetramethylene glycol dicrotonate, pentaerythritol dicrotonate, and sorbitol tetradicrotonate.

The isocrotonate ester is exemplified by ethylene glycol diisocrotonate, pentaerythritol diisocrotonate, and sorbitol tetraisocrotonate.

The maleate ester is exemplified by ethylene glycol dimaleate, triethylene glycol dimaleate, pentaerythritol dimaleate, and sorbitol tetramaleate.

Compounds preferably used for the other esters also include aliphatic alcohol-based esters described in JP-B2-S46-27926, JP-B2-S51-47334 and JP-A-S57-196231; those having an aromatic skeleton described in JP-A-S59-5240, JP-A-S59-5241 and JP-A-H02-226149; and those containing an amino group described in JP-A-H01-165613.

Specific examples of the amide-based monomer formed between multivalent amine compound and unsaturated carboxylic acid include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide.

Other preferable amide-based monomers are exemplified by those having a cyclohexylene structure, described in JP-B2-S54-21726.

Also urethane-based addition-polymerizable monomers, obtainable by addition reaction between isocyanate and hydroxy group, are preferable. Specific examples include vinyl urethane compound having two or more polymerizable vinyl groups per molecule, which is obtained by subjecting a polyisocyanate compound having two or more isocyanate groups per molecule, described in JP-B2-S48-41708, to an addition reaction with a hydroxy group-containing vinyl monomer given by the formula below:

CH$_2$=C(R$^4$)COOCH$_2$CH(R$^5$)OH (where, each of R$^4$ and R$^5$ represents H or CH$_3$.)

Other preferred examples include urethane acrylates described in JP-A-S51-37193, JP-B2-H02-32293 and JP-B2-H02-16765; and urethane compounds having an ethylene oxide-based skeleton described in JP-B2-S58-49860, JP-B2-S56-17654, JP-B2-S62-39417 and JP-B2-S62-39418.

For the compound having ethylenic unsaturated bond, compounds described in paragraphs [0095] to [0108] of JP-A-2009-288705 are suitably used also in this invention.

For the compound having ethylenic unsaturated bond, also those having a boiling point of 100° C. or above under normal pressure are preferable. Examples of them include monofunctional acrylates and methacrylates such as polyethylene glycol mono(meth)acrylate, polypropylene glycol mono(meth)acrylate and phenoxy ethyl(meth)acrylate; compounds obtained by adding ethylene oxide or propylene oxide to polyhydric alcohol such as glycerin and trimethylolethane, and then by converting the products into (meth)acrylate, such as polyethylene glycol di(meth)acrylate, trimethylolethane tri(meth)acrylate, neopentyl glycol di(meth) acrylate, pentaerythritol tri(meth)acrylate, pentaerythritol tetra(meth)acrylate, dipentaerythritol penta(meth)acrylate, dipentaerythritol hexa(meth)acrylate, hexanediol (meth) acrylate, trimethylolpropanetri(acryloyloxypropyl) ether and tri(acryloyloxyethyl) isocyanurate; urethane (meth) acrylates described in JP-B2-S48-41708, JP-B2-S50-6034 and JP-A-S51-37193; polyester acrylates described in JP-A-S48-64183, JP-B2-S49-43191 and JP-B2-S52-30490; polyfunctional acrylates and methacrylates, such as epoxy acrylates produced by reaction between epoxy resin and (meth) acrylic acid; and mixtures of these compounds. Also compounds described in paragraphs [0254] to [0257] of JP-A-2008-292970 are preferable. Also exemplified are polyfunctional (meth)acrylates obtained by allowing polyfunctional carboxylic acid to react with a compound having a cyclic ether group and an ethylenic unsaturated group, such as glycidyl (meth)acrylate.

Other preferable compound having ethylenic unsaturated bond are exemplified by compound having a fluorene ring, and two or more ethylenic unsaturated bond-containing groups, and cardo resin, described in JP-A-2010-160418, JP-A-2010-129825 and JP-B2-4364216.

Still other examples include specific unsaturated compounds described in JP-B2-S46-43946, JP-B2-H01-40337 and JP-B2-H01-40336; and vinylphosphonic acid-based compounds described in JP-A-H02-25493. In some cases, a structure containing perfluoroalkyl group described in JP-A-S61-22048 is suitably used. Also those introduced as photopolymerizable monomers and oligomers in *Journal of the Adhesion Society of Japan*, Vol. 20, No. 7, pp. 300 to 308 (1984) are usable.

Besides those described above, also compounds having ethylenic unsaturated bond, represented by Formulae (MO-1) to (MO-5) below, are suitably used. Note that, when T in Formulae represents an oxyalkylene group, the carbon terminal combines to R.

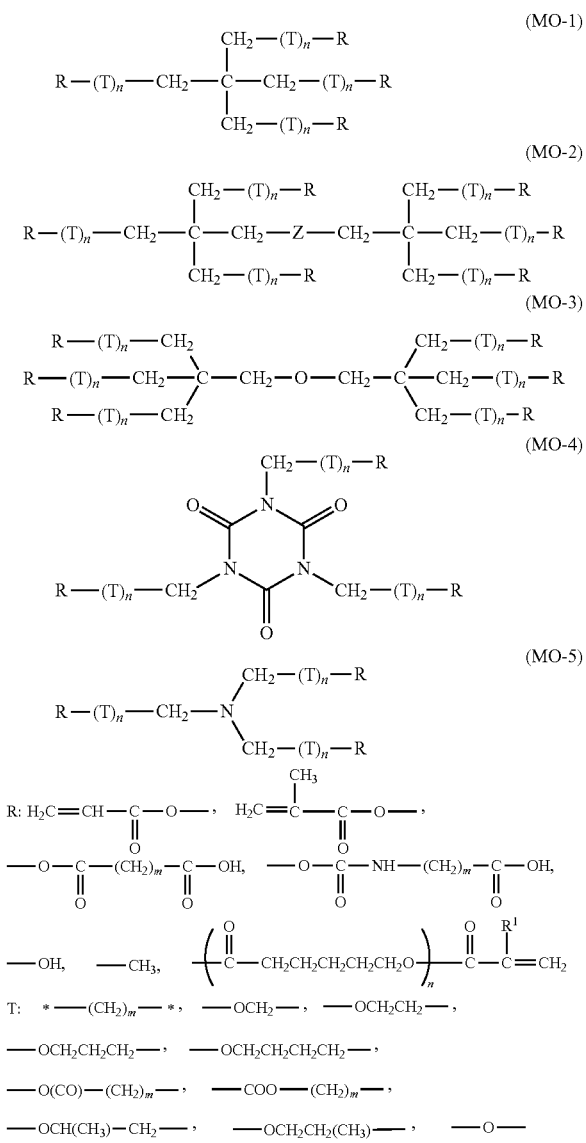

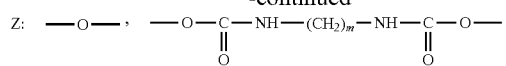

In the formulae, n represents an integer of 0 to 14, and m represents an integer of 0 to 8. A plurality of (R)s and (T)s contained within a molecule may be same or different.

In each of the polymerizable compounds represented by Formulae (MO-1) to (MO-5) above, at least one of a plurality of (R) s represents a group given by —OC(=O)CH=CH$_2$ or —OC(=O)C(CH$_3$)=CH$_2$.

For the compounds having ethylenic unsaturated bond, represented by Formulae (MO-1) to (MO-5) above, those described in paragraphs [0248] to [0251] of JP-A-2007-269779 are suitably used also in this invention.

Also compounds obtained by adding ethylene oxide or propylene oxide to polyhydric alcohol and then esterified into (meth)acrylate, which have been described in JP-A-H10-62986 under Formulae (1) and (2), together with specific examples thereof, are employable as the polymerizable compound.

Also compounds described in paragraphs [0104] to [0131] of JP-A-2015-187211 are employable, the content of which is incorporated into this specification. In particular, the compounds described in paragraphs [0128] to [0130] of the same publication are exemplified as the preferable embodiments.

The compound having ethylenic unsaturated bond is preferably dipentaerythritol triacrylate (commercially available as Kayarad D-330; from Nippon Kayaku Co., Ltd.), dipentaerythritol tetraacrylate (commercially available as Kayarad D-320; from Nippon Kayaku Co., Ltd.), dipentaerythritol penta(meth)acrylate (commercially available as Kayarad D-310; from Nippon Kayaku Co., Ltd.), dipentaerythritol hexa(meth)acrylate (commercially available as Kayarad DPHA; from Nippon Kayaku Co., Ltd.), and those having structures composed of their (meth)acryloyl groups bound while placing an ethylene glycol or propylene glycol residue in between. Also oligomers of these compounds may be used.

Also pentaerythritol derivative and/or dipentaerythritol derivative of the compounds represented by Formula (MO-1) and Formula (MO-2) are exemplified as preferred examples.

Commercially available polymerizable compounds are exemplified by tetrafunctional acrylate SR-494, having 4 ethylenoxy groups, from Sartomer Inc.; hexafunctional acrylate DPCA-60 having 6 pentylenoxy chains, and trifunctional acrylate TPA-330 having 3 isobutylenoxy chains, both from Nippon Kayaku Co., Ltd.; urethane oligomer UAS-10, UAB-140 (from Sanyo-Kokusaku Pulp Co., Ltd.); NK Ester M-40G, NK Ester 4G, NK Ester M-9300, NK Ester A-9300, UA-7200 (from Shin-Nakamura Chemical Co., Ltd.); DPHA-40H (from Nippon KayakuCo., Ltd.); UA-306H, UA-306T, UA-306I, AH-600, T-600, AI-600 (from Kyoeisha Chemical Co., Ltd.); and Blemmer PME400 (from NOF Corporation).

For the compound having ethylenic unsaturated bond, also preferable are urethane acrylates described in JP-B2-S48-41708, JP-A-S51-37193, JP-B2-H02-32293 and JP-B2-H02-16765; and urethane compounds having ethylene oxide-based skeleton, described in JP-B2-S58-49860, JP-B2-S56-17654, JP-B2-S62-39417 and JP-B2-S62-39418. Also addition-polymerizable monomers having amino structure or sulfido structure within the molecule, described in JP-A-S63-277653, JP-A-S63-260909 and JP-A-H01-105238, may be used as the polymerizable compound.

The compound having ethylenic unsaturated bond may be a polyfunctional monomer having acidic group such as carboxy group, sulfonic acid group or phosphoric acid group. The polyfunctional monomer having acidic group is preferably ester formed between aliphatic polyhydroxy compound and unsaturated carboxylic acid; more preferably polyfunctional monomer whose acidic group is produced by allowing unreacted hydroxy group of aliphatic polyhydroxy compound to react with non-aromatic carboxylic anhydride; and particularly such ester obtained by using pentaerythritol and/or dipentaerythritol as the aliphatic polyhydroxy compound. Commercially available products are exemplified by polybasic acid-modified acryloligomers M-510, M-520, from Toagosei Co., Ltd.

Only one species of the polyfunctional monomer having acidic group may be used independently, or two or more species thereof may be used as a mixture. If necessary, acidic group-free polyfunctional monomer and acidic group-containing polyfunctional monomer may be used in combination.

The polyfunctional monomer having acidic group preferably has an acid value of 0.1 to 40 mgKOH/g, which is more preferably 5 to 30 mgKOH/g. With the acid value of the polyfunctional monomer controlled within these ranges, the resin will have good productivity and handleability, and will excel in resolution. Also the polymerizability will be good.

Such polymerizable compounds having caprolactone structure have been marketed by Nippon Kayaku Co., Ltd. under the trade name of Kayarad DPCA Series, which are exemplified by DPCA-20 (m=1 in Formulae (C) to (E), number of groups represented by Formula (D)=2, all (R$^1$)s represent hydrogen atom); DPCA-30 (m=1 in the same Formulae, number of groups represented by Formula (D)=3, all (R$^1$)s represent hydrogen atom); DPCA-60 (m=1 in the same Formulae, number of groups represented by Formula (D)=6, all (R$^1$) s represent hydrogen atom); and DPCA-120 (m=2 in the same Formulae, number of groups represented by Formula (D)=6, all (R$^1$)s represent hydrogen atom).

In this invention, the compound having a caprolactone structure and an ethylenic unsaturated bond may be used independently, or two or more species thereof may be used as a mixture.

The content of the compound having ethylenic unsaturated bond in the composition is preferably 1 to 50% by mass relative to the total solid content of the composition, in view of achieving good polymerizability and high heat resistance. The lower limit is more preferably 5% by mass or above. The upper limit is more preferably 30% by mass or below. Only one species of the compound having ethylenic unsaturated bond may be used independently, or two or more species may be used in a mixed manner.

Ratio by mass of the polyimide precursor, etc. and the compound having ethylenic unsaturated bond (polyimide precursor, etc./polymerizable compound) is preferably 98/2 to 10/90, more preferably 95/5 to 30/70, and most preferably 90/10 to 50/50. With the ratio by mass of the polyimide precursor, etc. and the compound having ethylenic unsaturated bond controlled within these ranges, the cured film that further excels in polymerizability and heat resistance will be formed.

<<Compound Having Hydroxymethyl Group, Alkoxy Methyl Group or Acyloxymethyl Group>>

The compound having a hydroxymethyl group, alkoxy methyl group or acyloxymethyl group is preferably represented by Formula (AM1) below.

(AM1)

(In Formula, t represents an integer of 1 to 20, $R^4$ represents a t-valent organic group having 1 to 200 carbon atoms, and $R^5$ represents a group represented by Formula (AM2) or Formula (AM3) below.)

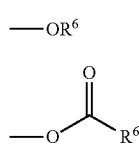

Formula (AM2)

Formula (AM3)

(In Formulae, $R^6$ represents a hydroxy group or an organic group having 1 to 10 carbon atoms.)

The content of the compound represented by Formula (AM1), per 100 parts by mass of the polyimide precursor, etc., is preferably 5 parts by mass or more, and 40 parts by mass or less. It is more preferably 10 parts by mass or more, and 35 parts by mass or less. It is also preferable that the content of the compound represented by Formula (AM4) below is 10% by mass or more and 90% by mass or less of the total polymerizable compound, and that the content of the compound represented by Formula (AM5) below is 10% by mass or more and 90% by mass or less of the total thermal crosslinking agent.

(AM4)

(In Formula, $R^4$ represents a divalent organic group having 1 to 200 carbon atoms, and $R^5$ represents a group represented by Formula (AM2) or Formula (AM3) below.)

(AM5)

(In Formula, u represents an integer of 3 to 8, $R^4$ represents a u-valent organic group having 1 to 200 carbon atoms, and $R^5$ represents a group represented by Formula (AM2) or Formula (AM3) below.)

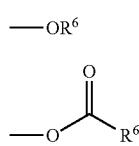

Formula (AM2)

Formula (AM3)

(In Formula, $R^6$ represents a hydroxy group or organic group having 1 to 10 carbon atoms.)

Within these ranges, the composition will be less likely to crack when cured on a substrate with irregular surface, will show good patternability, and will show high heat resistance featured by a 5% mass reduction temperature of 350° C. or above, and more preferably 380° C. or above. Specific examples of the compounds represented by Formula (AM4) include 46DMOC, 46DMOEP (trade names, both from Asahi Yukizai Corporation); DML-MBPC, DML-MBOC, DML-OCHP, DML-PCHP, DML-PC, DML-PTBP, DML-34X, DML-EP, DML-POP, dimethylol BisOC-P, DML-PFP, DML-PSBP, DML-MTrisPC (trade names, all from Honshu Chemical Industry Co., Ltd.); Nikalac MX-290 (trade name, from Sanwa Chemical Co., Ltd.); and 2,6-dimethoxymethyl-4-t-butylphenol, 2,6-dimethoxymethyl-p-cresol, and 2,6-diacetoxymethyl-p-cresol.

Specific examples of the compounds represented by Formula (AM5) include TriML-P, TriML-35XL, TML-HQ, TML-BP, TML-pp-BPF, TML-BPA, TMOM-BP, HML-TP-PHBA, HML-TPHAP, HMOM-TPPHBA, HMOM-TPHAP (trade names, all from Honshu Chemical Industry Co., Ltd.); TM-BIP-A (trade name, from Asahi Yukizai Corporation); and Nikalac MX-280, Nikalac MX-270, Nikalac MW-100LM (trade names, all from Sanwa Chemical Co., Ltd.).

<<Epoxy Compound (Compound Having Epoxy Group)>>

The epoxy compound preferably has two or more epoxy groups per molecule. The epoxy group can crosslink at 200° C. or below without accompanied by dehydration, so that the film thereof is less likely to shrink. Hence, by containing the epoxy compound, the composition will now be able to cure at lower temperatures and will effectively be suppressed from warping.

The epoxy compound preferably contains a polyethylene oxide group. This advantageously lowers the elastic modulus, and reduces the warp. The high flexibility also contributes to yield the cured film with good elongation. The polyethylene oxide group means a group having two or more ethylene oxide repeating units, where the number of repeating unit is preferably 2 to 15.

The epoxy compound is exemplified by, but not limited to, bisphenol A epoxy resin; bisphenol F epoxy resin; alkylene glycol epoxy resin such as propylene glycol diglycidyl ether; polyalkyleneglycol epoxy resin such as polypropylene glycol diglycidyl ether; and epoxy group-containing silicone such as polymethyl(glycidyloxypropyl)siloxane. Specific examples include Epiclon (registered trademark) 850-S, Epiclon (registered trademark) HP-4032, Epiclon (registered trademark) HP-7200, Epiclon (registered trademark) HP-820, Epiclon (registered trademark) HP-4700, Epiclon (registered trademark) EXA-4710, Epiclon (registered trademark) HP-4770, Epiclon (registered trademark) EXA-859CRP, Epiclon (registered trademark) EXA-1514, Epiclon (registered trademark) EXA-4880, Epiclon (registered trademark) EXA-4850-150, Epiclon EXA-4850-1000, Epiclon (registered trademark) EXA-4816, Epiclon (registered trademark) EXA-4822 (trade names, all from DIC Corporation); Rikaresin (registered trademark) BEO-60E (trade name, from New Japan Chemical Co., Ltd.); and EP-4003S, EP-4000S (trade names, both from ADEKA Corporation). Among them, epoxy resin containing polyethylene oxide group is preferable, in view of achieving low warpage and high heat resistance. Epiclon (registered trademark) EXA-4880, Epiclon (registered trademark) EXA-4822, and Rikaresin (registered trademark) BEO-60E, containing the polyethylene oxide group, are preferable.

The amount of blending of the epoxy compound, per 100 parts by mass of the polyimide precursor, etc., is preferably 5 to 50 parts by mass, more preferably 10 to 50 parts by mass, and even more preferably 10 to 40 parts by mass. With the amount of blending controlled to 5 parts by mass or more, the cured film will be prevented from warping, meanwhile with the amount controlled to 50 parts by mass or less, the resin when cured is prevented from reflowing and from burying the pattern.

<<Oxetane Compound (Compound Having Oxetanyl Group)>>

The oxetane compound is exemplified by compound having two or more oxetane rings per molecule, 3-ethyl-3-hydroxymethyloxetane, 1,4-bis{[(3-ethyl-3-oxetanyl)

methoxy]methyl}benzene, 3-ethyl-3-(2-ethylhexyl methyl) oxetane, and bis[(3-ethyl-3-oxetanyl)methyl]1,4-benzenedicarboxylate. As a specific example, Aron Oxetane Series (e.g. OXT-121, OXT-221, OXT-191, OXT-223) from Toagosei Co., Ltd. is suitably used. Only a single species of them may be used independently, or two or more species may be used in combination.

The amount of blending of the oxetane compound is preferably 5 to 50 parts by mass, per 100 parts by mass of the polyimide precursor, etc., which is more preferably 10 to 50 parts by mass, and even more preferably 10 to 40 parts by mass.

<<Benzoxazine Compound (Compound Having Benzooxazolyl Group)>>

The benzoxazine compound is preferred since it can crosslink based on ring-opening addition reaction without causing degassing when cured, and since it is suppressed from warping by virtue of its small thermal shrinkage.

Preferred examples of the benzoxazine compound include B-a-type benzoxazine, B-m-type benzoxazine (trade names, all from Shikoku Chemicals Corporation), benzoxazine adduct of polyhydroxystyrene resin, and phenol novolac-type dihydrobenzoxazine compound. Only a single species of them may be used independently, or two or more species may be used in combination.

The amount of blending of the benzoxazine compound is preferably 5 to 50 parts by mass per 100 parts by mass of the polyimide precursor, etc., more preferably 10 to 50 parts by mass, and even more preferably 10 to 40 parts by mass.

<Resin Containing Phenolic OH Group>

When the composition of this invention is an alkali-developable positive composition, it preferably contains a phenolic OH group-containing resin, in view of controlling the solubility in the alkaline developing solution, and achieving good sensitivity.

The phenolic OH group-containing resin is preferably novolac resin, and polyhydroxystyrene resin.

<<Novolac Resin>>

The novolac resin is obtained by polycondensation of phenols and aldehydes, according to any of known methods. Two or more species of novolac resins may be combined.

Preferred examples of the phenols include phenol, o-cresol, m-cresol, p-cresol, 2,3-xylenol, 2,5-xylenol, 3,4-xylenol, 3,5-xylenol, 2,3,5-trimethylphenol and 3,4,5-trimethylphenol. In particular, phenol, m-cresol, p-cresol, 2,3-xylenol, 2,5-xylenol, 3,4-xylenol, and 3,5-xylenol and 2,3,5-trimethylphenol are preferable. Two or more species of the phenols may be combined. m-Cresol is preferable from the viewpoint of solubility into the alkaline developing solution, wherein combination of m-cresol and p-cresol is also preferable. That is, the novolac resin preferably contains cresol novolac resin that contains m-cresol residue, or, contains m-cresol residue and p-cresol residue. In this case, the molar ratio of m-cresol residue and p-cresol residue in the cresol novolac resin (m-cresol residue/p-cresol residue, m/p) is preferably 1.8 or larger. Within the range, the composition shows a proper solubility to alkaline developing solution, and thus achieves good sensitivity. The ratio is more preferably 4 or larger.

Preferred examples of the aldehydes include formalin, paraformaldehyde, acetaldehyde, benzaldehyde, hydroxybenzaldehyde, and chloroacetaldehyde. Two or more of these aldehydes may be used.

Fully aromatic novolac resin, obtainable by polycondensing a compound represented by Formula (Phe) below as one of the phenols, with a compound represented by Formula (Ald) as one of the aldehydes, in the presence of an acid catalyst, is preferable, since the resultant composition of this invention will make a cured film highly heat resistant.

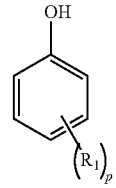

Formula (Phe)

In Formula (Phe), $R_1$ represents an organic group selected from alkyl group and alkoxy group having 1 or more and 20 or less carbon atoms, p represents an integer of 1 to 3, and preferably an integer of 2 to 3.

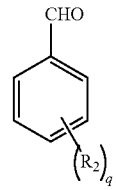

Formula (Ald)

In Formula (Ald), $R_2$ is selected from hydrogen atom, alkyl group and alkoxy group, having 1 to 20 carbon atoms, and hydroxy group; and q represents an integer of 0 or larger and 3 or smaller.

The phenol compound represented by Formula (Phe) used in this invention has 1 to 3, and more preferably 2 to 3 substituents, wherein the substituent is an organic group selected from alkyl group and alkoxy group having 1 to 20 carbon atoms. The alkyl group and alkoxy group having 1 to 20 carbon atoms are specifically exemplified by methyl group, ethyl group, propyl group, methoxy group, and ethoxy group. Such phenol compounds that will be used preferably include o-cresol, m-cresol, p-cresol, 2,3-dimethylphenol, 2,4-dimethylphenol, 2,5-dimethylphenol, 3,4-dimethylphenol, 3,5-dimethylphenol, 2-methyl-3-ethyl-phenol, 2-methyl-3-methoxyphenol, 2,3,4-trimethylphenol, 2,3,5-trimethylphenol, and 2,3,6-trimethylphenol. Among these compounds, any one selected from 2,3-dimethylphenol, 2,4-dimethylphenol, 2,5-dimethylphenol, 3,4-dimethylphenol, 3,5-dimethylphenol and 2,6-dimethylphenol is preferable, although not specifically limited. Only one species of these phenols may be used, of two or more species may be used in a mixed from.

Choice of a phenol compound having 1 to 3, preferably 2 to 3 substituents for such phenol compound will suppress the intramolecular rotation, and thereby a phenol resin with a sufficient level of heat resistant required for the composition may be obtained.

The aromatic aldehyde compound represented by Formula (Ald) employable here include non-substituted aromatic aldehyde compound and those having 3 or less substituents, wherein the substituent is selected from alkyl group and alkoxy group having 1 to 20 carbon atoms, and hydroxy group. Examples of the alkyl group and alkoxy group having 1 to 20 carbon atoms include methyl group, ethyl group, propyl group, methoxy group, and ethoxy group. Such aromatic aldehyde compounds employable are exemplified by, but not limited to, benzaldehyde, 2-methylbenzaldehyde, 3-methylbenzaldehyde, 4-methylbenzaldehyde, 2,3-dimethylbenzaldehyde, 2,4-dimethylbenzaldehyde, 2,5-dimethylbenzaldehyde, 2,6-dimethylbenzaldehyde, 3,4-dimethylbenzaldehyde, 3,5-dimethylbenzaldehyde, 2,3,4-trimethylbenzaldehyde, 2,3,5-trimethylbenzaldehyde, 2,3,6-trimethylbenzaldehyde, 2,4,5-trimethylbenzaldehyde, 2,4,6-trimethylbenzaldehyde, 3,4,5-trimethylbenzaldehyde, 4-ethylbenzaldehyde, 4-tert-butylbenzaldehyde, 4-isobutylbenzaldehyde, 4-methoxybenzaldehyde, salicylaldehyde, 3-hydroxybenzaldehyde, 4-hydroxybenzaldehyde, 3-methylsalicylaldehyde, 4-methylsalicylaldehyde, 2-hydroxy-5-methoxybenzaldehyde, 2,4-dihydroxybenzaldehyde, 2,5-dihydroxybenzaldehyde, and 2,3,4-trihydroxybenzaldehyde. Among them, the aromatic aldehyde compound whose $R_2$ in Formula (Ald) represents a hydrogen atom, methyl group or hydroxy group is preferable, and those selected from the aromatic aldehyde compounds enumerated below are more preferable. Only one species of these aldehydes may be used, or two or more species may be used in a mixed manner.

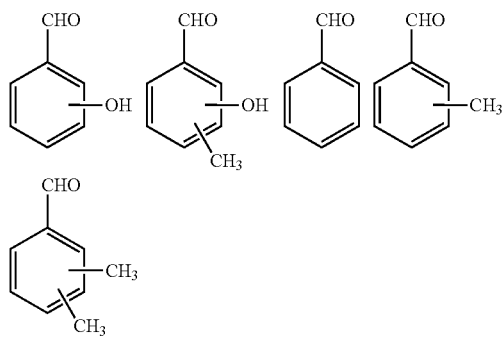

The weight-average molecular weight (Mw) is preferably 1,000 or larger, and more preferably 2,000 or larger, and also preferably 5,000 or smaller. Within these ranges, a good sensitivity will be obtained.

The content of the novolac resin is preferably 1 parts by mass or more and 70 parts by mass or less, per 100 parts by mass of the polyimide precursor, etc., and is more preferably 10 parts by mass or more and 70 parts by mass or less. Within these ranges, the composition will have a high sensitivity, and the pattern will therefore be obtained in a highly sensitive manner, which will not re-flow even after annealing at high temperatures. Only one species, or two or more species of novolac resins may be used. When two or more species are used, the total content preferably falls within the above-described range.

<<Polyhydroxystyrene Resin>>

Polyhydroxystyrene resin is a polymer containing hydroxystyrene and/or derivative thereof, and may even be a copolymer that contains the hydroxystyrene and/or derivative thereof, and other monomer, although not specifically limited. The monomer employable here is exemplified by ethylene, propylene, 1-butene, 2-methylpropene, styrene, and derivatives of them. Among them, a copolymer composed of hydroxystyrene and/or the derivative thereof, and a styrene and/or the derivative thereof are preferable, from the viewpoint of easiness of controlling the solubility into the aqueous alkaline solution. The above-described derivatives mean hydroxystyrene and styrene having an alkyl group, alkoxy group, hydroxy group and so forth substituted on the ortho-, meta- or para-position of their aromatic rings.

Hydroxystyrene in the hydroxystyrene resin may be any one of ortho-hydroxystyrene, meta-hydroxystyrene and para-hydroxystyrene. Two or more species of the hydroxystyrenes may be used in a mixed manner.

The constitution ratio of the hydroxystyrene and the derivative thereof in the hydroxystyrene resin is preferably 50% or above, more preferably 60% or above, meanwhile preferably 90% or below, and more preferably 80% or below. Within these ranges, the effect will be well balanced between reduction of post-exposure scum and enhanced sensitivity of the photo-exposed area.

Among them, a hydroxystyrene resin having a repeating unit represented by Formula (PHS-1) below is preferable.

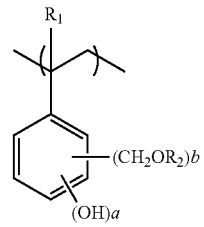

Formula (PHS-1)

In Formula (PHS-1), $R_1$ represents a hydrogen atom or an alkyl group having 1 to 5 carbon atoms, a represents 1 to 4, b represents 1 to 3, and a+b falls in the range from 1 to 5. $R_2$ represents an atom or group, selected from hydrogen atom, methyl group, ethyl group and propyl group.

The repeating unit represented by Formula (PHS-1) is obtained, for example, by polymerizing a single or two or more species selected from aromatic vinyl compounds having phenolic hydroxy group, such as p-hydroxystyrene, m-hydroxystyrene, o-hydroxystyrene, p-isopropenylphenol, m-isopropenylphenol, and o-isopropenylphenol, and, aromatic vinyl compounds such as styrene, o-methylstyrene, m-methylstyrene, and p-methylstyrene according to any of known methods to obtain a polymer or copolymer, and then by adding thereto an alkoxy group again according to any of known methods.

p-Hydroxystyrene and/or m-hydroxystyrene are suitably used as the aromatic vinyl compound having phenolic hydroxy group, and styrene is preferably used as the aromatic vinyl compound.

Among the hydroxystyrene resin having repeating unit represented by Formula (PHS-1) above, copolymers that contain structural units represented by Formula (PHS-2), Formula (PHS-3) and Formula (PHS-4) below are preferable, from the viewpoint of further improving the sensitivity, and adjusting the solubility into the alkaline developing solution. From the viewpoint of solubility into the alkaline developing solution, the constitution ratio of the structure represented by Formula (PHS-4) is preferably 50 mol % or below.

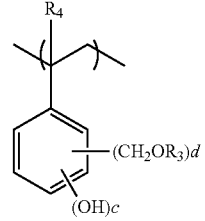

Formula (PHS-2)

In Formula (PHS-2), $R_5$ represents a hydrogen atom or an alkyl group having 1 to 5 carbon atoms, c represents 1 to 4, d represents 1 to 3, and c+d falls within the range from 2 to 5. $R_3$ represents a hydrogen atom, methyl group, ethyl group or propyl group.

Formula (PHS-3)

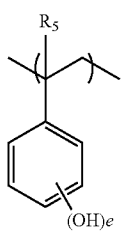

In Formula (PHS-3), $R_5$ represents a hydrogen atom or alkyl group having 1 to 5 carbon atoms, and e represents 1 to 5.

Formula (PHS-4)

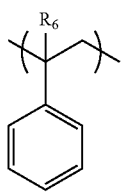

In Formula (PHS-4), $R_6$ represents a hydrogen atom or an alkyl group having 1 to 5 carbon atoms.

The hydroxystyrene resin preferably has a weight-average molecular weight (Mw) of 1,000 or larger, which is more preferably 2,000 or larger, particularly 2,500 or larger, meanwhile particularly 10,000 or smaller, more preferably 8,000 or smaller, and particularly 7,000 or smaller. Within these ranges, the effect will be well balanced between enhanced sensitivity and good shelf stability of varnish at normal temperature.

The content of the hydroxystyrene resin is preferably 1 parts by mass or more and 70 parts by mass or less per 100 parts by mass of the polyimide precursor, etc., which is more preferably 10 parts by mass or more and 70 parts by mass or less. Within these ranges, the composition will have a high sensitivity, and the pattern will therefore be obtained in a highly sensitive manner, which will not re-flow even after annealing at high temperatures. Only one species, or two or more species of hydroxystyrene resins may be used. When two or more species are used, the total content preferably falls within the above-described range.

<Thermal Base Generator>

The composition of this invention may also contain a thermal base generator.

The thermal base generator employed here preferably contains at least one species selected from an acidic compound, and, an ammonium salt that contains an anion with a pKa1 of 0 to 4, and an ammonium cation, both releasing a base when heated to 40° C. or above, although the species thereof is not specifically limited. Now, pKa1 is a logarithmic expression ($-\text{Log}_{10}\text{Ka}$) of primary proton dissociation constant (Ka) of polyvalent acid.

With such compound blended therein, the polyimide precursor will be cyclized at lower temperatures, and the composition will be made more stable. Since the thermal base generator will not release base unless it is heated, so that the polyimide precursor, when coexisted therewith, will be suppressed from cyclizing during storage, thereby improving the shelf life of polyimide precursor.

The thermal base generator in this invention includes at least one species selected from the acidic compound which releases a base when heated to 40° C. or above (A1), and, an ammonium salt (A2) that contains an anion with a pKa1 of 0 to 4, and an ammonium cation, Since each of the acidic compound (A1) and the ammonium salt (A2) can release a base when heated, so that the cyclization reaction of the polyimide precursor may be accelerated by the bases released from these compounds, allowing cyclization of the polyimide precursor to proceed at lower temperatures. Since these compounds do not release the base unless they are heated, so that they hardly allow the cyclization of the polyamide precursor to proceed if coexisted with the polyimide precursor that can cyclize to cure, making it possible to produce the polyimide precursor composition with high stability.

Now, in this specification, the acidic compound is interpreted as a compound whose pH is found to be smaller than 7, when 1 g of the compound is placed in a vessel, to which 50 ml of a mixed solution of deionized water and tetrahydrofuran (ratio by mass of water/tetrahydrofuran=1/4) is added, the mixture is stirred at one hour at room temperature, and pH of the mixture is measured at 20° C. using a pH meter.

In this invention, each of the acidic compound (A1) and the ammonium salt (A2) preferably has a base releasing temperature of 40° C. or above, which is more preferably 120 to 200° C. The upper limit of the base releasing temperature is preferably 190° C. or below, more preferably 180° C. or below, and even more preferably 165° C. or below. The lower limit of the base releasing temperature is more preferably 130° C. or above, and even more preferably 135° C. or above.

Each of the acidic compound (A1) and the ammonium salt (A2), whose base generating temperature is 120° C. or above, will hardly release a base during storage, and will therefore yield a polyimide precursor composition that excels in stability. Meanwhile, each of the acidic compound (A1) and the ammonium salt (A2), whose base generating temperature is 200° C. or below, will lower the cyclization temperature of the polyimide precursor. The base releasing temperature may be measured, for example, by differential scanning calorimetry, according to which the compound housed in a pressure-proof capsule is heated to 250° C. at 5° C./min, and the lowest temperature at which an exothermic peak appears is read and defined as the base releasing temperature.

In this invention, the base released from the thermal base generator is preferably secondary amine or tertiary amine, wherein tertiary amine is preferable. Tertiary amine, having high basicity by nature, can lower the cyclization temperature of the polyimide precursor. The base released from the thermal base generator preferably has a boiling point of 80° C. or higher, which is more preferably 100° C. or higher, and even more preferably 14° C. or higher. The thus released base preferably has a molecular weight of 80 to 2,000. The lower limit is preferably 100 or larger, and the upper limit is preferably 500 or smaller. The molecular weight herein is a theoretical value estimated from the structural formula.

In this invention, the acidic compound (A1) preferably contains at least one species selected from the ammonium salt and the compounds represented by Formula (10) described later.

In this invention, the ammonium salt (A2) is preferably an acidic compound. Note that the ammonium salt (A2) may be a compound that contains an acidic compound that releases a base when heated to 40° C. or above (preferably 120 to 200° C.), or may be a compound other than the acidic compound that can release a base when heated to 40° C. or above (preferably 120 to 200° C.).

<<Ammonium Salt>>

In this invention, ammonium salt means a salt formed between either of ammonium cations represented by Formula (101) or Formula (102) below, and an anion. The anion may be bound to a part of either ammonium cation via a covalent bond, or may be an external component of the ammonium cation, wherein it is preferably an external component of the ammonium cation. The phrase stating that "anion is an external component of the ammonium cation" means that the ammonium cation and the anion are not bound via a covalent bond. The anion, which is an external component of cation, will occasionally be referred to as counter anion.

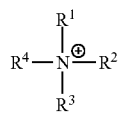

Formula (101)

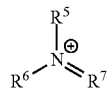

Formula (102)

In Formulae, each of $R^1$ to $R^6$ independently represents a hydrogen atom or hydrocarbon group, and $R^7$ represents a hydrocarbon group. Each pair of $R^1$ and $R^2$; $R^3$ and $R^4$; $R^5$ and $R^6$; and $R^5$ and $R^7$ may combine to form a ring.

The ammonium cation is preferably represented by any one of Formulae (Y1-1) to (Y1-5) below.

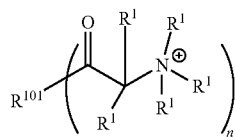

(Y1-1)

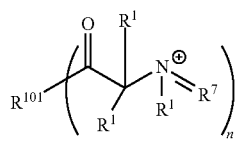

(Y1-2)

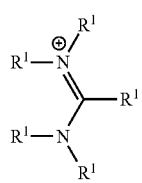

(Y1-3)

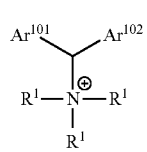

(Y1-4)

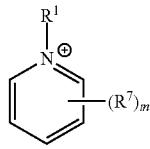

(Y1-5)

In Formulae, $R^{101}$ represents an n-valent organic group, and $R^1$ and $R^7$ are synonymous to those represented by Formula (101) or Formula (102).

Each of $Ar^{101}$ and $Ar^{102}$ independently represents an aryl group, n represents an integer of 1 or larger, and m represents an integer of 0 to 5.

In this invention, the ammonium salt preferably has an anion having a pKa1 of 0 to 4, and an ammonium cation. The upper limit of pKa1 is preferably 3.5 or below, and more preferably 3.2 or below. The lower limit is preferably 0.5 or above, and more preferably 1.0 or above. With pKa1 of anion controlled within these ranges, the polyimide precursor may be cyclized at lower temperatures, and the polyimide precursor composition may be more stabilized. If pKa1 is controlled to 4 or below, the thermal base generator will have an improved stability, will be prevented from releasing the base without heating, and will improve the stability of the polyimide precursor composition. If pKa1 is controlled to 0 or above, the released base will not easily be neutralized, letting cyclization of the polyimide precursor to proceed effectively.

The anion is preferably any one selected from carboxylate anion, phenolic anion, phosphate anion and sulfate anion. Carboxylate anion is more preferable, since it can balance stability and decomposability of the salt. That is, the ammonium salt is preferably a salt famed between an ammonium cation and a carboxylate anion.

The carboxylate anion is preferably a di- or higher valent of anion having two or more carboxy groups, and more preferably an anion of divalent acid. According to this embodiment, the thermal base generator can further improve stability, curability and developability of the polyimide precursor composition. In particular, by using the anion of divalent carboxylic acid, the polyimide precursor composition will have further improved stability, curability and developability.

In this invention, the carboxylate anion is preferably an anion of carboxylic acid having a pKa1 of 4 or smaller. pKa1 is more preferably 3.5 or smaller, and even more preferably 3.2 or smaller. According to the embodiment, the polyimide precursor composition will further be stabilized.

Now, pKa1 represents a logarithmic value of a reciprocal of a primary dissociation constant of acid, for which values described in "*Determination of Organic Structures by Physical Methods*" (written by Brown, H. C., McDaniel, D. H., Hafliger, O., Nachod, F. C.; edited by Braude, E. A., Nachod, F. C.; Academic Press, New York, 1955), and "Data for Biochemical Research" (written by Dawson, R. M. C. et al; Oxford, Clarendon Press, 1959) may be referred to. For compounds not described in these literatures, the value will be calculated using software ACD/pKa (from ACD/Labs) based on structural formulae.

In this invention, the carboxylate anion is preferably represented by Formula (X1) below.

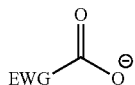

(X1)

In Formula (X1), EWG represents an electron withdrawing group.

In this invention, the electron withdrawing group means a group whose Hammett's substituent constant σm has a positive value. The constant σm is detailed in a review by Yuho Tsuno in *Journal of Synthetic Organic Chemistry*, Japan, Vol. 23, No. 8 (1965) pp. 631-642. The electron withdrawing group in this invention is not limited to the substituents described in the above-described literature.

Substituents having positive σm values are exemplified by $CF_3$ group (σm=0.43), $CF_3CO$ group (σm=0.63), HC≡C group (σm=0.21), $CH_2$=CH group (σm=0.06), Ac group (σm=0.38), MeOCO group (σm=0.37), MeCOCH=CH group (σm=0.21), and PhCO group (σm=0.34), $H_2NCOCH_2$ group (σm=0.06). Me represents a methyl group, Ac represents an acetyl group, and Ph represents a phenyl group.

In this invention, EWG preferably represents any of groups represented by Formulae (EWG-1) to (EWG-6) below.

[Chemical Formula 62]

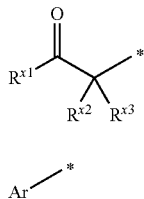

(EWG-1)

(EWG-2)

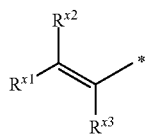

(EWG-3)

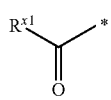

(EWG-4)

(EWG-5)

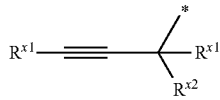

(EWG-6)

In Formulae, each of $R^{x1}$ to $R^{x3}$ independently represents a hydrogen atom, alkyl group, alkenyl group, aryl group, hydroxy group or carboxy group, and Ar represents an aromatic group.

In this invention, also a carboxylate anion represented by Formula (X) below is preferable.

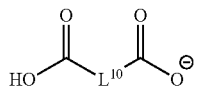

(X)

In Formula (X), $L^{10}$ represents a single bond, or, a divalent linking group selected from alkylene group, alkenylene group, arylene group, —$NR^X$—, and combinations of them, and Rx represents a hydrogen atom, alkyl group, alkenyl group or aryl group.

Specific examples of the carboxylate anion include maleate anion, phthalate anion, N-phenylimino diacetate anion and succinate anion, all of them suitably used.

The base generators preferably used in this invention will be described below.

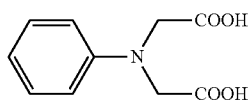

(A-1)

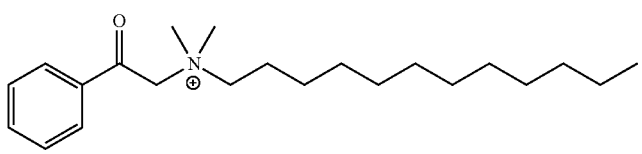

(A-2)

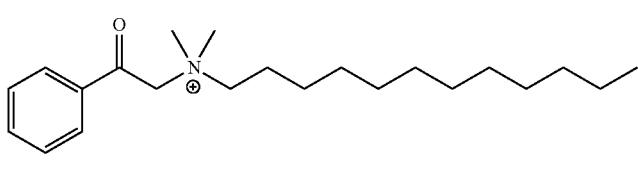

(A-3)

-continued
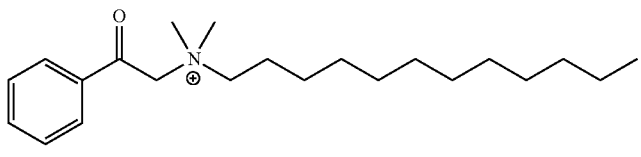 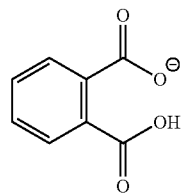
(A-4)
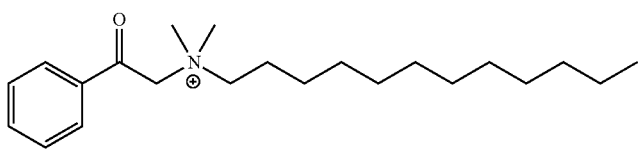 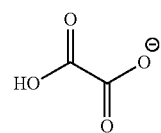
(A-5)
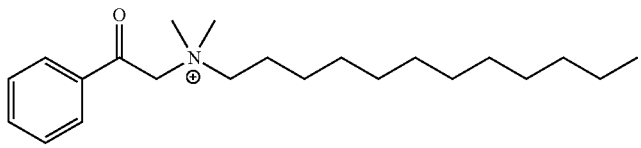 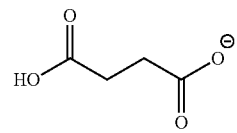
(A-6)
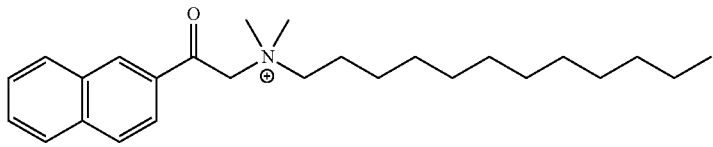 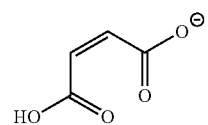
(A-7)
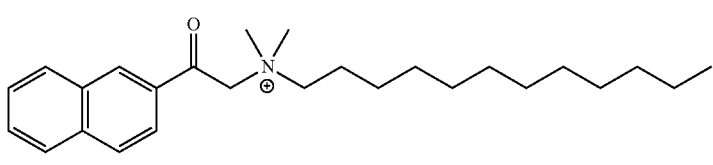 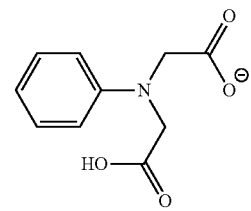
(A-8)
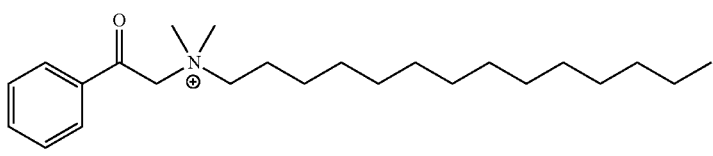 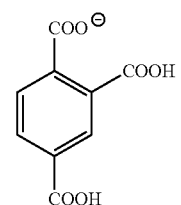
(A-9)
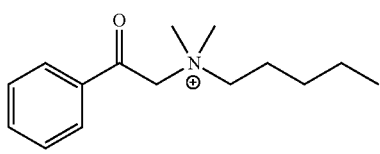 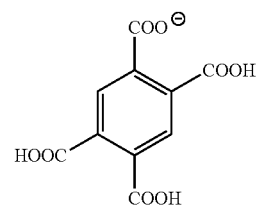
(A-10)
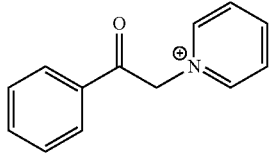 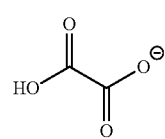
(A-11)
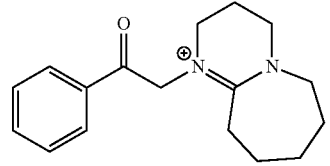 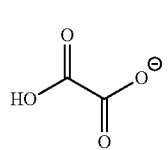
(A-12)

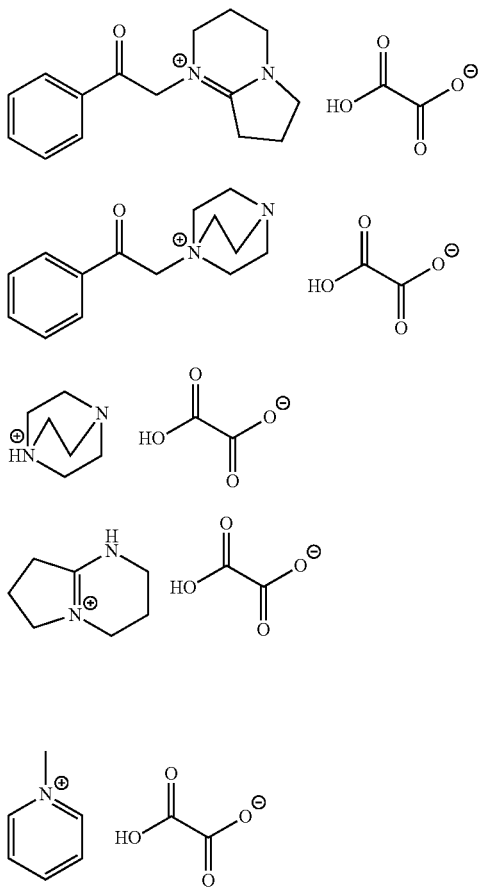

When the thermal base generator is used, the content of the thermal base generator in the composition is preferably 0.1 to 50% by mass, relative to the total solid content of the composition. The lower limit is preferably 0.5% by mass or above, and more preferably 1% by mass or above. Meanwhile, the upper limit is 30% by mass or below, and more preferably 20% by mass or below.

Only one species, or two or more species of the thermal base generators may be used. When two or more species are used, the total content preferably falls within the above-described ranges.

<Photo Base Generator>

The resin composition of this invention may contain a photo base generator. The photo base generator is a compound that can release a base upon irradiation by light, and is not specifically limited so long as it remains inactive under normal temperature and normal pressure, but can release a base (basic substance) once externally stimulated by photo-irradiation, that is, irradiation of electromagnetic wave and heating. Since the base released upon irradiation of light can act as a catalyst for curing the polyimide precursor under heating, so that it is suitable for the negative type composition.

The content of the photo base generator may be an ordinary level without special limitation, so long as a desired pattern may be formed. The content of photo base generator preferably falls in the range from 0.01 parts by mass or above, and below 30 parts by mass per 100 parts by mass or resin, more preferably within the range from 0.05 parts by mass to 25 parts by mass, and even more preferably from 0.1 parts by mass to 20 parts by mass.

Any known photo base generators are employable in this invention. As typically described by M. Shirai and M. Tsunooka, Prog. Polym. Sci., 21, 1(1996); Masahiro Tsunooka, Polymer Application, 46, 2(1997); C. Kutal, Coord. Chem. Rev., 211, 353(2001); Y. Kaneko, A. Sarker and D. Neckers, Chem. Mater., 11, 170 (1999); H. Tachi, M. Shirai and M. Tsunooka, J. Photopolym. Sci. Technol., 13, 153 (2000); M. Winkle and K. Graziano, J. Photopolym. Sci. Technol., 3, 419(1990); M. Tsunooka, H. Tachi and S. Yoshitaka, J. Photopolym. Sci. Technol., 9, 13(1996); K. Suyama, H. Araki and M. Shirai, J. Photopolym. Sci. Technol., 19, 81(2006), exemplified are ionic compounds whose base components are neutralized by forming a salt, such as transition metal complex compound, those having an ammonium salt structure or other structure, and those having the amidine moiety thereof combined with carboxylic acid to form a salt to thereby make themselves as latent catalysts; and, nonionic compounds whose base components are hidden in a latent form, through urethane bond or oxime bond of carbamate derivative, oxime ester derivative, and acyl compound.

The photo base generator employable in this invention may any of known ones without special limitation, which are exemplified by amide derivative, imide derivative, α-cobalt complexes, imidazole derivative, cinnamamide derivative, and oxime derivative.

The basic substance released from the photo base generator is exemplified by amino group-containing compounds, and particularly by monoamine, diamine or other polyamine, and amidine, without special limitation.

The thus released basic substance is preferably an amino group-containing compound having higher basicity. This is because the compound exerts a strong catalytic action typically in dehydration condensation reaction as found in imidation of the polyimide precursor, and can exert its catalytic action in the dehydration condensation at lower temperatures only with a small amount of consumption. In other words, owing to such large catalytic effect of the thus released basic substance, the negative photosensitive resin composition can elevate its apparent sensitivity.

From the viewpoint of this catalytic effect, amidine and aliphatic amine are preferable.

The photo base generator preferably contains no salt in its structure, and preferably has no electric charge on a nitrogen atom in the base moiety of the photo base generator. The photo base generator preferably has the base to be released in a latent form by using a covalent bond, whose base releasing mechanism is such that the covalent bond between the nitrogen atom of the base moiety to be released, and an adjoining atom is cleaved. With the photo base generator having no salt in its structure, the photo base generator may be given as a neutral one, resulting in higher solubility in solvent and improved pot life. For these reasons, the amine released from the photo base generator used in this invention is preferably any of primary amine or secondary amine.

Again from these reasons, the photo base generator preferably has the base to be released hidden in a latent form using a covalent bond, wherein the base to be released is preferably hidden in a latent form by using an amide bond, carbamate bond, or oxime bond.

The photo base generator in this invention is exemplified by photo base generators having a cinnamamide structure described in JP-A-2009-80452 and WO2009/123122, pamphlet; photo base generators having a carbamate structure described in JP-A-2006-189591 and JP-A-2008-247747; photo base generators having an oxime structure or a carbamoyl oxime structure described in JP-A-2007-249013 and JP-A-2008-003581. The photo base generators are, however not limited thereto, and for which any of those with known structures are applicable.

Other examples of the photo base generator include compounds described in paragraphs [0185] to [0188], [0199] to [0200] and [0202] of JP-A-2012-93746; compounds described in paragraphs [0022] to [0069] of JP-A-2013-194205; compound described in paragraphs [0026] to [0074] of JP-A-2013-204019; and compounds described in paragraph [0052] of WO2010/064631.

<Photo Acid Generator>

The composition of this invention may contain a photo acid generator. With the photo acid generator contained therein, the photo-exposed area will have an acid generated therein, and will have an increased solubility to the photo-exposed area, making the composition usable as a positive photosensitive resin composition.

The photo acid generator is exemplified by quinonediazide compound, sulfonium salt, phosphonium salt, diazonium salt, and iodonium salt. Among them, quinonediazide compound is preferably used, since it can express a high dissolution inhibiting effect, and can yield a positive composition with high sensitivity and low loss of film. Two or more species of the photo acid generator may be contained. This increases the ratio of dissolution rates of photo-exposed area and unexposed area, and makes the positive photosensitive resin composition highly sensitive.

The quinonediazide compound is exemplified by those having polyhydroxy compound bound with quinonediazidesulfonic acid through an ester bond; those having polyamino compound bound with quinonediazidesulfonic acid through a sulfonamide bond; and those having polyhydroxypolyamino compound bound with quinonediazidesulfonic acid through an ester bond and/or sulfonamide bond. With such quinonediazide compound, obtainable is a positive photosensitive resin composition sensitive to i-line (365 nm), h-line (405 nm) or g-line (436 nm) from ordinary UV mercury lamps. These polyhydroxy compound, the polyamino compound and the polyhydroxypolyamino compound preferably have two or more functional groups, per molecule, substituted by quinonediazide, but without needing that all functional groups are substituted by quinonediazide.

Exemplary compounds are shown below.

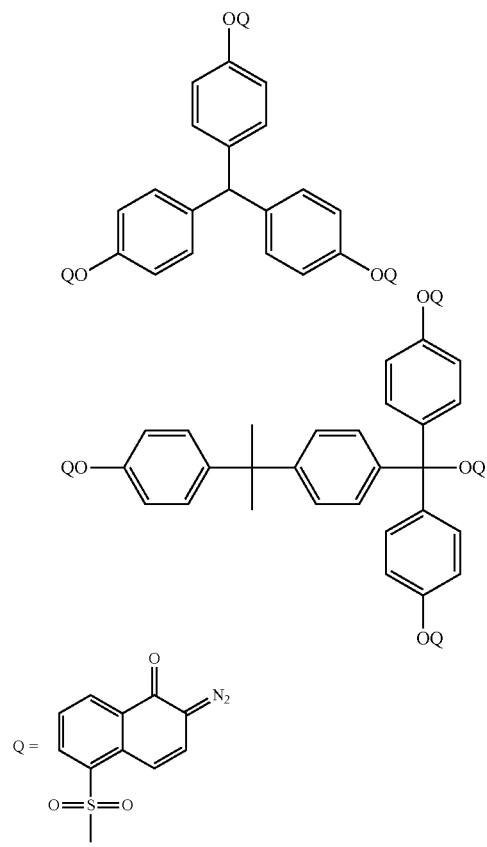

In these compounds, hydrogen atom may account for 1 to 10%, and further 4 to 6%, of total Q.

The polyhydroxy compound is exemplified by, but not limited to, BisZ, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylene tris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, HML-TPHAP (trade names, all from Honshu Chemical Industry Co., Ltd.); BIR-OC, BIP-PC, BIR-PC, BIR-PTBP, BIR-PCHP, BIP-BIOC—F, 4PC, BIR-BIPC-F, TEP-BIP-A, 46DMOC, 46DMOEP, TM-BIP-A (trade names, all from Asahi Yukizai Corporation); 2,6-dimethoxymethyl-4-t-butylphenol, 2,6-dimethoxymethyl-p-cresol, 2,6-diacetoxymethyl-p-cresol, naphthol, tetrahydroxybenzophenone, methyl gallate, bisphenol A, bisphenol E, methylene bisphenol, BisP-AP (trade name, from Honshu Chemical Industry Co., Ltd.); and novolac resin.

The polyamino compound is exemplified by, but not limited to, 1,4-phenylenediamine, 1,3-phenylenediamine, 4,4'-diaminodiphenyl ether, 4,4'-diaminodiphenylmethane, 4,4'-diaminodiphenylsulfone, and 4,4'-diaminodiphenylsulfide.

The polyhydroxypolyamino compound is exemplified by, but not limited to, 2,2-bis(3-amino-4-hydroxyphenyl)hexafluoropropane, and 3,3'-dihydroxybenzidine.

For the quinonediazide compound, both compounds having 5-naphthoquinonediazidesulfonyl group, and having 4-naphthoquinonediazidesulfonyl group, are suitably used. A compound having both of these groups within the molecule may be used, or compounds individually having different groups may be used in combination.

The quinonediazide compound may be produced, for example, by a method for allowing 5-naphthoquinonediazidesulfonyl chloride to react with phenol compound in the presence of triethylamine. The phenol compound may be synthesized, for example, by a method for allowing α-(hydroxyphenyl)styrene derivative to react with polyhydric phenol compound in the presence of acid catalyst.

The content of the photo acid generator is preferably 3 to 40 parts by mass, per 100 parts by mass of the polyimide precursor, etc. The content of photo acid generator controlled within this range will result in further sensitization. A sensitizer may further be contained if necessary.

Only one species, or two or more species of the photo acid generators may be used. When two or more species are used, the total content preferably falls within the above-described range.

<Thermal Acid Generator>

The composition of this invention may contain a thermal acid generator. The thermal acid generator that releases an acid upon being heated can express an effect of accelerating cyclization of the polyimide precursor, etc. to thereby improve mechanical characteristics of the cured film; and also an effect of accelerating crosslinking reaction of at least one compound selected from compounds having hydroxymethyl group, alkoxymethyl group or acyloxymethyl group, epoxy compound, oxetane compound and benzoxazine compound.

The thermal acid generator preferably has an initial thermal decomposition temperature of 50° C. to 270° C., which is more preferably 250° C. or below. In view of suppressing sensitivity from decreasing during development, it is advantageous to choose a species that does not release an acid during drying (prebaking at around 70 to 140° C.) of the composition applied on the substrate, but releases the acid during final annealing (curing at around 100 to 400° C.) of the composition after patterned by photo-irradiation and development.

The acid released from the thermal acid generator is preferably a strong acid. Preferred examples include arylsulfonic acids such as p-toluenesulfonic acid and benzenesulfonic acid; alkylsulfonic acids such as methanesulfonic acid, ethanesulfonic acid and butanesulfonic acid; and haloalkylsulfonic acids such as trifluoromethanesulfonic acid. Such thermal acid generator is exemplified by those described in paragraph [0055] of JP-A-2013-072935.

Among them, from the viewpoint of less residence in the cured film, and less risk of degrading physical properties of the cured film, more preferable examples of the thermal acid generator which generate alkylsulfonic acid having 1 to 4 carbon atoms or haloalkylsulfonic acid having 1 to 4 carbon atoms; which include methanesulfonic acid (4-hydroxyphenyl)dimethylsulfonium, methanesulfonic acid (4-((methoxycarbonyl)oxy)phenyl)dimethylsulfonium, methanesulfonic acid benzyl(4-hydroxyphenyl)methylsulfonium, methanesulfonic acid benzyl(4-((methoxycarbonyl)oxy)phenyl)methylsulfonium, methanesulfonic acid (4-hydroxyphenyl)methyl((2-methylphenyl)methyl)sulfonium, trifluoromethanesulfonic acid (4-hydroxyphenyl)dimethylsulfonium, trifluoromethanesulfonic acid (4-((methoxycarbonyl)oxy)phenyl)dimethylsulfonium, trifluoromethanesulfonic acid benzyl(4-hydroxyphenyl)methylsulfonium, trifluoromethanesulfonic acid benzyl(4-((methoxycarbonyl)oxy)phenyl)methylsulfonium, trifluoromethanesulfonic acid (4-hydroxyphenyl)methyl((2-methylphenyl)methyl)sulfonium, 3-(5-(((propylsulfonyl)oxy)imino)thiophene-2(5H)-ylidene)-2-(o-tolyl)propanenitrile, and 2,2-bis(3-(methanesulfonylamino)-4-hydroxyphenyl)hexafluoropropane.

Also compounds described in paragraph [0059] of JP-A-2013-167742 are preferable as the thermal acid generator.

The content of the thermal acid generator is preferably 0.01 parts by mass or more per 100 parts by mass of the polyimide precursor, etc., which is more preferably 0.1 parts by mass or more. With the content of 0.01 parts by mass or more, the cyclization of the polyimide precursor, etc. is accelerated, and thereby the cured film will have an improved mechanical characteristics and chemical resistance. From the viewpoint of electric insulation performance of the cured film, the content is preferably 20 parts by mass or less, more preferably 15 parts by mass or less, and even more preferably 10 parts by mass or less.

Only one species, or two or more species of the thermal acid generators may be used. When two or more species are used, the total content preferably falls within the above-described ranges.

<Thermal Polymerization Initiator>

The composition of this invention may also contain a thermal polymerization initiator (preferably, thermal radical polymerization initiator). For the thermal radical polymerization initiator, any known thermal radical polymerization initiators may be used.

Thermal radical polymerization initiator can release a radical under thermal energy, and can initiate or accelerate polymerization of the polymerizable compound. With the thus added thermal radical polymerization initiator, the polymerization of the polymerizable compound may be allowed to proceed, in the process of cyclization of the polyimide precursor, etc. When the polyimide precursor, etc. has an ethylenic unsaturated bond, such polyimide precursor, etc. can allow not only cyclization but also polymerization to proceed therein, which is advantageous for achieving higher heat resistance.

The thermal radical polymerization initiator is exemplified by aromatic ketones, onium salt compound, peroxide, thio compound, hexaarylbiimidazole compound, ketoxime ester compound, borate compound, azinium compound, metallocene compound, activated ester compound, compound having carbon-halogen bond, and azo-based compound. Among them, peroxide or azo-based compound are more preferable, and peroxide is particularly preferable.

The thermal radical polymerization initiator used in this invention preferably has a ten hour half-life temperature of 90 to 130° C., which is more preferably 100 to 120° C.

Specific examples of the compound are described in paragraphs [0074] to [0118] of JP-A-2008-63554.

Perbutyl Z and Percumyl D (from NOF Corporation) are suitable products that are commercially available.

The content of the thermal radical polymerization initiator, when contained in the composition, is preferably 0.1 to 50% by mass relative to the total solid content of the composition, which is more preferably 0.1 to 30% by mass, and particularly 0.1 to 20% by mass. The content of the thermal radical polymerization initiator per 100 parts by mass of the polymerizable compound is preferably 0.1 to 50 parts by mass, and more preferably 0.5 to 30 parts by mass. According to this embodiment, it will be more easy to form the cured film with improved heat resistance.

Only one species, or two or more species of the thermal radical polymerization initiators may be used. When two or more species of the thermal radical polymerization initiators are used, the total content preferably falls within the above described ranges.

<Corrosion Inhibitor>

It is preferable to add a corrosion inhibitor to the composition of this invention. The corrosion inhibitor is added to block ion from leaching out of metal interconnects. The compound is exemplified by corrosion inhibitors described in paragraph [0094] of JP-A-2013-15701; compounds described in paragraphs [0073] to [0076] of JP-A-2009-283711; compounds described in paragraph [0052] of JP-A-2011-59656; and compounds described in paragraphs [0114], [0116] and [0118] of JP-A-2012-194520. Among them, triazole ring-containing compound or tetrazole ring-containing compound are suitably used, wherein 1,2,4-triazole, 1,2,3-benzotriazole, 5-methyl-1H-benzotriazole, 1H-tetrazole, and 5-methyl-1H-tetrazole are more preferable, and 1H-tetrazole is most preferable.

The amount of mixing of corrosion inhibitor is preferably 0.1 to 10 parts by mass per 100 parts by mass of the polyimide precursor, etc., and more preferably 0.2 to 5 parts by mass.

Only one species, or two or more species of the corrosion inhibitors may be used. When two or more species are used, the total content preferably falls within the above-described ranges.

<Metal Adhesion Enhancer>

The composition of this invention preferably contains a metal adhesion enhancer, in expectation of improving adhesion to metal materials used for electrodes or interconnects. The metal adhesion enhancer is exemplified by sulfide-based compound described in paragraphs [0046] to [0049] of JP-A-2014-186186, and paragraphs [0032] to [0043] of JP-A-2013-072935. Also compounds below is exemplified as the metal adhesion enhancer.

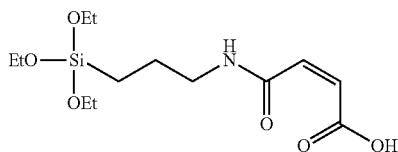 [SMILES: CCO[Si](CCCNC(=O)/C=C\C(=O)O)(OCC)OCC]

The amount of addition of the metal adhesion enhancer is preferably 0.1 to 30 parts by mass per 100 parts by mass of the polyimide precursor, etc., and more preferably 0.5 to 15 parts by mass. With the content controlled to 0.1 parts by mass or more, the heat-cured film will have an improved adhesion to metals, meanwhile with the content controlled to 30 parts by mass or less, the cured film will have improved mechanical characteristics.

Only one species, or two or more species of the metal adhesion enhancers may be used. When two or more species are used, the total content preferably falls within the above-described ranges.

<Silane Coupling Agent>

The composition of this invention preferably contains a silane coupling agent, in expectation of improving adhesion to the substrate. The silane coupling agent is exemplified by compounds described in paragraphs [0062] to [0073] of JP-A-2014-191002; compounds described in paragraphs [0063] to [0071] of WO2011/080992; compounds described in paragraphs [0060] to [0061] of JP-A-2014-191252; compounds described in paragraphs [0045] to [0052] of JP-A-2014-41264; and compounds described in paragraph [0055] of WO2014/097594. It is also preferable to use two or more different silane coupling agents as described in paragraphs [0050] to [0058] of JP-A-2011-128358.

The amount of blending of the silane coupling agent is preferably 0.1 to 20 parts by mass per 100 parts by mass of the polyimide precursor, etc., and more preferably 1 to 10 parts by mass. With the content controlled to 0.1 parts by mass or more, the composition will be given a sufficient level of adhesion to the substrate, meanwhile with the content controlled to 20 parts by mass or less, undesirable increase in viscosity during storage at room temperature will be suppressed more effectively.

Only one species, or two or more species of the silane coupling agents may be used. When two or more species are used, the total content preferably falls within the above-described ranges.

<Dissolution Accelerator>

The composition of this invention, when designed to be positive and to be developed with the alkaline developing solution, preferably contains a dissolution accelerator (a compound that enhances dissolution), in expectation of improving the sensitivity. The dissolution accelerator is exemplified by low-molecular phenols (e.g. BisZ, TekP-4HBPA, TrisP-HAP, TrisP-PA, BisRS-2P, BisRS-3P (trade names, all from Honshu Chemical Industry Co., Ltd.); BIR-PC, BIR-PTBP, BIR-BIPC-F (trade names, all from Asahi Yukizai Corporation); and phenols described in paragraphs [0056] to [0062] of JP-A-2013-1523811); and aryl sulfonamide derivatives (e.g. compounds described in paragraph [0058] of JP-A-2011-164454). Also sulfonamide derivatives described in paragraph [0062] of JP-A-2015-127817 may be used.

The amount of blending of the dissolution accelerator is preferably 0.1 to 20 parts by mass per 100 parts by mass of the polyimide precursor, etc., and more preferably 1 to 10 parts by mass.

Only one species, or two or more species of the dissolution accelerators may be used. When two or more species are used, the total content preferably falls within the above-described ranges.

<Dissolution Inhibitor>

The composition of this invention, when designed to be positive and to be developed with the alkaline developing solution, preferably contains a dissolution inhibitor (a compound that inhibits dissolution), in expectation of controlling solubility in the alkaline developing solution. Onium salt, diaryl compound and tetraalkylammonium salt are suitably used for this sort of compound. The onium salt is exemplified by iodonium salts such as diaryl iodonium salt; sulfonium salt such as triaryl sulfonium salt; phosphonium salts; and diazonium salts such as aryl diazonium salt. The diaryl compound is exemplified by compounds having two aryl groups are bound through a linking group, such as diarylurea, diarylsulfone, diarylketone, diaryl ether, diarylpropane, and diarylhexafluoropropane, wherein the aryl group is preferably phenyl group.

The tetraalkylammonium salt is exemplified by tetraalkylammonium halides, having a methyl group, ethyl group or the like for the alkyl group.

Among these compounds, those expressing good dissolution inhibiting effect are exemplified by diaryl iodonium salt, diarylurea compound, diarylsulfone compound, and tetramethylammonium halide compound. The diarylurea compound is exemplified by diphenylurea and dimethyldiphenylurea; meanwhile the tetramethylammonium halide compound is exemplified by tetramethylammonium chloride, tetramethylammonium bromide, and tetramethylammonium iodide.

In particular, a diaryliodonium salt compound represented by Formula (Inh) below is preferable.

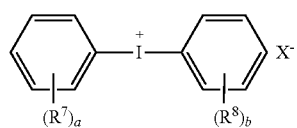

Formula (Inh)

(In Formula, $X^-$ represents a counter anion, each of $R^7$ and $R^8$ independently represents a monovalent organic group, and each of "a" and "b" independently represents an integer of 0 to 5.)

The anion $X^-$ is exemplified by nitrate ion, tetrafluoroborate ion, perchlorate ion, trifluoromethanesulfonate ion, p-toluenesulfonate ion, thiocyanate ion, chlorine ion, bromine ion, and iodine ion.

For the diaryliodonium salt, usable are diphenyliodonium nitrate, bis(p-tert-butylphenyl)iodonium nitrate, diphenyliodonium trifluoromethanesulfonate, bis(p-tert-butylphenyl)iodonium trifluoromethanesulfonate, diphenyliodonium bromide, diphenyliodonium chloride, and diphenyliodonium iodide.

Among them, diphenyliodonium nitrate, diphenyliodonium trifluoromethanesulfonate and diphenyliodonium-8-anilinonaphthalene-1-sulfonate are exemplified as those preferred for their strong effects.

The content of the dissolution inhibitor, when contained, is preferably 0.1 to 20 parts by mass per 100 parts by mass of the polyimide precursor, etc., from the viewpoint of sensitivity and allowance of development time, and is more preferably 0.1 to 15 parts by mass, and even more preferably 0.5 to 10 parts by mass.

Only one species, or two or more species of the dissolution inhibitors may be used. When two or more species are used, the total content preferably falls within the above-described ranges.

<Sensitizing Dye>

The composition of this invention may also contain a sensitizing dye. The sensitizing dye absorbs a specific active radiation ray to be brought up into an electronically excited state. The sensitizing dye, having been brought up into the electronically excited state, can interact with amine generator, thermal radical polymerization initiator or photo-polymerization initiator to cause electron transfer, energy transfer, heat generation and so forth. The amine generator, thermal radical polymerization initiator or photo-polymerization initiator will be chemically changed and decomposed, to thereby produce radical, acid, or base.

Preferred sensitizing dye is exemplified by those categorized as below, showing absorption within the wavelength range from 300 nm to 450 nm. Examples include polynuclear aromatic compounds (e.g. phenanthrene, anthracene, pyrene, perylene, triphenylene, 9,10-dialkoxy anthracene); xanthenes (e.g. fluorescein, eosin, erythrosin, rhodamine B, rose bengal); thioxanthones (e.g. 2,4-diethylthioxanthone); cyanines (e.g. thiacarbocyanine, oxacarbocyanine); merocyanines (e.g. merocyanine, carbomerocyanine); thiazines (e.g. thionine, methylene blue, toluidine blue); acridines (e.g. acridine orange, chloroflavin, acriflavine); anthraquinones (e.g. anthraquinone), squaryliumss (e.g. squarylium); coumarins (e.g. 7-diethylamino-4-methylcoumarin); stylylbenzenes; distylylbenzenes; and carbazoles.

Among them, combinations of polynuclear aromatic compounds (e.g. phenanthrene, anthracene, pyrene, perylene, triphenylene), thioxanthones, distylylbenzenes, stylylbenzenes are preferable in this invention, from the viewpoint of initiation efficiency, wherein use of compounds having an anthracene skeleton is more preferable. Particularly preferable compounds are specifically exemplified by 9,10-diethoxyanthracene, and 9,10-dibutoxyanthracene.

The content of the sensitizing dye, when contained in the composition, is preferably 0.01 to 20% by mass per 100 by mass of the total solid content of the composition, which is more preferably 0.1 to 15% by mass, and even more preferably 0.5 to 10% by mass. Only one species, or two or more species of the sensitizing dyes may be used.

<Chain Transfer Agent>

The composition of this invention may also contain a chain transfer agent. The chain transfer agent is defined, for example, in "Kobunshi Jiten" (in Japanese, Polymer Dictionary), 3rd Ed. (edited by the Society of Polymer Science, Japan, 2005), p. 683-684. For the chain transfer agent, employable are compounds having SH, PH, SiH, or GeH in the molecules thereof. These compounds can produce a radical through hydrogen donation to a less active radical species, or can produce a radical after oxidized and then deprotonated. In particular, thiol compound (e.g. 2-mercaptobenzimidazoles, 2-mercaptobenzthiazoles, 2-mercaptobenzoxazoles, 3-mercaptotriazoles, and 5-mercaptotetrazoles) are suitably used.

The content of the chain transfer agent, when contained in the composition, is preferably 0.01 to 20 parts by mass per 100 parts by mass of the total solid content of the composition, and is more preferably 1 to 10 parts by mass, and particularly 1 to 5 parts by mass.

Only one species, or two or more species of the chain transfer agents may be used. When there are two or more species of chain transfer agent, the total content preferably falls within the above-described ranges.

<Polymerization Inhibitor>

The composition of this invention may also include a polymerization inhibitor.

The polymerization inhibitors that are suitably employed include hydroquinone, p-methoxyphenol, di-tert-butyl-p-cresol, pyrogallol, p-tert-butylcatechol, benzoquinone, diphenyl-p-benzoquinone, 4,4'-thiobis(3-methyl-6-tert-butylphenol), 2,2'-methylenebis(4-methyl-6-tert-butylphenol), N-nitroso-N-phenylhydroxyamine aluminum salt, phenothiazine, N-nitrosodiphenylamine, N-phenylnaphthylamine, ethylenediamine tetraacetate, 1,2-cyclohexanediamine tetraacetate, glycol etherdiamine tetraacetate, 2,6-di-tert-butylp-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-(1-naphthyl)hydroxyamine ammonium salt, and bis(4-hydroxy-3,5-tert-butyl)phenylmethane. Also polymerization inhibitors described in paragraph [0060] of JP-A-2015-127817, and, compounds described in paragraphs [0031] to [0046] of WO2015/125469 are employable.

The content of the polymerization inhibitor, when contained in the composition, is preferably 0.01 to 5% by mass per relative to the total solid content of the composition.

Only one species, or two or more species of the polymerization inhibitors may be used. When there are two or more species of polymerization inhibitors, the total content preferably falls within the above-described ranges.

The composition of this invention may alternatively be designed to contain substantially no polymerization inhibitor, besides the polymerization inhibitor having been incorporated into the polyimide precursor, etc. Now the phrase stating that "contain substantially no . . . " means that the content is less than 0.01% by mass relative to the total solid content in the composition of this invention, more specifically less than 0.001% by mass, and particularly less than 0.0001% by mass.

<Surfactant>

A variety of surfactants may be added to the composition of this invention, in expectation of further improving the coatability. A variety of surfactants, including fluorine-containing surfactant, nonionic surfactant, cationic surfactant, anionic surfactant, and silicone-based surfactant, may be used.

In particular, by containing the fluorine-containing surfactant, the composition prepared in the form of coating liquid will have improved liquid characteristics (in particular, fluidity), and thereby uniformity of coating and liquid saving property may further be improved.

In the process of forming a film by using the coating liquid that contains the fluorine-containing surfactant, surface tension between the surface to be coated and the coating liquid will be reduced, wettability of the surface to be coated will be improved, and thereby coatability on the surface to be coated will be improved. This is advantageous in that a thin film of several micrometers thick, even when formed by using only a small amount of liquid, will have a uniform thickness with minimum irregularity.

Fluorine content ratio of the fluorine-containing surfactant is preferably 3 to 40% by mass, more preferably 5 to 30% by mass, and particularly 7 to 25% by mass. With the fluorine content ratio controlled within these ranges, the fluorine-containing surfactant will be advantageous in terms of uniformity of the coated film and liquid saving property, and will be well soluble into solvent.

The fluorine-containing surfactant is exemplified by Megaface F171, ditto F172, ditto F173, ditto F176, ditto F177, ditto F141, ditto F142, ditto F143, ditto F144, ditto R30, ditto F437, ditto F475, ditto F479, ditto F482, ditto F554, ditto F780, ditto F781 (all from DIC Corporation); Fluorad FC430, ditto FC431, ditto FC171 (all from Sumitomo 3M Ltd.); Surflon S-382, ditto SC-101, ditto SC-103, ditto SC-104, ditto SC-105, ditto SC1068, ditto SC-381, ditto SC-383, ditto S393, ditto KH-40 (all from Asahi Glass Co., Ltd.); and PF636, PF656, PF6320, PF6520, PF7002 (all from OMNOVA Solutions Inc.).

The fluorine-containing surfactant employed here may be a block polymer, which is specifically exemplified by compounds described in JP-A-2011-89090.

Also a compounds below is exemplified as the fluorine-containing surfactant employed in this invention.

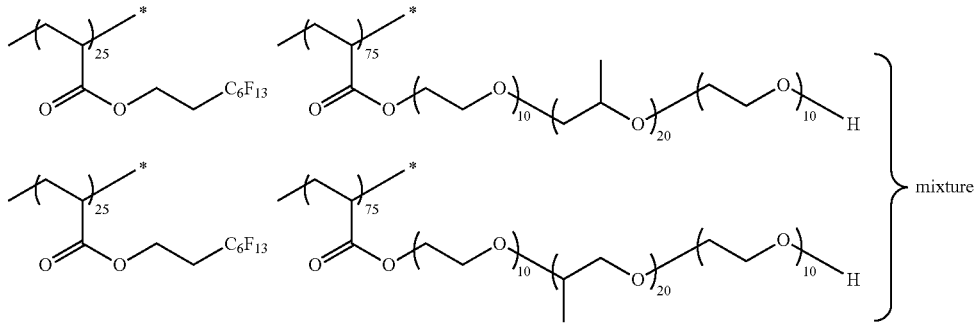

The compound shown above has a weight-average molecular weight of 14,000, for example.

The nonionic surfactant is specifically exemplified by glycerol, trimethylolpropane, trimethylolethane as well as ethoxylate and propoxylate of them (e.g. glycerol propoxylate, glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid ester (Pluronic L10, L31, L61, L62, 10R5, 17R2, 25R2, Tetronic 304, 701, 704, 901, 904, 150R1, from BASF SE), and Solsperse 20000 (Lubrizol Japan Ltd.). Also, Pionin D-6112-W from Takemoto Oil & Fat Co., Ltd., and NCW-101, NCW-1001, NCW-1002 from Wako Pure Chemical Industries, Ltd. are employable.

The cationic surfactant is specifically exemplified by phthalocyanine derivative (trade name: EFKA-745, from Morishita & Co., Ltd.), organiosiloxane polymer KP341 (from Shin-Etsu Chemical Co., Ltd.), (meth)acryllate-based (co)polymer Polyflow No. 75, No. 90, No. 95 (from Kyoeisha Chemical Co., Ltd.), and W001 (from Yusho Co., Ltd.).

The anionic surfactant is specifically exemplified by W004, W005, W017 (from Yusho Co., Ltd.).

The silicone-based surfactant is exemplified by "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA" and "Toray Silicone SH8400" from Dow Corning Toray Co., Ltd.; "TSF-4440", "TSF-4300", "TSF-4445", "TSF-4460" and "TSF-4452" from Momentive Performance Materials Inc.; "KP341", "KF6001" and "KF6002" from Shin-Etsu Silicone Co., Ltd.; and "BYK307", "BYK323", "BYK330" from BYK-Chemie GmbH.

The content of the surfactant, when contained in the composition, is preferably 0.001 to 2.0% by mass relative to the total solid content of the composition, which is more preferably 0.005 to 1.0% by mass.

Only one species, or two or more species of the surfactant may be used. When there are two or more species of surfactants, the total content preferably falls within the above-described ranges.

<Higher Fatty Acid Derivative, Etc.>

It is also preferable to add a higher fatty acid derivative such as behenic acid and behenic amide so as to segregate it to the surface of the composition during drying after being applied, in expectation of avoiding oxygen-mediated inhibition of polymerization.

The content of the higher fatty acid derivative, when contained in the composition, is preferably 0.1 to 10% by mass relative to the total solid content of the composition.

Only one species, or two or more species of the higher fatty acid derivatives may be used. When there are two or more species of higher fatty acid derivatives, the total content preferably falls within the above-described ranges.

<Solvent>

It is preferable to blend a solvent to the composition of this invention when intended to be coated to form a layer. Any of known solvents may be used without limitation, so long as it can make the composition in the form of layer.

Preferably exemplified are ester-based solvents that include ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, γ-butyrolactone, ε-caprolactone, δ-valerolactone, alkyl oxyacetate (e.g. methyl oxyacetate, ethyl oxyacetate, butyl alkyloxyacetate (e.g. methyl methoxyacetate, ethyl methoxyacetate, butyl methoxyacetate, methyl ethoxyacetate, ethylethoxyacetate)), alkyl 3-oxypropionate esters (e.g. methyl 3-oxypropionate, ethyl 3-oxypropionates (e.g. methyl 3-methoxypropionate, ethyl 3-methoxypropionate, methyl 3-ethoxypropionate, ethyl 3-ethoxypropionate, etc.)), alkyl 2-oxypropionate esters (e.g. methyl 2-oxypropionate, ethyl 2-oxypropionate, propyl 2-oxypropionate, etc. (e.g. methyl 2-methoxypropionate, ethyl 2-methoxypropionate, propyl 2-methoxypropionate, methyl 2-ethoxypropionate, ethyl 2-ethoxypropionate)), methyl 2-oxy-2-methylpropionates and ethyl 2-oxy-2-methylpropionates (e.g. methyl 2-methoxy-2-methylpropionate, ethyl 2-ethoxy-2-methylpropionate, etc.), methyl pyruvate, ethyl pyruvate, propyl pyruvate, methyl acetoacetate, ethyl acetoacetate, methyl 2-oxobutanoate, ethyl 2-oxobutanoate; ether-based solvents that include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether acetate, propylene glycol monoethyl ether acetate, propylene glycol monopropyl ether acetate, etc.; ketone-based solvents that include methyl ethyl ketone, cyclohexanone, cyclopentanone, 2-heptanone, 3-heptanone, N-methyl-2-pyrrolidone, etc.; aromatic hydrocarbon solvents that include toluene, xylene, anisole, limonene, etc.; and sulfoxide-based solvents that include dimethyl sulfoxide.

In one preferred embodiment, two or more species of solvents are mixed from the viewpoint of improving profile of the coated surface. Among others, preferable is a mixed solvent containing two or more species selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, γ-butyrolactone, dimethyl sulfoxide, ethylcarbitol acetate, butylcarbitol acetate, propylene glycol methyl ether, and propylene glycol methyl ether acetate. A combined use of dimethyl sulfoxide and γ-butyrolactone is particularly preferable.

The content of the solvent, when contained in the composition, is preferably controlled so that the solid component will have therein a total concentration of 5 to 80% by mass, from the viewpoint of coatability, which is more preferably 5 to 70% by mass, and particularly 10 to 60% by mass.

Only one species, or two or more species of the solvents may be used. When there are two or more species of solvents, the total content preferably falls within the above-described ranges.

Contents of N-methyl-2-pyrrolidone, N-ethyl-2-pyrrolidone, N,N-dimethylacetamide or N,N-dimethylformamide is preferably less than 5% by mass of the total mass of composition from the viewpoint of film strength, which is more preferably less than 1% by mass, even more preferably less than 0.5% by mass, and particularly less than 0.1% by mass.

<Other Additives>

The composition of this invention may optionally contain various additives, such as inorganic particle, curing agent, curing catalyst, filler, antioxidant, UV absorber, and antifloccurant, so long as the effect of this invention will not be degraded. The total content of these additives, when contained, is preferably 3% by mass or less of the solid content of composition.

The content of water in the composition of this invention is preferably less than 5% by mass, in view of profile of the coated surface, which is more preferably less than 1% by mass, and particularly less than 0.6% by mass.

The content of halogen atom in the composition of this invention is preferably less than 500 ppm by mass from the viewpoint of corrosion of interconnects, which is more preferably less than 300 ppm by mass, and particularly less than 200 ppm by mass. In particular, halogen in the form of ions preferably accounts for less than 5 ppm by mass, more preferably less than 1 ppm by mass, and particularly less than 0.5 ppm by mass. The halogen atom is exemplified by chlorine atom and bromine atom. The total content of chlorine atom and bromine atom, or the total content of chloride ion and bromide ion preferably falls within the above described ranges.

<Preparation of Composition>

The composition of this invention may be prepared by mixing the individual components descried above. Method for mixing may be any of known ones without special limitation.

For the purpose of removing foreign matters such as dust or particle in the composition, the composition is preferably filtered through a filter. Pore size of the filter is preferably 1 μm or smaller, more preferably 0.5 μm or smaller, and even more preferably 0.1 μm or smaller. The filter is preferably a polytetrafluoroethylene filter, polyethylene filter, or nylon filter. The filter may preliminarily be washed with the organic solvent. In the filtration process, two or more different types of filters may be used in a series connection or parallel connection. When a plurality of types of filters are used, those having different pore sizes and/or constituent materials may be combined. The individual materials may be filtered twice or more times, and such multiple filtration may take place in a recirculation filtration process. The filtration may take place under pressure, preferably at a pressure of 0.05 MPa or above and 0.3 MPa or below.

Impurities may be removed by using an adsorbent, in place of using the filter for filtration, or still alternatively, by using the filter for filtration and the adsorbent in combination. The adsorbent used here may be any of known ones including inorganic adsorbent such as silica gel and zeolite, and organic adsorbent such as activated carbon.

Next, the cured film of this invention and method for manufacturing the cured film, as well as a semiconductor device will be explained.

The cured film of this invention is obtained by curing the composition of this invention. A method for manufacturing a cured film of this invention includes applying the composition of this invention to a substrate, and curing the composition applied to the substrate. Applicable fields of the cured film of this invention include insulating film and redistribution insulating layer in semiconductor devices. In particular, it is preferably used for the redistribution insulating layer in three-dimensionally mounted devices, by virtue of its high resolution. That is, this invention also discloses a semiconductor device having the cured film of this invention.

The cured film of this invention may also be used for photoresist (galvanic resist), etching resist, and solder top resist in electronics.

The cured film of this invention may again also be used for manufacture of printing plates such as offset printing plate and screen printing plate, etching of molded article, and manufacture of protective lacquer and dielectric layer in electronics, and in particular, micro-electronics.

Next, an embodiment of the semiconductor device using the composition for the redistribution insulating layer will be explained.

A semiconductor device 100 illustrated in FIG. 1 is a so-called, three-dimensionally mounted device, in which a stack 101 composed of a plurality of semiconductor elements (semiconductor chips) 101a to 101d is disposed on a wiring board 120.

Although this embodiment will be explained mainly focusing on the case where four semiconductor elements (semiconductor chips) are stacked, the number of stacking of the semiconductor elements (semiconductor chips) may be two, eight, sixteen, thirty-two and so on, without special limitation. The number may alternatively be one.

Each of the plurality of semiconductor elements 101a to 101d is composed of a semiconductor wafer such as silicon substrate.

The topmost semiconductor element 101a has no through-electrode, and instead has electrode pads (not illustrated) on one surface thereof. The semiconductor elements 101b to 101d have through-electrodes 102b to 102d, respectively. Each semiconductor element has on both surfaces thereof interconnect pads (not illustrated) that are integrally provided with the through-electrodes.

The stack 101 has the semiconductor element 101a having no through-electrode, and semiconductor elements 101b to 101d respectively having the through-electrodes 102b to 102d, which are bonded by flip-chip bonding.

More specifically, the electrode pads of the semiconductor element 101a having no through-electrode are bonded, through metal bumps 103a such as solder bumps, to the interconnect pads, on the side faced to the semiconductor element 101a, of the juxtaposed semiconductor element 101b having the through-electrodes 102b; and, the interconnect pads on the other side of the semiconductor element 101b having the through-electrode 102b are bonded, through metal bumps 103b such as solder bumps, to the interconnect pads, on the side faced to the semiconductor element 101b, of the juxtaposed semiconductor element 101c having the through-electrodes 102c. In the same way, the inter connect pads on the other side of the semiconductor element 101c having the through-electrodes 102c are bonded, through metal bumps 103c such as solder bumps, to the interconnect pads, on the side faced to the semiconductor element 101c, of the juxtaposed semiconductor element 101d having the through-electrodes 102d.

Gaps between the every two adjacent semiconductor elements 101a to 101d have an underfill layer 110 formed therein, so that the individual semiconductor elements 101a to 101d are stacked while placing the underfill layer 110 in between.

The stack 101 is mounted on a wiring board 120.

The wiring board 120 employed here is typically a multilayer wiring board that uses an insulating substrate such as resin substrate, ceramic substrate and glass substrate as the base. The wiring board 120 using the resin substrate is exemplified by multilayer copper clad laminate (multilayer printed circuit board).

The wiring board 120 has a surface electrode 120a formed on one surface thereof.

Between the wiring board 120 and the stack 101, there is disposed an insulating layer 115 having a redistribution layer 105 formed therein. The wiring board 120 and the stack 101 are electrically connected through the redistribution layer 105. The insulating layer 115 is formed using the composition of this invention.

More specifically, one end of the redistribution layer 105 is connected, through metal bumps 103d such as solder bumps, to the electrode pads, on the side faced to the redistribution layer 105, of the semiconductor element 101d. Meanwhile, the other end of the redistribution layer 105 is connected, through metal bumps 103e such as solder bumps, to the surface electrodes 120a of the wiring board.

Between the insulating layer 115 and the stack 101, there is formed an underfill layer 110a. Meanwhile, between the insulating layer 115 and the wiring board 120, there is formed a underfill layer 110b.

Besides those described above, the cured film of this invention is widely applicable to various applications where polyimide and polybenzoxazole are employed.

Since polyimide and polybenzoxazole are highly heat resistant, the cured film, etc. of this invention are also suitably used for translucent plastic substrates for display devices such as liquid crystal display and electronic paper; automobile parts; heat-resistant paint; coating material; and films.

EXAMPLES

This invention will further be detailed below, referring to Examples. All materials, amounts of consumption, ratios, process details and procedures explained in Examples below may suitably be modified, without departing from the spirit of this invention. Hence, the scope of this invention is not limited to the specific examples explained below. "Parts" and "%" are mass-based, unless otherwise specifically noted.

Exemplary Synthesis 1

Synthesis of Polyimide Precursor Composition A-1 from 4,4'-Oxydiphthalic Dianhydride, 2-Hydroxyethyl Methacrylate and Diamine (DA-7) Shown Below Mixed were 21.2 g of 4,4'-oxydiphthalic dianhydride, 18.0 g of 2-hydroxyethyl methacrylate, 23.9 of pyridine, and 250 ml of diglyme (diethylene glycol dimethyl ether). The mixture was stirred at 60° C. for 4 hours, to obtain a diester between 4,4'-oxydiphthalic dianhydride and 2-hydroxyethyl methacrylate. Next, the reaction mixture was cooled to −10° C., and 17.0 g of SOCl$_2$ was added thereto over 60 minutes, while keeping the temperature at −10±5° C. The mixture was then diluted with 50 ml of N-methylpyrrolidone, a solution prepared by dissolving 38.0 g of hydroxy group-containing diamine (DA-7), shown below, in 100 ml of N-methylpyrrolidone was added dropwise to the reaction mixture at −10±5° C. over 60 minutes, and the mixture was stirred for 2 hours. Next, a polyimide precursor was allowed to precipitate in 6 liters of water, and the water-polyimide precursor mixture was stirred at 5000 rpm for 15 minutes. The solid polyimide precursor was separated by filtration, and then dissolved in 380 g of tetrahydrofuran. The thus obtained solution was poured into 6 liters of water to precipitate the polyimide precursor, and the water-polyimide precursor mixture was stirred at 5000 rpm for 15 minutes. The solid polyimide precursor was again separated by filtration, and dried under reduced pressure at 45° C. for 3 days. The polyimide precursor A-1 was found to have a weight-average molecular weight of 29,900, and a number-average molecular weight of 9,400. The ratio of the component with a molecular weight of 1,000 or smaller was found to account for 0.2% by mass of the thus obtained polyimide precursor. Of the component with a molecular weight of 1,000 or smaller, 4,4'-oxydiphthalic acid was found to be below the detection limit, and the remaining diamine (DA-7) was found to account for 0.02% by mass.

to precipitate the polyimide precursor, and the water-polyimide precursor mixture was stirred at 5000 rpm for 15 minutes. The solid polyimide precursor was again separated by filtration, and dried under reduced pressure at 45° C. for 2 days. The polyimide precursor A-2 was found to have a weight-average molecular weight of 28,800, and a number-average molecular weight of 9,200. The ratio of the component with a molecular weight of 1,000 or smaller was found to be 0.3% by mass. Of the component with a molecular weight of 1,000 or smaller, 4,4'-oxydiphthalic acid was found to be below the detection limit, and diamine (DA-7) was found to account for 0.04% by mass.

Exemplary Synthesis 3

Synthesis of Polyimide Precursor Composition A-3 from 4,4'-Oxydiphthalic Dianhydride, 2-Hydroxyethyl Methacrylate and Diamine (a)

Mixed were 21.2 g of 4,4'-oxydiphthalic dianhydride, 18.0 g of 2-hydroxyethyl methacrylate, 23.9 g of pyridine, and 250 ml of diglyme. The mixture was stirred at 60° C. for 4 hours, to obtain a diester between 4,4'-oxydiphthalic dianhydride and 2-hydroxyethyl methacrylate. Next, the reaction mixture was cooled to −10° C., and 17.0 g of SOCl$_2$ was added thereto over 60 minutes, while keeping the temperature at −10±5° C. The mixture was then diluted with 50 ml of N-methylpyrrolidone, a solution prepared by dissolving 38.0 g of hydroxy group-containing diamine (a), shown below, in 100 ml of N-methylpyrrolidone was added

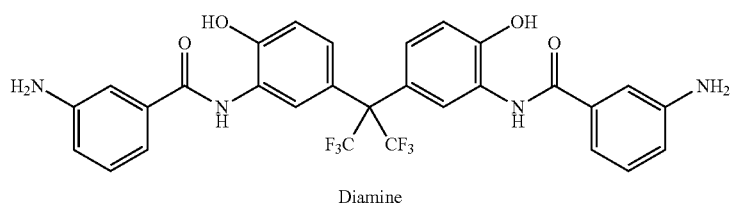

(DA-7)

Diamine

Exemplary Synthesis 2

Synthesis of Polyimide Precursor Composition A-2 from 4,4'-Oxydiphthalic Dianhydride, 2-Hydroxyethyl Methacrylate and Diamine (DA-7)

Mixed were 21.2 g of 4,4'-oxydiphthalic dianhydride, 18.0 g of 2-hydroxyethyl methacrylate, 23.9 g of pyridine, and 250 ml of diglyme. The mixture was stirred at 60° C. for 4 hours, to obtain a diester between 4,4'-oxydiphthalic dianhydride and 2-hydroxyethyl methacrylate. Next, the reaction was cooled to −10° C., and 17.0 g of SOCl$_2$ was added thereto over 60 minutes, while keeping the temperature at −10±5° C. The mixture was then diluted with 50 ml of N-methylpyrrolidone, a solution prepared by dissolving 38.0 g of hydroxy group-containing diamine (DA-7) in 100 ml of N-methylpyrrolidone was added dropwise to the reaction mixture at −10±5° C. over 60 minutes, and the mixture was stirred for 2 hours. Next, a polyimide precursor was allowed to precipitate in 6 liters of water, and the water-polyimide precursor mixture was stirred at 5000 rpm for 15 minutes. The solid polyimide precursor was separated by filtration, and then dissolved in 380 g of tetrahydrofuran. The thus obtained solution was poured into 6 liters of water dropwise to the reaction mixture at −10±5° C. over 60 minutes, and the mixture was stirred for 2 hours. Next, a polyimide precursor was allowed to precipitate in 6 liters of water, and the water-polyimide precursor mixture was stirred at 5000 rpm for 15 minutes. The solid polyimide precursor was separated by filtration, and then dried under reduced pressure at 45° C. for 3 days. The polyimide precursor was found to have a weight-average molecular weight of 28,900, and a number-average molecular weight of 9,300. The ratio of the component with a molecular weight of 1,000 or smaller was found to be 0.8% by mass. Of the component with a molecular weight of 1,000 or smaller, 4,4'-oxydiphthalic acid was found to account for 0.25% by mass, and diamine (DA-7) was found to account for 0.17% by mass.

Exemplary Synthesis 4

Synthesis of Polyimide Precursor Composition A-4 from Pyromellitic Dianhydride, 2-Hydroxyethyl Methacrylate and 4,4'-Diamino-2,2'-Bis(Trifluoromethyl)Biphenyl Mixed were 14.9 g of pyromellitic dianhydride, 18.0 g of 2-hydroxyethyl methacrylate, 23.9 g of pyridine, and 250 ml of diglyme. The mixture was stirred at 60° C. for 4 hours, to obtain a diester between pyromellitic dianhydride and 2-hydroxyethyl methacrylate. Next, the reaction mixture was cooled to −10° C., and 17.0 g of $SOCl_2$ was added thereto over 60 minutes, while keeping the temperature at −10±5° C. The mixture was then diluted with 50 ml of N-methylpyrrolidone, a solution prepared by dissolving 20.1 g of 4,4'-diamino-2,2'-bis(trifluoromethyl)biphenyl in 100 ml of N-methylpyrrolidone was added dropwise to the reaction mixture at −10±5° C. over 60 minutes, and the mixture was stirred for 2 hours. A polyimide precursor was allowed to precipitate in 6 liters of water, and the water-polyimide precursor mixture was stirred at 5000 rpm for 15 minutes. The solid polyimide precursor was separated by filtration, and then dissolved into 380 g of tetrahydrofuran. The thus obtained solution was poured into 6 liters of water to precipitate the polyimide precursor, and the water-polyimide precursor mixture was stirred at 5000 rpm for 15 minutes. The solid polyimide precursor was again separated by filtration, and dried under reduced pressure at 45° C. for 3 days. The polyimide precursor A-4 was found to have a weight-average molecular weight of 25,400, and a number-average molecular weight of 8,100. The ratio of the component with a molecular weight of 1,000 or smaller was found to be 0.4% by mass, and pyromellitic acid was found to account for 0.04% by mass. Of the component with a molecular weight of 1,000 or smaller, 4,4'-diamino-2,2'-bis(trifluoromethyl)biphenyl was found to account for 0.05% by mass.

Exemplary Synthesis 5

Synthesis of Polyimide Precursor Composition A-5 From Pyromellitic Dianhydride, 2-Hydroxyethyl Methacrylate and 4,4'-Diamino-2,2'-Bis(Trifluoromethyl)Biphenyl Mixed were 14.9 g of pyromellitic dianhydride, 18.0 g of 2-hydroxyethyl methacrylate, 23.9 g of pyridine, and 250 ml of diglyme. The mixture was stirred at 60° C. for 4 hours, to obtain a diester between pyromellitic dianhydride and 2-hydroxyethyl methacrylate. Next, the reaction mixture was cooled to −10° C., and 17.0 g of $SOCl_2$ was added thereto over 60 minutes, while keeping the temperature at −10±5° C. The mixture was diluted with 50 ml of N-methylpyrrolidone, a solution prepared by dissolving 20.1 g of 4,4'-diamino-2,2'-bis(trifluoromethyl)biphenyl into 100 ml of N-methylpyrrolidone was added dropwise at −10±5° C. over 60 minutes, and the mixture was stirred for 2 hours. Next, a polyimide precursor was allowed to precipitate in 10 liters of water, and the water-polyimide precursor mixture was stirred at 5000 rpm for 15 minutes. The solid polyimide precursor was separated by filtration, and then dried under reduced pressure at 45° C. for 3 days. The polyimide precursor A-5 was found to have a weight-average molecular weight of 25,200, and a number-average molecular weight of 800. The ratio of the component with a molecular weight of 1,000 or smaller was found to be 0.7% by mass. Of the component with a molecular weight of 1,000 or smaller, pyromellitic acid was found to account for 0.05% by mass, and 4,4'-diamino-2,2'-bis(trifluoromethyl)biphenyl was found to account for 0.12% by mass.

Exemplary Synthesis 6

Synthesis of Polyimide Precursor Composition A-6 from 4,4'-Oxydiphthalic Dianhydride, 2-Hydroxyethyl Methacrylate and 4,4'-Diaminodiphenyl Ether Mixed were 21.2 g of 4,4'-oxydiphthalic dianhydride, 18.0 g of 2-hydroxyethyl methacrylate, 23.9 g of pyridine, and 250 ml of diglyme. The mixture was stirred at 60° C. for 4 hours, to obtain a diester between 4,4'-oxydiphthalic dianhydride and 2-hydroxyethyl methacrylate. Next, the reaction mixture was cooled to −10° C., and 17.0 g of $SOCl_2$ was added dropwise thereto over 60 minutes, while keeping the temperature at −10±5° C. The mixture was diluted with 50 ml of N-methylpyrrolidone, a solution prepared by dissolving 12.6 g of 4,4'-diaminodiphenyl ether into 100 ml of N-methylpyrrolidone was added dropwise to the reaction mixture at −10±5° C. over 60 minutes, and the mixture was stirred for 2 hours. Next, a polyimide precursor was allowed to precipitate in 6 liters of water, and the water-polyimide precursor mixture was stirred at 5000 rpm for 15 minutes. The solid polyimide precursor was separated by filtration, and then dissolved into 380 g of tetrahydrofuran. The thus obtained solution was poured into 6 liters of water to precipitate the polyimide precursor, and the water-polyimide precursor mixture was stirred at 5000 rpm for 15 minutes. The solid polyimide precursor was again separated by filtration under reduced pressure, and then dried under reduced pressure at 45° C. for 3 days. The polyimide precursor A-6 was found to have a weight-average molecular weight of 25,600, and a number-average molecular weight of 8,200. The ratio of the component with a molecular weight of 1,000 or smaller was found to be 0.2% by mass. Of the component with a molecular weight of 1,000 or smaller, 4,4'-oxydiphthalic acid was found to be below the detection limit, and 4,4'-diaminodiphenyl ether was found to account for 0.01% by mass.

Exemplary Synthesis 7

Synthesis of Polyimide Precursor Composition A-7 from 4,4'-Oxydiphthalic Dianhydride, 2-Hydroxyethyl Methacrylate and 4,4'-Diaminodiphenyl Ether Mixed were 21.2 g of 4,4'-oxydiphthalic dianhydride, 18.0 g of 2-hydroxyethyl methacrylate, 23.9 g of pyridine, 0.10 g of water, and 250 ml of diglyme. The mixture was stirred at 60° C. for 4 hours to obtain a diester between 4,4'-oxydiphthalic dianhydride and 2-hydroxyethyl methacrylate. Next, the reaction mixture was cooled to −10° C., and 17.0 g of $SOCl_2$ was added over 60 minutes while keeping the temperature at −10±5° C. The mixture was then diluted with 50 ml of N-methylpyrrolidone, and a solution prepared by dissolving 12.6 g of 4,4'-diaminodiphenyl ether into 100 ml of N-methylpyrrolidone was added dropwise to the reaction mixture at −10±5° C. over 60 minutes, and the mixture was stirred for 2 hours. A polyimide precursor was then allowed to precipitate in 3 liters of water, and the water-polyimide precursor mixture was stirred at 5000 rpm for 15 minutes. The solid polyimide precursor was separated by filtration, and dissolved into 380 g of tetrahydrofuran. The thus obtained solution was poured into 3 liters of water to precipitate the polyimide precursor, and the water-polyimide precursor mixture was stirred at 5000 rpm for 15 minutes. The solid polyimide precursor was again separated by filtration, and then dried under reduced pressure at 45° C. for 3 days. The polyimide precursor A-7 was found to have a weight-average molecular weight of 26,200, and a number-average molecular weight of 8,500. The ratio of the component with a molecular weight of 1,000 or smaller was found to be 0.8% by mass. Of the component with a molecular weight of 1,000 or smaller, 4,4'-oxydiphthalic acid was found to account for 0.11% by mass, and the remaining 4,4'-diaminodiphenyl ether was found to account for 0.18% by mass.

Exemplary Synthesis 8

[Synthesis of Polybenzoxazole Precursor Composition A-8 from 4,4'-Carbonyldibenzoic Acid, 2,2'-Bis(3-Amino-4-Hydroxyphenyl)Hexafluoropropane and Methacrylic Acid Chloride]

Mixed were 18.5 g of 4,4'-carbonyldibenzoic acid and 250 ml of N-methylpyrrolidone. Next, the reaction mixture was cooled to −10° C., and 17.0 g of $SOCl_2$ was added thereto over 60 minutes, while keeping the temperature at −10±5° C. Next, a solution prepared by dissolving 21.0 g of 2,2'-bis(3-amino-4-hydroxyphenyl)hexafluoropropane into 100 ml of N-methylpyrrolidone was added dropwise to the reaction mixture at −10±5° C. over 60 minutes, and the mixture was stirred for 2 hours. Next, 9.3 g of triethylamine was added to the thus obtained reaction liquid while cooled on ice, 12.0 g of methacrylic acid chloride was added dropwise, and the mixture was further stirred for 2 hours while cooled on ice, to obtain a solution containing a polybenzoxazole precursor. Next, the polybenzoxazole precursor was allowed to precipitate in 6 liters of water, and the water-polybenzoxazole precursor mixture was stirred at 5000 rpm for 15 minutes. The solid polybenzoxazole precursor was separated by filtration, and dissolved into 380 g of tetrahydrofuran. The thus obtained solution was poured into 6 liters of water to precipitate the polybenzoxazole precursor, and the water-polybenzoxazole precursor mixture was stirred at 5000 rpm for 15 minutes. The solid polybenzoxazole precursor was again separated by filtration, and dried under reduced pressure at 45° C. for 3 days. The polybenzoxazole precursor A-8 was found to have a weight-average molecular weight of 28,900, and a number-average molecular weight of 8,800. The ratio of the component with a molecular weight of 1,000 or smaller was found to be 0.3% by mass. Of the component with a molecular weight of 1,000 or smaller, 4,4'-carbonyldibenzoic acid was found to account for 0.01% by mass, and 2,2'-bis(3-amino-4-hydroxyphenyl)hexafluoropropane was found to account for 0.02% by mass.

Exemplary Synthesis 9

Synthesis of Polyimide Precursor Composition A-9 from 4,4'-Oxydiphthalic Dianhydride, 2-Hydroxyethyl Methacrylate and 4,4'-Diaminodiphenyl Ether Mixed were 22.2 g of 4,4'-oxydiphthalic dianhydride, 18.7 g of 2-hydroxyethyl methacrylate, and 60 ml of γ-butyrolactone. The mixture was kept stirred at room temperature, 11.6 g of pyridine was further added thereto, the mixture was further stirred at room temperature for 16 hours, to obtain a diester between 4,4'-oxydiphthalic dianhydride and 2-hydroxyethyl methacrylate. Next, the reaction mixture was cooled to 0° C., a solution prepared by dissolving 29.5 g of dicyclohexylcarbodiimide into 25 ml of γ-butyrolactone was added over 40 minutes to the reaction mixture kept under stirring, a suspension liquid prepared by suspending 13.3 g of 4,4'-diaminodiphenyl ether in 50 ml of γ-butyrolactone was then added over 60 minutes, while keeping the mixture under stirring. The mixture was further stirred at room temperature for 2 hours, 4.3 ml of ethanol is added, the mixture was stirred for one hour, and 60 ml of γ-butyrolactone was then added. Precipitate occurred in the reaction mixture was removed by filtration, and the reaction liquid (filtrate) was poured into 500 ml of ethanol, to precipitate the polyimide precursor, followed by separation by filtration. The thus obtained solid was dissolved in 200 ml of tetrahydrofuran, the mixture was poured into 6 liters of water, to re-precipitate the polyimide precursor, the precipitate was separated by filtration, and dried under reduced pressure at 45° C. for 3 days. The polyimide precursor A-9 was found to have a weight-average molecular weight of 22,600, and a number-average molecular weight of 7,200. The ratio of the component with a molecular weight of 1,000 or smaller was found to be 0.7% by mass. Of the component with a molecular weight of 1,000 or smaller, 3,3',4,4'-oxydiphthalic acid was found to account for 0.12% by mass, and 4,4'-diaminodiphenyl ether was found to account for 0.10% by mass.

Exemplary Synthesis 10

[Synthesis of Polyimide Precursor Composition A-10 from 3,3',4,4'-Biphenyltetracarboxylic Acid Dianhydride, 2-Hydroxyethyl Methacrylate, 2,2'-Dimethylbenzidine and 2,2'-Bis(Trifluoromethyl) Benzidine]

Mixed were 29.4 g of 3,3',4,4'-biphenyltetracarboxylic acid dianhydride, 28.6 g of 2-hydroxyethyl methacrylate, a catalytic amount of 1,8-diazabicycloundecene, and 100 ml of N-methylpyrrolidone. The mixture was stirred at 60° C. for 2 hours, to obtain a diester between 3,3',4,4'-biphenyltetracarboxylic acid dianhydride and 2-hydroxyethyl methacrylate. Next, the reaction mixture was cooled to 0° C., 25.9 g of $SOCl_2$ was added thereto, and the mixture was heated to room temperature and stirred for 2 hours. Next, in a separate flask, 150 g of N-methylpyrrolidone, 10.6 g of 2,2'-dimethylbenzidine, 16.0 g of 2,2'-bis(trifluoromethyl)benzidine, and 26.2 g of pyridine were mixed, into which the previously prepared acid chloride solution was added dropwise over 30 minutes while keeping the temperature at 0 to 5° C., and the mixture was kept stirred for 30 minutes. The reaction liquid was added dropwise into 10 liters of water, a precipitate was collected by filtration, and dried under reduced pressure. The polyimide precursor A-10 was found to have a weight-average molecular weight of 19,500, and a number-average molecular weight of 6,800. The ratio of the component with a molecular weight of 1,000 or smaller was found to be 0.8% by mass. Of the component with a molecular weight of 1,000 or smaller, 3,3',4,4'-biphenyltetracarboxylic acid was found to account for 0.13% by mass, and 4,4'-diaminodiphenyl ether was found to account for 0.08% by mass.

Exemplary Synthesis 11

Synthesis of Polyimide Precursor Composition A-11 from 4,4'-Oxydiphthalic Dianhydride, 2-Hydroxyethyl Methacrylate and 4,4'-Diaminodiphenyl Ether Mixed were 21.2 g of 4,4'-oxydiphthalic dianhydride, 18.0 g of 2-hydroxyethyl methacrylate, 23.9 g of pyridine, and 250 ml of diglyme. The mixture was stirred at 60° C. for 4 hours, to obtain a diester between 4,4'-oxydiphthalic dianhydride and 2-hydroxyethyl methacrylate. Next, the reaction mixture was cooled to −10° C., and 17.0 g of $SOCl_2$ was added thereto over 60 minutes, while keeping the temperature at −10±5° C. The mixture was diluted with 50 ml of N-methylpyrrolidone, and a solution prepared by dissolving 12.6 g of 4,4'-diaminodiphenyl ether into 100 ml of N-methylpyrrolidone was added dropwise to the reaction mixture at −10±5° C. over 60 minutes, and the mixture was stirred for 2 hours. Next, the mixture was poured into 6 liters of water to precipitate the polyimide precursor, and the water-polyimide precursor mixture was stirred at 5000 rpm for 15 minutes. The solid polyimide precursor was separated by filtration, and dried under reduced pressure at 45° C. for 3 days. The polyimide precursor A-11 was found to have a weight-average molecular weight of 24,600, and a number-average molecular weight of 7,600. The ratio of the component with a molecular weight of 1,000 or smaller was found to be 1.2% by mass. Of the component with a molecular weight of 1,000 or smaller, 4,4'-oxydiphthalic acid was found to account for 0.30% by mass, and the remaining 4,4'-diaminodiphenyl ether was found to account for 0.31% by mass.

Exemplary Synthesis 12

Synthesis of Polybenzoxazole Precursor Composition A-12 from 4,4'-Carbonyldibenzoic Acid and 2,2'-Bis(3-Amino-4-Hydroxyphenyl)Hexafluoropropane Mixed were 18.5 g of 4,4'-carbonyldibenzoic acid and 250 ml of N-methylpyrrolidone. Next, the reaction mixture was cooled to −10° C., and 17.0 g of $SOCl_2$ was added over 60 minutes, while keeping the temperature at −10±5° C. Next, a solution prepared by dissolving 21.0 g of 2,2'-bis(3-amino-4-hydroxyphenyl)hexafluoropropane into 100 ml of N-methylpyrrolidone was added dropwise to the reaction mixture at −10±5° C. over 60 minutes, and the mixture was stirred for 2 hours. Next, a polybenzoxazole precursor was allowed to precipitated in 6 liters of water, and the water-polybenzoxazole precursor mixture was stirred at 5000 rpm for 15 minutes. The solid polybenzoxazole precursor was separated by filtration, and then dried under reduced pressure at 45° C. for 3 days. The polybenzoxazole precursor A-12 was found to have a weight-average molecular weight of 28,900, and a number-average molecular weight of 8,800. The ratio of the component with a molecular weight of 1,000 or smaller was found to account for 1.5% by mass. Of the component with a molecular weight of 1,000 or smaller, 4,4'-carbonyldibenzoic acid was found to account for 0.23% by mass, and the remaining 2,2'-bis(3-amino-4-hydroxyphenyl)hexafluoropropane was found to account for 0.25% by mass.

Exemplary Synthesis 13

Synthesis of Polyimide Precursor Composition A-13 from 4,4'-Oxydiphthalic Dianhydride, 2-Hydroxyethyl Methacrylate and 4,4'-Diaminodiphenyl Ether Mixed were 21.2 g of 4,4'-oxydiphthalic dianhydride, 18.0 g of 2-hydroxyethyl methacrylate, 23.9 g of pyridine, and 250 ml of diglyme. The mixture was stirred at 60° C. for 4 hours, to prepare a diester between 4,4'-oxydiphthalic dianhydride and 2-hydroxyethyl methacrylate. Next, the reaction mixture was cooled to −10° C., and a 17.0 g of $SOCl_2$ was added over 60 minutes, while keeping the temperature at −10±5° C. The mixture was then diluted with 50 ml of N-methylpyrrolidone, and a solution prepared by dissolving 12.6 g of 4,4'-diaminodiphenyl ether into 100 ml of N-methylpyrrolidone was added dropwise to the reaction mixture at −10±5° C. over 60 minutes, and the mixture was stirred for 2 hours. The mixture was then poured into 10 liters of water to precipitate the polyimide precursor, and the water-polyimide precursor mixture was stirred at 5000 rpm for 15 minutes. The solid polyimide precursor was separated by filtration, and then dissolved in 380 g of tetrahydrofuran. The thus obtained solution was poured into 10 liters of water to precipitate the polyimide precursor, and the water-polyimide precursor mixture was stirred at 5000 rpm for 15 minutes. The solid polyimide precursor was again separated by filtration, and dried under reduced pressure at 45° C. for 3 days. The polyimide precursor A-13 was found to have a weight-average molecular weight of 24,400, and a number-average molecular weight of 7,300. The component with a molecular weight of 1,000 or smaller was found to be below the detection limit. Of the component with a molecular weight of 1,000 or smaller, 4,4'-oxydiphthalic acid and 4,4'-diaminodiphenyl ether were found to be below the detection limit.

<Measurement of Weight-Average Molecular Weight and Number-Average Molecular Weight>

The weight-average molecular weight (Mw) and the number-average molecular weight (Mn) of the heterocycle-containing polymer precursor are polystyrene-equivalent values based on gel permeation chromatography (GPC), measured by a method below.

A measuring instrument employed here was HLC-8220 (from Tosoh Corporation), and columns employed here were Guard column HZ-L, TSKgel Super HZM-M, TSKgel Super HZ4000, TSKgel Super HZ3000, and TSKgel Super HZ2000 (from Tosoh Corporation). Eluent employed here was THF (tetrahydrofuran), and measurement was carried out at 40° C. and a flow rate of 0.35 ml/min. For detection, employed was a UV detector sensing at 254 nm. A sample to be measured was prepared by diluting the heterocycle-containing polymer precursor with THF down to 0.1% by mass.

<Measurement of Amount of Component with Molecular Weight of 1,000 or Smaller>

The value was measured in the same way as the method for measuring the weight-average molecular weight and the number-average molecular weight, wherein the percentage of an area of a peak assignable to the component having a polystyrene-equivalent molecular weight of 1,000 or smaller, was calculated.

<Measurement of Amount of Starting Monomer and Derivative Thereof>

The amount was measured by high performance liquid chromatography (HPLC) through Shim-pack CLC-ODS column (150 mm×6.0 mm diameter), at a flow rate of 1.0 ml/min, using THF/0.1% by mass aqueous phosphoric acid solution as an eluent.

<Preparation of Photosensitive Resin Compositions>

The components listed in Table 1 were mixed to prepare coating liquids of the photosensitive resin compositions, in the form of uniform liquids. The obtained coating liquid of the photosensitive resin compositions were filtered under pressure through a filter with a pore size of 0.8 μm.

The starting monomers and the derivatives thereof of the polyimide precursor, etc., used in preparation of the photosensitive resin compositions, were those derived from resin A only, and were not externally added. Hence, the total amount of the starting monomer and the derivatives thereof in resin A can be interpreted as the total amount of the starting monomer and the derivatives thereof of the polyimide precursor, etc. relative to the polyimide precursor, etc., in the individual compositions.

<Measurement of Water Content in Composition>

One gram of each composition was measured using a Karl Fischer moisture meter (from Kyoto Electronic Manufacturing Co., Ltd.), to determine water content of the polyimide precursor, etc.

<Measurement of Contents of Metal Atoms in Composition>

Each composition was diluted 10 fold with nitric acid, and the total content of Na, K, Ca, Fe, Cu, Mg, Mn, Al, Li, Ni, Cr, Sn and Zn contained in each composition was determined using an ICP-MS apparatus ("ELAN DRC II", from PerkinElmer Inc.). The total content of these metal atoms was interpreted as the content of metal atoms in the composition.

<Materials>

(A) Resin

A-1 to A-11: resins prepared in Exemplary Syntheses 1 to 11

(B) Polymerizable Compound

B-1: NK Ester M-40G (monofunctional methacrylate with a structure below, from Shin-Nakamura Chemical Co., Ltd.)

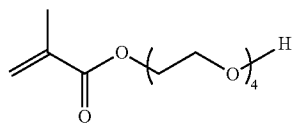

B-2: NK Ester 4G (bifunctional methacrylate with a structure below, from Shin-Nakamura Chemical Co., Ltd.)

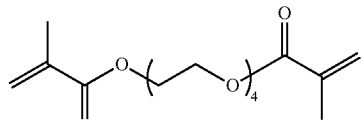

B-3: NK Ester A-9300 (trifunctional acrylate with a structure below, from Shin-Nakamura Chemical Co., Ltd.)

TABLE 1

| | (A) Resin | | (B) Polymerizable Compound | | (C) Photopolymerizable Initiator | | (D) Thermal Polymerization Initiator | | (E) Additive | | (F) Solvent | | Content of Water in Composition | Content of Metal Atom in Composition |
|---|---|---|---|---|---|---|---|---|---|---|---|---|---|---|
| | Type | Mass % | Type | Mass % | Type | Mass % | Type | Mass % | Type | Mass % | Type | Mass % | Mass % | Mass ppm |
| Example 1 | A-1 | 39.0 | | | C-1 | 1.0 | | | | | F-1 | 60 | 0.8 | 3.9 |
| Example 2 | A-1 | 33.8 | B-1 | 5.0 | C-1 | 1.0 | | | E-1 | 0.2 | F-1 | 60 | 0.8 | 3.4 |
| Example 3 | A-1 | 33.0 | B-2 | 5.0 | C-1 | 1.0 | D-1 | 1.0 | | | F-1/F-2 | 48 + 12 | 0.8 | 3.3 |
| Example 4 | A-2 | 32.0 | B-1 | 7.0 | C-1 | 1.0 | | | | | F-1 | 60 | 1.4 | 4.5 |
| Example 5 | A-2 | 34.0 | B-2 | 5.0 | C-5 | 1.0 | | | | | F-2 | 60 | 1.4 | 4.8 |
| Example 6 | A-2 | 34.0 | B-3 | 5.0 | C-1 | 1.0 | | | | | F-2 | 60 | 1.4 | 4.8 |
| Example 7 | A-3 | 39.0 | | | C-1 | 1.0 | | | | | F-1 | 60 | 0.9 | 30.4 |
| Example 8 | A-3 | 33.8 | B-1 | 5.0 | C-1 | 1.0 | | | E-1 | 0.2 | F-1 | 60 | 0.9 | 26.4 |
| Example 9 | A-3 | 33.0 | B-2 | 5.0 | C-1 | 1.0 | D-1 | 1.0 | | | F-1/F-2 | 48 + 12 | 0.9 | 25.7 |
| Example 10 | A-4 | 33.9 | B-1 | 5.0 | C-2 | 1.0 | | | E-4 | 0.1 | F-1 | 60 | 0.7 | 5.1 |
| Example 11 | A-4 | 34.0 | B-2 | 5.0 | C-1 | 1.0 | | | | | F-1 | 60 | 0.7 | 5.1 |
| Example 12 | A-4 | 27.0 | B-3 | 7.0 | C-1 | 1.0 | | | E-3 | 5.0 | F-1 | 60 | 0.7 | 4.1 |
| Example 13 | A-5 | 39.0 | | | C-3 | 1.0 | | | | | F-1/F-2 | 48 + 12 | 0.9 | 23.8 |
| Example 14 | A-5 | 33.0 | B-1 | 5.0 | C-1 | 1.0 | D-2 | 1.0 | | | F-1 | 60 | 0.9 | 20.1 |
| Example 15 | A-5 | 32.0 | B-2 | 7.0 | C-1 | 1.0 | | | | | F-1 | 60 | 0.9 | 19.5 |
| Example 16 | A-6 | 33.8 | B-2 | 5.0 | C-1 | 1.0 | | | E-2 | 0.2 | F-1 | 60 | 0.7 | 2.7 |
| Example 17 | A-6 | 34.0 | B-2 | 5.0 | C-1 | 1.0 | | | | | F-1/F-2 | 48 + 12 | 0.7 | 2.7 |
| Example 18 | A-6 | 33.0 | B-3 | 5.0 | C-1 | 1.0 | D-1 | 1.0 | | | F-1 | 60 | 0.7 | 2.6 |
| Example 19 | A-7 | 34.0 | | | C-1 | 1.0 | | | E-3 | 5.0 | F-1 | 60 | 0.9 | 24.5 |
| Example 20 | A-7 | 34.0 | B-2 | 5.0 | C-1 | 1.0 | | | | | F-1 | 60 | 0.9 | 24.5 |
| Example 21 | A-7 | 34.0 | B-3 | 5.0 | C-4 | 1.0 | | | | | F-1/F-2 | 48 + 12 | 0.9 | 24.5 |
| Example 22 | A-8 | 39.0 | | | C-1 | 1.0 | | | | | F-1 | 60 | 0.7 | 6.2 |
| Example 23 | A-8 | 33.9 | B-2 | 5.0 | C-1 | 1.0 | | | E-4 | 0.1 | F-1 | 60 | 0.7 | 5.4 |
| Example 24 | A-8 | 34.0 | B-3 | 5.0 | C-5 | 1.0 | | | | | F-1 | 60 | 0.7 | 5.4 |
| Example 25 | A-9 | 37.0 | B-2/B-4 | 4.0/2.0 | C-6 | 2.0 | | | E-5 | 5.0 | F-3/F-4 | 40 + 10 | 0.9 | 5.3 |
| Example 26 | A-10 | 36.8 | B-2 | 7.0 | C-7 | 1.0 | | | E-4 | 0.2 | F-3 | 55 | 0.8 | 4.2 |
| Comparative Example 1 | A-11 | 34.0 | B-1 | 5.0 | C-1 | 1.0 | | | | | F-1 | 60 | 0.8 | 28.9 |
| Comparative Example 2 | A-11 | 33.9 | B-2 | 5.0 | C-1 | 1.0 | | | E-4 | 0.1 | F-1/F-2 | 48 + 12 | 0.8 | 28.8 |
| Comparative Example 3 | A-12 | 34.0 | B-2 | 5.0 | C-1 | 1.0 | | | | | F-1 | 60 | 1.2 | 33.7 |
| Comparative Example 4 | A-13 | 34.0 | B-2 | 5.0 | C-1 | 1.0 | | | | | F-1 | 60 | 0.5 | 1.0 |

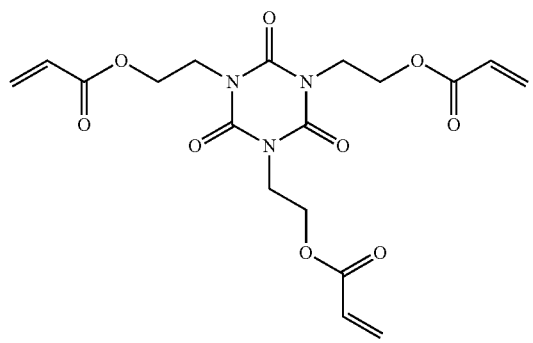 [SMILES: C=CC(=O)OCCn1c(=O)n(CCOC(=O)C=C)c(=O)n(CCOC(=O)C=C)c1=O]
B-4: methoxymethylated urea resin (MX-290)
(C) Photo-Polymerization Initiator
C-1: Irgacure OXE-DI (from BASF SE)
OXE-01
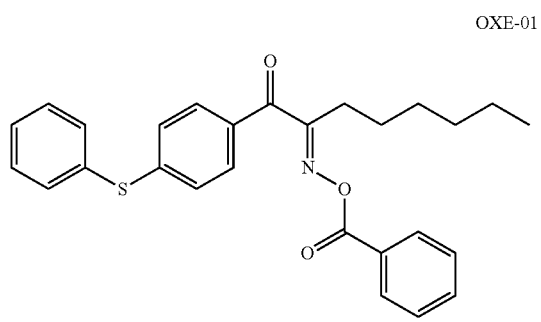 [SMILES: CCCCCC/C(=N\OC(=O)c1ccccc1)C(=O)c1ccc(Sc2ccccc2)cc1]
C-2: compound 24 described in paragraph [0345] of JP-A-2014-500852
C-3: compound 36 described in paragraph [0345] of JP-A-2014-500852
C-4: compound 37 described in paragraph [0345] of JP-A-2014-500852
C-5: compound 40 described in paragraph [0345] of JP-A-2014-500852
24
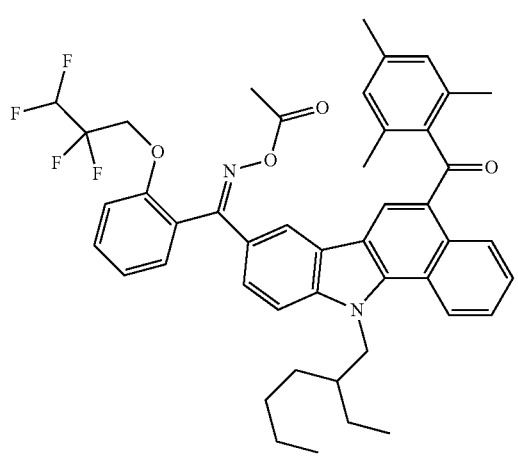
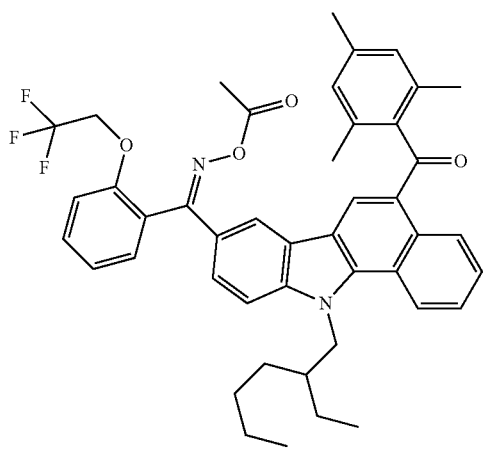
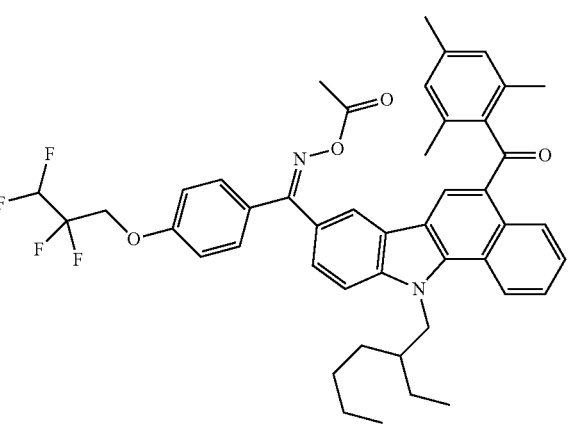
C-6: 1-phenyl-1,2-propanedione-2-(o-ethoxycarbonyl)-oxime
C-7: compound below
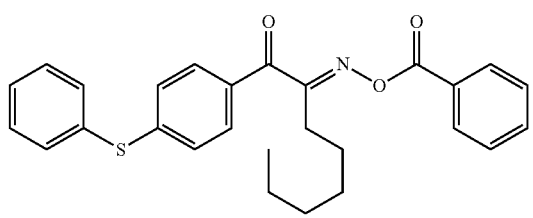 [SMILES: CCCCCC/C(=N\OC(=O)c1ccccc1)C(=O)c1ccc(Sc2ccccc2)cc1]

(D) Thermal Polymerization Initiators
D-1: Perbutyl Z (from NOF Corporation, tert-butyl peroxybenzoate, decomposition temperature (ten hour half-life temperature=104° C.))
D-2: Percumyl D (from NOF Corporation, dicumylperoxide, decomposition temperature (ten hour half-life temperature=116.4° C.))
(E) Additives
E-1: 1H-tetrazole
E-2: 1,2,4-triazole
E-3: compound below

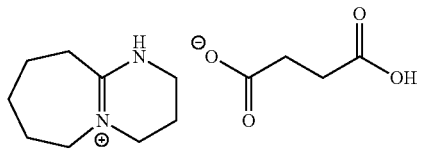 [SMILES: C1CCC2=[N+](CC1)CCCN2 ; O=C([O-])CCC(=O)O]

E-4: 1,4-benzoquinone
E-5: N-phenyldiethanolamine
(F) Solvents
F-1: γ-butyrolactone
F-2: dimethyl sulfoxide
F-3: N-methylpyrrolidone
F-4: ethyl lactate
<Warpage>
Each photosensitive resin composition was applied by spin-coating (1200 rpm, 30 seconds) onto a silicon wafer of 250 μm thick and 100 mm diameter. The silicon wafer with the thus applied photosensitive resin composition was dried on a hot plate at 100° C. for 5 minutes, to form a 10 μm thick film on the silicon wafer. Next, the film thus applied on the silicon wafer was exposed to light using an aligner (Karl-Suss MA150). The light was irradiated using a high pressure mercury lamp at 365 nm with a dose of 500 mJ/cm². The obtained silicon wafer was measured regarding warpage using a film stress measurement system TENCOR FLX-2320, at a laser intensity of 0.1 or larger, at wavelengths of 670 nm and 780 nm, based on a 50-point scanning scheme. Next, the silicon wafer was heated in a nitrogen atmosphere at 250° C. for 2 hours, then allowed to cool down to 25° C., and the amount of warp was measured again under the conditions described above. Difference between the amounts of warp before heating and after heating was determined as warpage. The smaller the warpage, the better.
<Uniformity of Film>
Each photosensitive resin composition was applied by spin coating (1200 rpm, 30 seconds) onto a silicon wafer of 250 μm thick and 100 mm diameter (4 inches, 1 inch=2.54 cm). The silicon wafer having the photosensitive resin composition applied thereon was dried on a hot plate at 100° C. for 5 minutes to form a film. The film was visually observed, and non-uniformity of coating was evaluated as follows.
A: Non-uniformity of coating not visually observed.
B: Non-uniformity of coating visually observed.
<Scum>
Each photosensitive resin composition was applied by spin coating (1200 rpm, 30 seconds) onto a silicon wafer of 250 μm thick and 100 mm diameter. The silicon wafer having the photosensitive resin composition applied thereon was dried on a hot plate at 100° C. for 5 minutes, to form a film of 10 μm thick. Next, the film thus formed on the silicon wafer was subjected to pattern exposure using an aligner (Karl-Suss MA150) through a photomask (line/space=1/1).

The light was irradiated using a high pressure mercury lamp at 365 nm with a dose of 500 mJ/cm². After the irradiation, the film was developed with cyclopentanone for 75 seconds, and a cross-section of the thus obtained pattern was observed under a scanning electron microscope (S-4300, from Hitachi, Ltd.), and occurrence of scum was evaluated as follows.
A: Scum not visually observed.
B: Scum visually observed.

TABLE 2

| | Result | | |
|---|---|---|---|
| | Warp | Scum | Film Uniformity |
| Example 1 | 47 | A | A |
| Example 2 | 45 | A | A |
| Example 3 | 41 | A | A |
| Example 4 | 65 | A | A |
| Example 5 | 63 | A | A |
| Example 6 | 60 | A | A |
| Example 7 | 80 | A | A |
| Example 8 | 78 | A | A |
| Example 9 | 77 | A | A |
| Example 10 | 55 | A | A |
| Example 11 | 52 | A | A |
| Example 12 | 51 | A | A |
| Example 13 | 80 | A | A |
| Example 14 | 75 | A | A |
| Example 15 | 72 | A | A |
| Example 16 | 33 | A | A |
| Example 17 | 32 | A | A |
| Example 18 | 35 | A | A |
| Example 19 | 68 | A | A |
| Example 20 | 62 | A | A |
| Example 21 | 60 | A | A |
| Example 22 | 59 | A | A |
| Example 23 | 55 | A | A |
| Example 24 | 56 | A | A |
| Example 25 | 58 | A | A |
| Example 26 | 61 | A | A |
| Comparative Example 1 | 102 | B | A |
| Comparative Example 2 | 105 | B | A |
| Comparative Example 3 | 119 | B | A |
| Comparative Example 4 | 38 | A | B |

As is clear from the results above, by using resin A of this invention, patterns (cured films) only with less warpage and scums were obtained (Examples 1 to 24). The warpage was more effectively suppressed by limiting the contents of metal atoms in the composition to 15 ppm by mass or less (Examples 1 to 6, 10 to 12, and 16 to 18, 22 to 24).

In contrast, the patterns were unfortunately found to have larger warpage and much scum, when the polyimide precursor, etc. contained much component with a molecular weight of 1,000 or smaller, or, a large amount of starting monomers for the polyimide precursor, etc. were used (Comparative Examples 1 to 3). When the polyimide precursor, etc. contained only a small amount of the component with a molecular weight of 1,000 or smaller, or, when there was only a small amount of starting monomer in the polyimide precursor, etc. (Comparative Example 4), the composition was less soluble in the solvent, and was therefore difficult to form a uniform cured film.

Example 100

The photosensitive resin composition of Example 1 was filtered under pressure through a filter with a pore size of 1.0 μm, and then applied by spin-coating (3500 rpm, 30 seconds) onto the surface of a resin substrate having a copper film formed thereon. The photosensitive resin composition applied to the resin substrate was dried at 100° C. for 2 minutes, and subjected to photo-exposure using a stepper (NSR1505i6, from Nikon Corporation). The photo-exposure was given through a mask at 365 nm, at a dose of 200 mJ/cm². The photo-exposure was followed by post-baking, development with cyclopentanone for 30 seconds, and rinsing with PGMEA for 20 seconds. A pattern was thus obtained.

The pattern was then annealed at 230° C. for 3 hours, to form a redistribution insulating layer. The redistribution insulating layer was found to have good insulating performance.

REFERENCE SINGS LIST

100: semiconductor device
101a to 101d: semiconductor element
101: stack
102b to 102d: through-electrode
103a to 103e: metal bump
105: redistribution layer
110, 110a, 110b: underfill layer
115: insulating layer
120: wiring board
120a: surface electrode

What is claimed is:

1. A composition containing a resin selected from polyimide precursor and polybenzoxazole precursor,
    wherein the resin has a polymerizable group; and
    the resin has a total content of a starting monomer of the resin and a derivative thereof of 0.001 to 0.45% by mass,
    wherein the derivative excludes oligomer and polymer having the starting monomers polymerized therein,
    wherein the polyimide precursor contains a repeating unit represented by Formula (2):

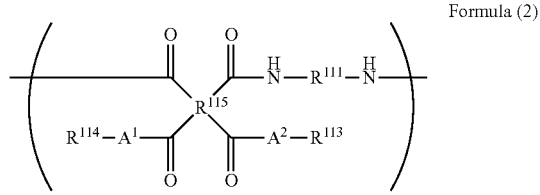

Formula (2)

wherein each of $A^1$ and $A^2$ independently represents an oxygen atom or NH, $R^{115}$ represents a tetravalent organic group, each of $R^{113}$ and $R^{114}$ independently represents a hydrogen atom or monovalent organic group, at least one of $R^{113}$ or $R^{114}$ represents a polymerizable group-containing group, $R^{111}$ represents a divalent organic group selected from formulae below:

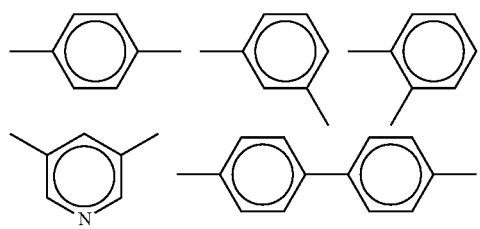

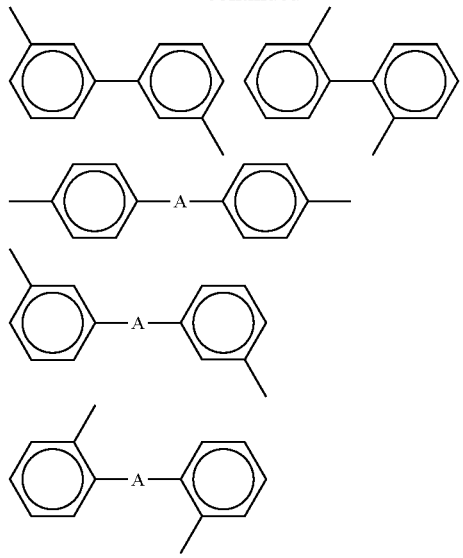

wherein the "A" in the formulae represents a single bond, or, a group selected from a hydrocarbon group having 1 to 10 carbon atoms optionally substituted by fluorine atom(s), —O—, —C(=O)—, —S—, —S(=O)$_2$—, —NHCO—, and combinations of them, wherein the repeating unit represented by Formula (2) in the polyimide precursor accounts for more than 90 mol % of the total repeating units.

2. The composition of claim 1, wherein the total content of the starting monomer of the resin and the derivative thereof is 0.005 to 0.15% by mass of the resin.

3. The composition of claim 1, wherein the resin contains the repeating unit represented by Formula (2) or a repeating unit represented by Formula (3):

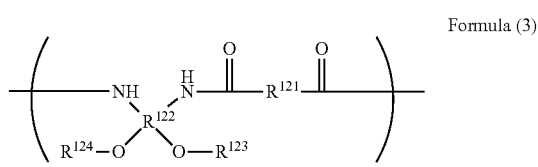

Formula (3)

wherein $R^{121}$ represents a divalent organic group, $R^{122}$ represents a tetravalent organic group, each of $R^{123}$ and $R^{124}$ independently represents a hydrogen atom or monovalent organic group, and at least one of $R^{123}$ or $R^{124}$ represents a polymerizable group-containing group.

4. The composition of claim 3, wherein
the resin contains the repeating unit represented by Formula (2), and contains at least one of a monomer represented by Formula (2-1) or a monomer represented by Formula (2-2) as a component with a molecular weight of 1,000 or smaller; or the resin contains the repeating unit represented by Formula (3), and contains at least one of a monomer represented by Formula (3-1) or a monomer represented by Formula (3-2) as a component with a molecular weight of 1,000 or smaller;

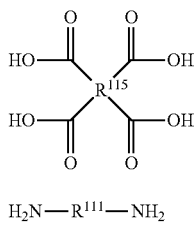

(2-1)

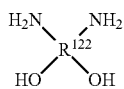

(2-2)

wherein $R^{115}$ represents a group same as $R^{115}$ in Formula (2); and, $R^{111}$ represents a group same as $R^{111}$ in Formula (2);

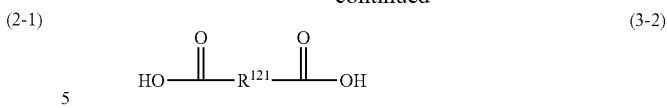

wherein $R^{122}$ represents a group same as $R^{122}$ in Formula (3); and $R^{121}$ represents a group same as $R^{121}$ in Formula (3).

5. The composition of claim 1, having a water content of 1.0% by mass or less.

6. The composition of claim 1, having a total content of Na, K, Ca, Fe, Cu, Mg, Mn, Al, Li, Ni, Cr, Sn and Zn of 15 ppm by mass or less.

7. The composition of claim 1, further containing a photo-polymerization initiator.

8. A method for manufacturing a cured film comprising applying the composition described in claim 1 to a substrate, and curing the composition applied to the substrate.

* * * * *